(12) United States Patent
Kim et al.

(10) Patent No.: US 8,466,239 B2
(45) Date of Patent: Jun. 18, 2013

(54) POLYMER CONTAINING THIOPHENE UNIT AND THIENYLENEVINYLENE UNIT, AND ORGANIC FIELD EFFECT TRANSISTOR AND ORGANIC SOLAR CELL CONTAINING THE POLYMER

(75) Inventors: Dong-Yu Kim, Gwangju (KR); Juhwan Kim, Gwangju (KR); Bogyu Lim, Gwangju (KR); Kang-Jan Baeg, Gwangju (KR); Byung-Kwan Yu, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 165 days.

(21) Appl. No.: 12/965,068

(22) Filed: Dec. 10, 2010

(65) Prior Publication Data

US 2011/0284082 A1    Nov. 24, 2011

(30) Foreign Application Priority Data

May 18, 2010    (KR) ........................ 10-2010-0046576

(51) Int. Cl.
*C08G 75/06* (2006.01)
*C08F 283/00* (2006.01)
*C08L 81/00* (2006.01)

(52) U.S. Cl.
USPC ........... 525/535; 525/540; 528/373; 528/377; 528/424; 528/425

(58) Field of Classification Search
USPC .................. 525/535, 540; 528/373, 377, 424, 528/425
See application file for complete search history.

(56) References Cited

FOREIGN PATENT DOCUMENTS

JP    11106484 A    4/1999

OTHER PUBLICATIONS

Kim et al; Organic solar cell—fabricating method; May 2010; Repub. Korean Kongkae taeho Kongbo; Chem Abstract 153:66556.*
Kim et al; Organic field effect transistor—fabricating method; May 2010; Repub—Kongbo; Chem Abstract 153: 74859.*
Kim et al; Solution—for films; Repu—Kongbo; May 2010; Repub—Kongbo; Chem Abstract 153: 62748.*
Lim et al, "A New Poly(thienylenevinylene) Derivative with High Mobility and Oxidative Stability for Organic Thin-Film Transistors and Solor Cells," Adv. Mater 2009, 21, 2808-2814 (7 pages).

* cited by examiner

*Primary Examiner* — Duc Truong
(74) *Attorney, Agent, or Firm* — Osha Liang LLP

(57) ABSTRACT

Provided are a polymer containing a thiophene unit and a thienylenevinylene unit, and an organic field effect transistor and an organic solar cell containing the polymer. The film may be formed by coating a substrate with a polymer containing a thiophene unit and a thienylenevinylene unit using a solution process. Therefore, the production cost may be reduced and a large-scale device may be suitably manufactured since there is no need for an expensive vacuum system to form films. Also, the polymer according to one embodiment of the present invention containing a thiophene unit and a thienylenevinylene unit has very excellent flatness since the thiophene unit is continuously coupled with a vinyl group having excellent flatness. Therefore, the polymer may be useful in further improving the charge mobility since it has high crystallinity caused by the improved ordering property between molecules. Such crystallinity may be further improved by the heat treatment. In addition, the organic compound according to one embodiment of the present invention containing a thienylenevinylene unit may have high oxidative stability because of its high ionization energy.

15 Claims, 22 Drawing Sheets

POLYMER CONTAINING THIOPHENE UNIT AND THIENYLENEVINYLENE UNIT, AND ORGANIC FIELD EFFECT TRANSISTOR AND ORGANIC SOLAR CELL CONTAINING THE POLYMER

CROSS-REFERENCE TO RELATED APPLICATION

This application claims the benefit of Korean Patent Application No. 10-2010-0046576, filed May 18, 2010, the disclosure of which is hereby incorporated herein by reference in its entirety.

BACKGROUND OF THE INVENTION

1. Field of the Invention

An aspect of the present invention relates to organic compounds, organic field effect transistors and organic solar cells, and more particularly, to a polymer having crystallinity, and an organic field effect transistor and an organic solar cell containing the polymer.

2. Description of the Related Art

A printed circuit board, which is easy to manufacture, inexpensive, resistant to impact and flexible, is anticipated to be an essential element in future industries. Therefore, the development of organic semiconductors satisfying these requirements has come into the limelight as one of the leading research fields.

An organic photoelectric device using an organic semiconductor is under development since it has advantages in that it is easier to manufacture than an inorganic photoelectric device using amorphous silicon or polysilicon and is manufactured at a low production cost. Also, a great deal of recent research has gone into the organic semiconductor since it has excellent compatibility with plastic substrates to realize the flexible display technology.

The organic semiconductor used as an active layer of a conventional organic thin film transistor (OTFT) is formed of pentacene that has a molecular crystal feature using a vacuum film-forming method. However, the pentacene film formed using the vacuum film-forming method is a polycrystalline film, which has a grain boundary and is susceptible to defects. The grain boundary or the defects prevent the transport of charges, which leads to an increase in resistance. In addition, when the active layer is formed using the vacuum film-forming method, it is actually difficult to manufacture devices having uniform performances on a large area.

SUMMARY OF THE INVENTION

Aspects of the present invention provide an organic compound which has high crystallinity and may be applied to a solution process suitable for a large area.

Aspects of the present invention also provide an organic field effect transistor and an organic solar cell, which have improved efficiencies.

According to an exemplary embodiment of the present invention, a polymer containing a thiophene unit and a thienylenevinylene unit is provided. Here, the polymer may be represented by the following Formula 4.

[Formula 4]

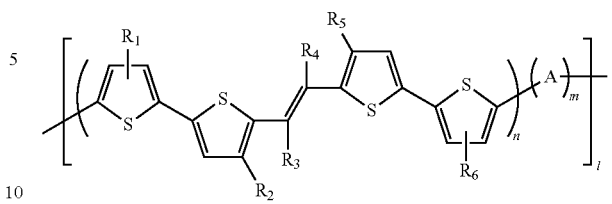

wherein, $R_1$, $R_3$, $R_4$ and $R_6$ are each independently hydrogen, an alkyl group having 1 to 25 carbon atoms, an alkoxy group having 1 to 25 carbon atoms, a haloalkyl group having 1 to 25 carbon atoms, or an aryl group having 6 to 30 carbon atoms, $R_2$ and $R_5$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms, A represents

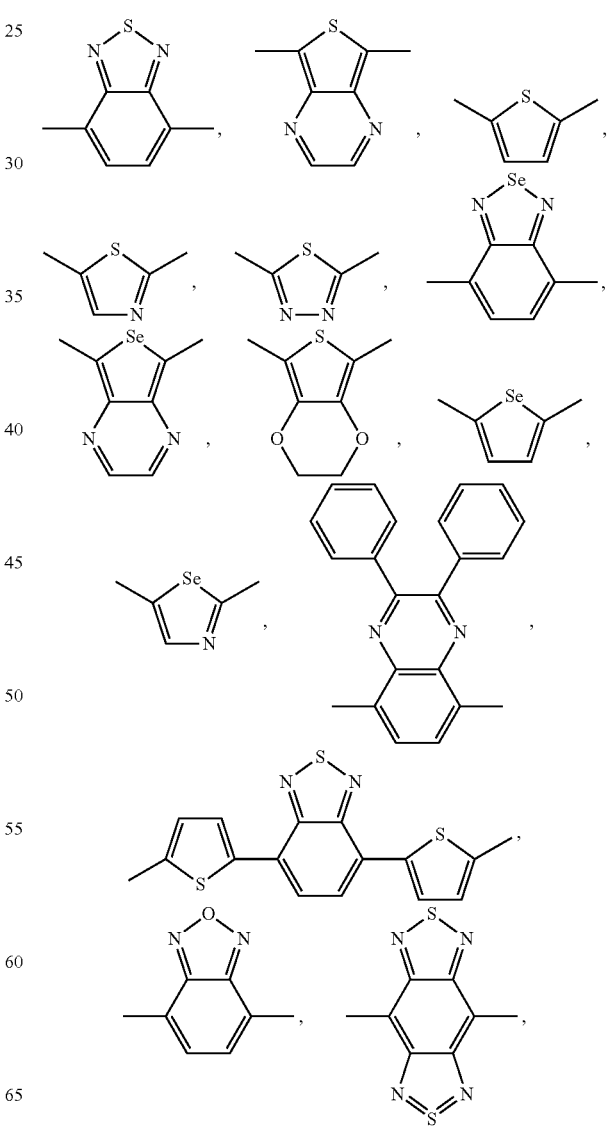

-continued

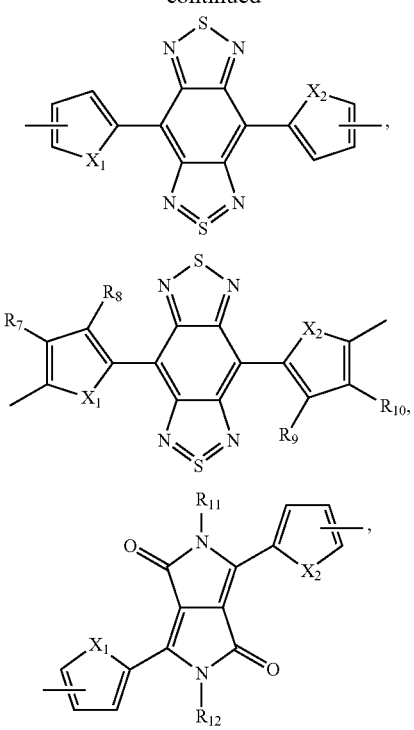

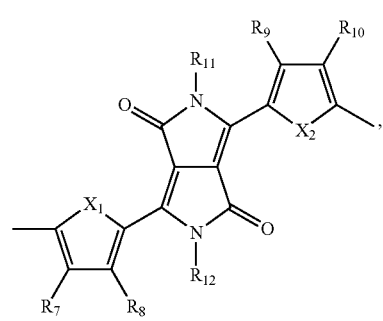

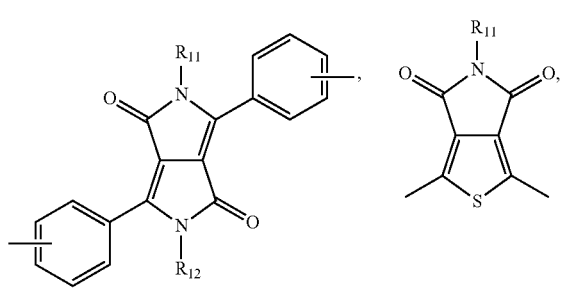

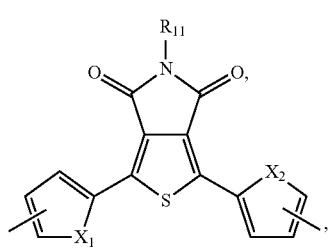

-continued

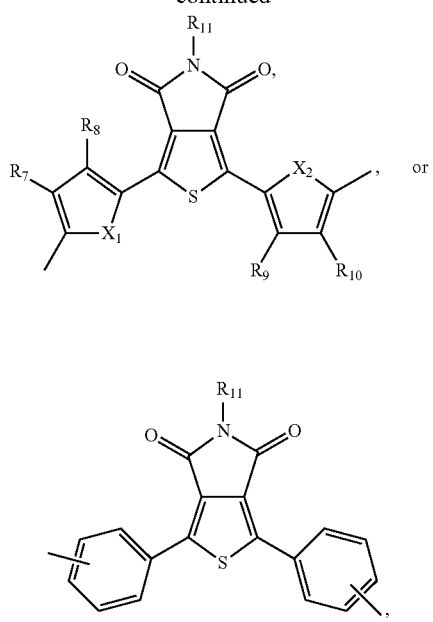

wherein $X_1$ and $X_2$ are each independently S, O, or Se, $R_7$, $R_8$, $R_9$ and $R_{10}$ are each independently an alkyl group having 1 to 30 carbon atoms, an alkoxy group having 1 to 30 carbon atoms, or a haloalkyl group having 1 to 30 carbon atoms, and $R_{11}$ and $R_{12}$ are each independently an alkyl group having 1 to 30 carbon atoms, and n is an integer ranging from 1 to 1000, m is an integer ranging from 0 to 1000, and l is an integer ranging from 1 to 1000.

In Formula 4, $R_2$ and $R_5$ may be the same, and be a linear alkyl group having 4 to 14 carbon atoms. Also in Formula 4, $R_1$ and $R_6$ may be the same, and be a linear alkyl group having 4 to 14 carbon atoms. Also in Formula 4, $R_3$ and $R_4$ may be hydrogen. Furthermore, m may be 0 in Formula 4.

The polymer represented by Formula 4 may be represented by the following Formula 5.

[Formula 5]

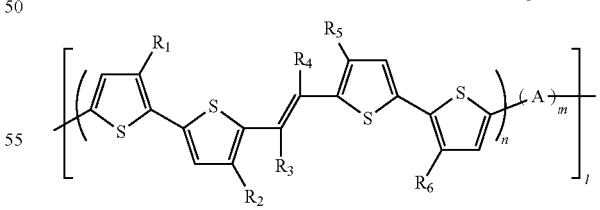

wherein, $R_3$, $R_4$, A, n, m and l are identical to $R_3$, $R_4$, A, n, m and l in Formula 4, respectively, and $R_1$, $R_2$, $R_5$, and $R_6$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms.

The polymer represented by Formula 4 may be represented by the following Formula 6.

[Formula 6]

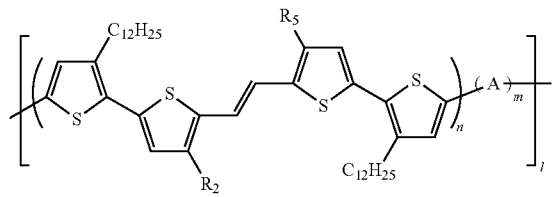

wherein, A, n, m and l are identical to A, n, m and l in Formula 4, respectively, and $R_2$ and $R_5$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms.

The polymer represented by Formula 4 may be represented by the following Formula III.

[Formula III]

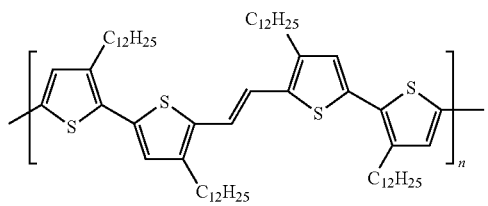

wherein, n may be an integer ranging from 1 to 1000.

The polymer represented by Formula 4 may be represented by the following Formula IV.

[Formula IV]

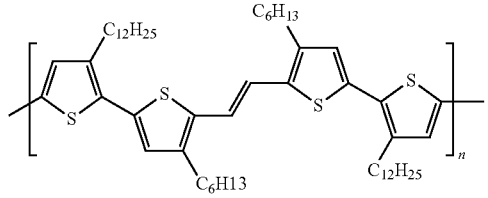

wherein, n may be an integer ranging from 1 to 1000.

According to another exemplary embodiment of the present invention, a polymer containing a thiophene unit and a thienylenevinylene unit is provided. Here, the polymer may be represented by the following Formula 1.

[Formula 1]

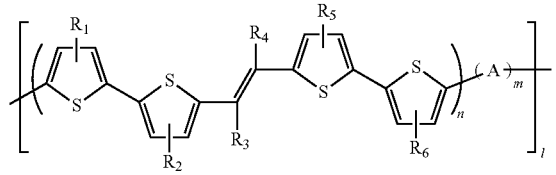

wherein,
$R_1$, $R_2$, $R_3$, $R_4$, $R_5$, and $R_6$ are each independently hydrogen, an alkyl group having 1 to 25 carbon atoms, an alkoxy group having 1 to 25 carbon atoms, a haloalkyl group having 1 to 25 carbon atoms, or an aryl group having 6 to 30 carbon atoms, A represents

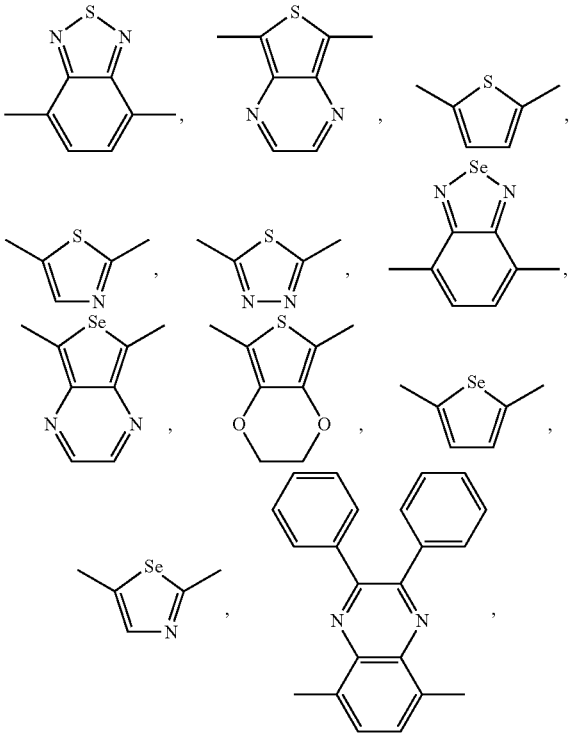

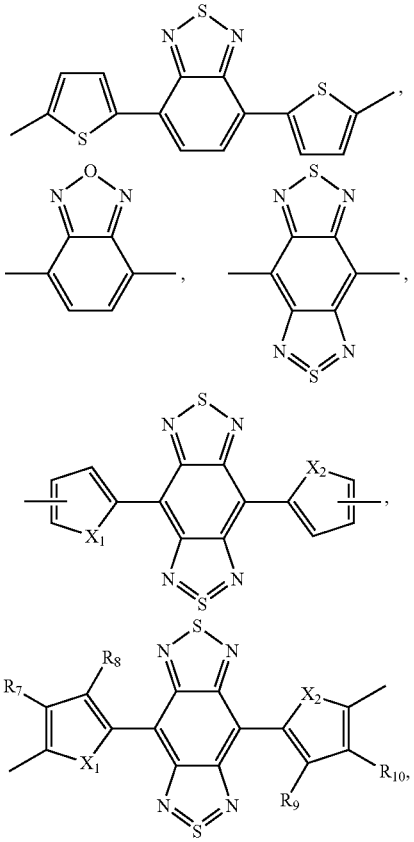

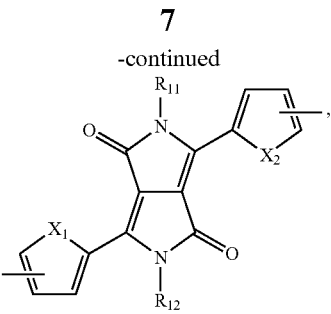

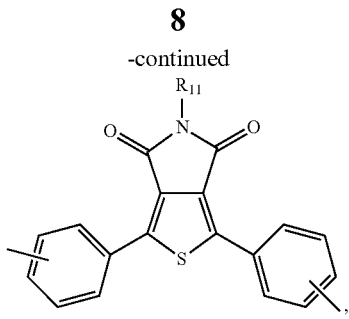

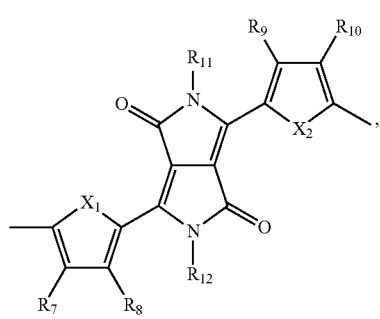

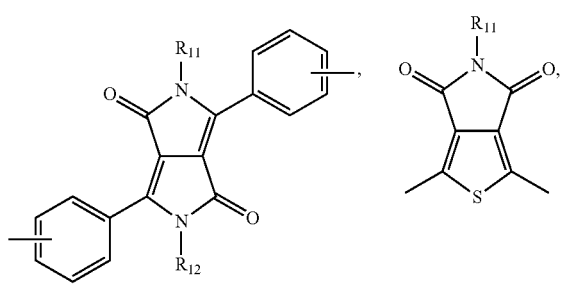

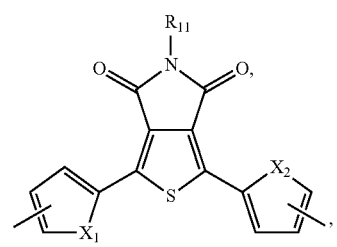

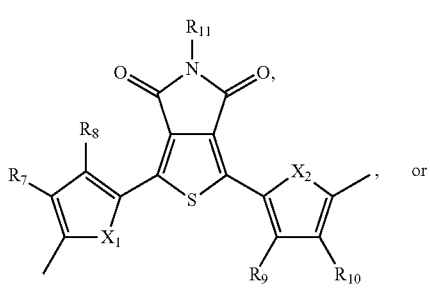

wherein $X_1$ and $X_2$ are each independently S, O, or Se, $R_7$, $R_8$, $R_9$ and $R_{10}$ are each independently an alkyl group having 1 to 30 carbon atoms, an alkoxy group having 1 to 30 carbon atoms, or a haloalkyl group having 1 to 30 carbon atoms, and $R_{11}$ and $R_{12}$ are each independently an alkyl group having 1 to 30 carbon atoms, and n is an integer ranging from 1 to 1000, m is an integer ranging from 1 to 1000, and l is an integer ranging from 1 to 1000.

The polymer represented by Formula 1 may be represented by the following Formula 2.

[Formula 2]

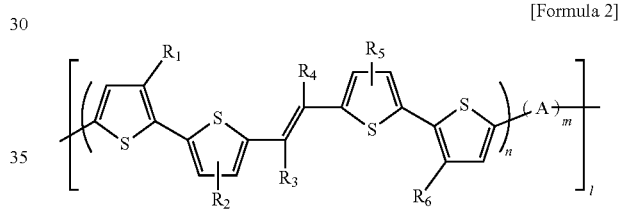

wherein, $R_2$, $R_3$, $R_4$, $R_5$, A, n, m and l are identical to $R_2$, $R_3$, $R_4$, $R_5$, A, n, m and l in Formula 1, respectively, and $R_1$ and $R_6$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms.

In Formula 2, $R_1$ and $R_6$ may be the same, and be a linear alkyl group having 4 to 14 carbon atoms. Also in Formula 2, $R_3$ and $R_4$ may be hydrogen. Furthermore, $R_2$ and $R_5$ may be hydrogen in Formula 2.

The polymer represented by Formula 1 may be represented by the following Formula 3.

[Formula 3]

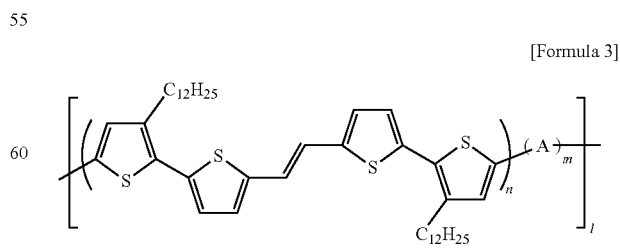

wherein, A, n, m and l are identical to A, n, m and l in Formula 1, respectively.

The polymer represented by Formula 1 may be represented by the following Formula V.

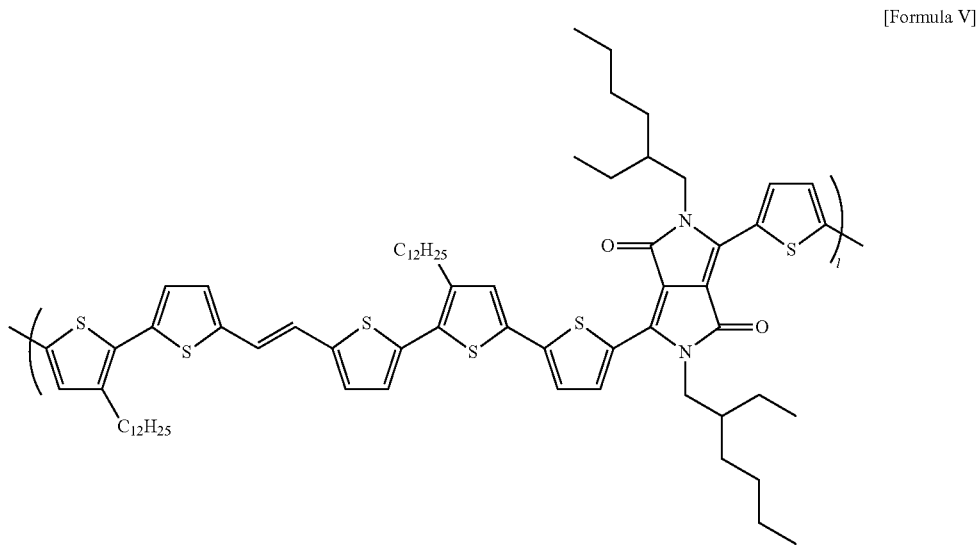

[Formula V]

wherein l is an integer ranging from 1 to 1000.

According to still another exemplary embodiment of the present invention, a method for manufacturing an organic semiconductor layer is provided. For this purpose, a film is first formed by coating a substrate with the polymer containing a thiophene unit and a thienylenevinylene unit represented by any one of Formulas 1 to 6, III, IV and V. Then, the film is subjected to heat treatment.

According to yet another exemplary embodiment of the present invention, an organic field effect transistor is provided. Here, the organic field effect transistor includes an organic semiconductor layer. The organic semiconductor layer is arranged on the substrate, and includes a polymer containing a thiophene unit and a thienylenevinylene unit represented by any one of Formulas 1 to 6, III, IV and V. A gate electrode is arranged above or below the organic semiconductor layer to overlap the organic semiconductor layer. Also, a source electrode and a drain electrode are connected to both ends of the organic semiconductor layer, respectively.

According to yet another exemplary embodiment of the present invention, an organic solar cell is provided. Here, the organic solar cell has a first electrode arranged on a substrate. On the first electrode, an organic active layer including a polymer containing a thiophene unit and a thienylenevinylene unit represented by any one of Formulas 1 to 6, III, IV and V is positioned. Then, a second electrode is arranged on the organic active layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
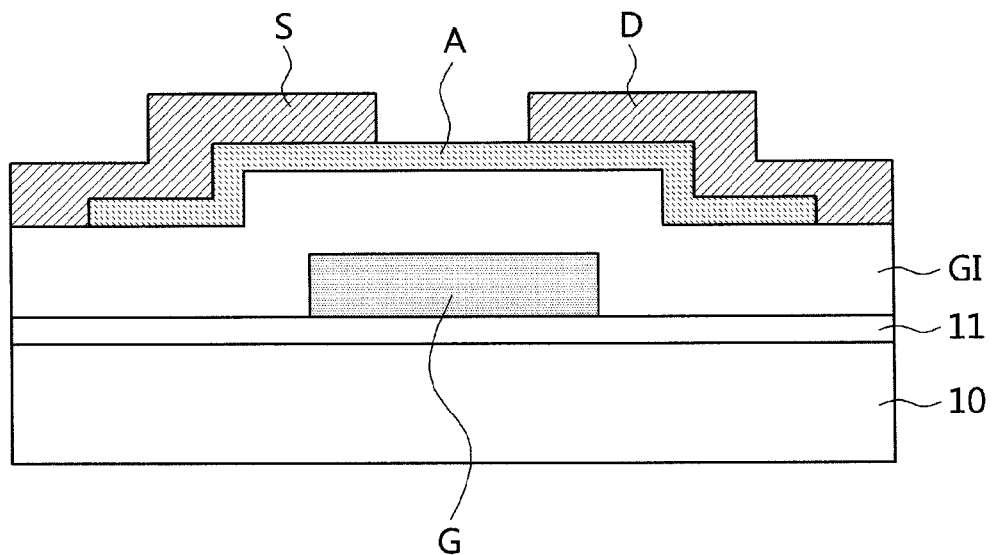
FIG. 1 is a cross-sectional view showing an organic field effect transistor according to one embodiment of the present invention.

Hereinafter, embodiments of the present invention will be described in the specification with reference to the accompanying drawings. Therefore, the description proposed herein is merely a preferable example for the purpose of illustration only, not intended to limit the scope of the invention, so it should be understood that other equivalents and modifications could be made thereto without departing from the spirit and scope of the invention. Furthermore, for reference numerals that are marked hereinafter in the accompanying drawings, parts and their related counterparts that have the same functions are represented by the same numbers or their serial numbers.

Hereinafter, embodiments of the present invention will be described in more detail with reference to the accompanying drawings.

Polymer

A polymer according to one embodiment of the present invention may include a polymer represented by the following Formula 1, which contains a thiophene unit and a thienylenevinylene unit.

[Formula 1]

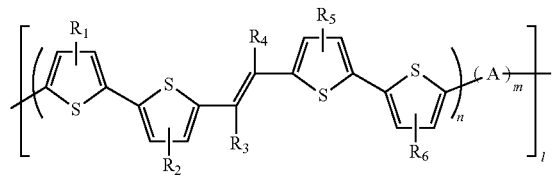

wherein, $R_1$, $R_2$, $R_3$, $R_4$, $R_5$, and $R_6$ may each be independently hydrogen, an alkyl group having 1 to 25 carbon atoms, an alkoxy group having 1 to 25 carbon atoms, a haloalkyl group having 1 to 25 carbon atoms, or an aryl group having 6 to 30 carbon atoms. Particularly, $R_1$, $R_2$, $R_3$, $R_4$, $R_5$, and $R_6$ may each be independently hydrogen, an alkyl group having 4 to 14 carbon atoms, an alkoxy group having 4 to 14 carbon atoms, a haloalkyl group having 3 to 14 carbon atoms, or an aryl group having 6 to 25 carbon atoms. More particularly, $R_1$, $R_2$, $R_3$, $R_4$, $R_5$, and $R_6$ may each be independently hydrogen, an alkyl group having 6 to 12 carbon atoms, an alkoxy group having 6 to 12 carbon atoms, a haloalkyl group having 3 to 12 carbon atoms, or an aryl group having 6 to 15 carbon atoms. The aryl group having 6 to 30 carbon atoms may be a group that is substituted with an alkyl group having 1 to 25 carbon atoms or an alkoxy group having 1 to 25 carbon atoms, particularly, a group that is substituted with an alkyl group having 4 to 14 carbon atoms or an alkoxy group having 4 to 14 carbon atoms, or more particularly, a group that is substituted with an alkyl group having 6 to 12 carbon atoms or an alkoxy group having 6 to 12 carbon atoms. Here, the alkyl group may be a linear alkyl group, and the alkoxy group may be a linear alkoxy group.

In one embodiment, $R_1$ and $R_6$ may be the same functional groups, $R_2$ and $R_5$ may be the same functional groups, and $R_3$ and $R_4$ may be the same functional groups. Particularly, $R_3$ and $R_4$ may be hydrogen, and $R_2$ and $R_5$ may also be hydrogen.

Depending on the presence and kinds of $R_1$, $R_2$, $R_3$, $R_4$, $R_5$ and $R_6$, the organic compound represented by Formula 1 may be dissolved in a solvent to different extents and distance between main chains of adjacent polymer molecules may be varied.

In Formula 1, A represents

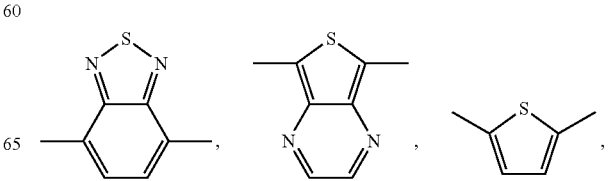

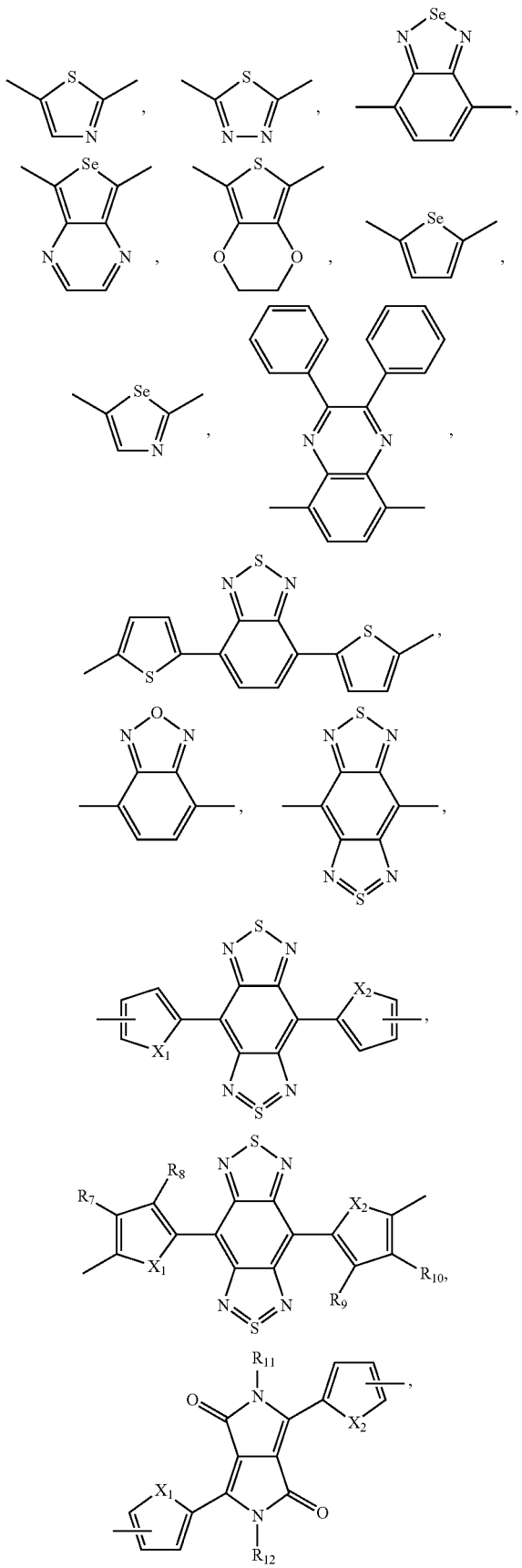
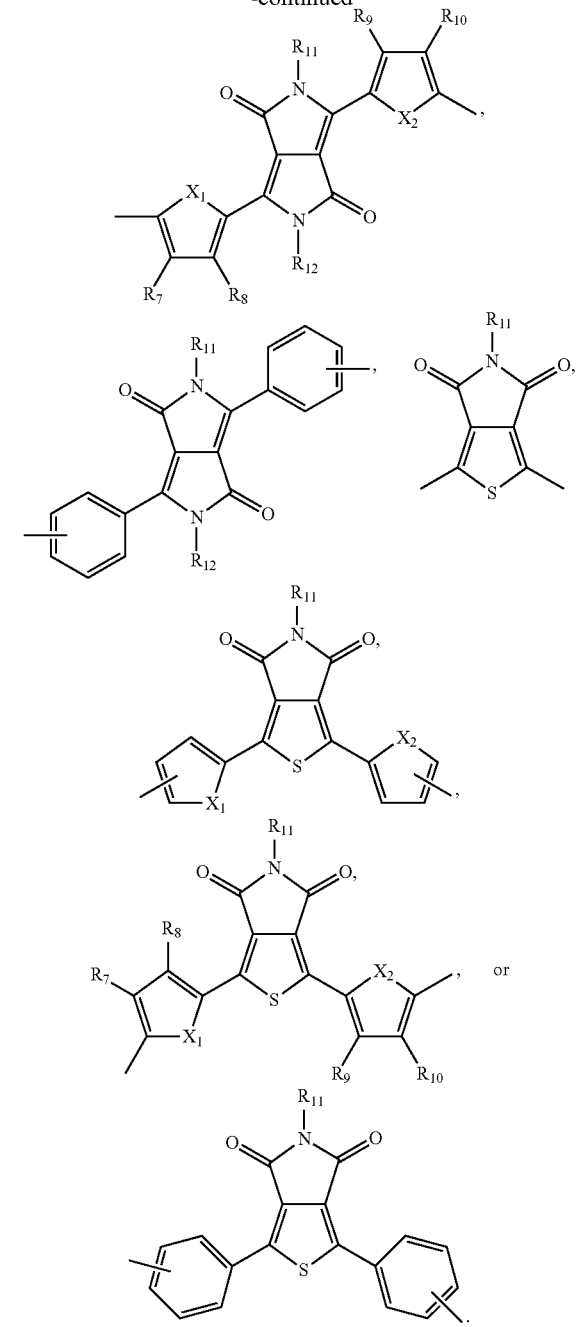

Here, $X_1$ and $X_2$ may each be independently S, O, or Se, $R_7$, $R_8$, $R_9$, and $R_{10}$ may each be independently an alkyl group having 1 to 30 carbon atoms, an alkoxy group having 1 to 30 carbon atoms, or a haloalkyl group having 1 to 30 carbon atoms, and $R_{11}$ and $R_{12}$ may each be independently an alkyl group having 1 to 30 carbon atoms.

In Formula 1, A represents a component that functions as an electron acceptor. Here, an effective band gap of the polymer may be adjusted, or more particularly, become narrow, by the introduction of 'A.' Therefore, an optical absorption wavelength region of the polymer may be expanded into a long wavelength region.

In Formula 1, n may be an integer ranging from 1 to 1000, m may be an integer ranging from 0 to 1000, and l may be an integer ranging from 1 to 1000. In one embodiment, m may be an integer ranging from 1 to 1000. Specifically, n may be an integer ranging from 10 to 500, m may be an integer ranging from 10 to 500, and l may be an integer ranging from 10 to 200.

For example, the polymer represented by Formula 1 may include a polymer represented by the following Formula 2.

[Formula 2]

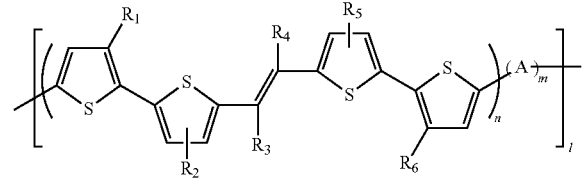

wherein, $R_2$, $R_3$, $R_4$, $R_5$, A, n, m and l are identical to $R_2$, $R_3$, $R_4$, $R_5$, A, n, m and l in Formula 1, respectively.

$R_1$ and $R_6$ may each be independently an alkyl group having 1 to 25 carbon atoms, an alkoxy group having 1 to 25 carbon atoms, a haloalkyl group having 1 to 25 carbon atoms, or an aryl group having 6 to 30 carbon atoms. Particularly, $R_1$ and $R_6$ may each be independently an alkyl group having 4 to 14 carbon atoms, an alkoxy group having 4 to 14 carbon atoms, a haloalkyl group having 3 to 14 carbon atoms, or an aryl group having 6 to 25 carbon atoms. More particularly, $R_1$ and $R_6$ may each be independently an alkyl group having 6 to 12 carbon atoms, an alkoxy group having 6 to 12 carbon atoms, a haloalkyl group having 3 to 12 carbon atoms, or an aryl group having 6 to 15 carbon atoms. The aryl group having 6 to 30 carbon atoms may be a group that is substituted with an alkyl group having 1 to 25 carbon atoms or an alkoxy group having 1 to 25 carbon atoms, particularly, a group that is substituted with an alkyl group having 4 to 14 carbon atoms or an alkoxy group having 4 to 14 carbon atoms, or more particularly, a group that is substituted with an alkyl group having 6 to 12 carbon atoms or an alkoxy group having 6 to 12 carbon atoms. Here, the alkyl group may be a linear alkyl group, and the alkoxy group maybe a linear alkoxy group. In one embodiment, $R_1$ and $R_6$ may be the same functional groups.

In Formula 2, $R_1$ and $R_6$ face each other towards the center of a monomer, and thus interdigitation between adjacent polymer molecules can be anticipated. As a result, the formation of a film having more orderly arranged polymers is anticipated.

For example, the polymer represented by Formula 2 may include a polymer represented by the following Formula 3.

[Formula 3]

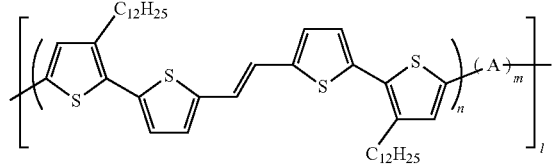

wherein, A, n, m and l are identical to A, n, m and l in Formula 1, respectively.

For example, the polymer represented by Formula 1 may include a to polymer represented by the following Formula 4.

[Formula 4]

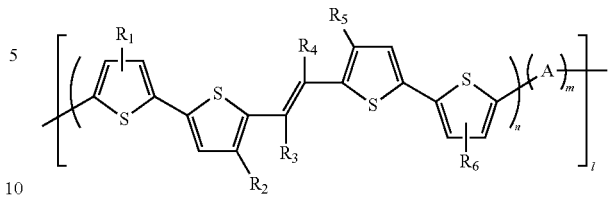

wherein, $R_1$, $R_3$, $R_4$, $R_6$, A, n, m and l are identical to $R_1$, $R_3$, $R_4$, $R_6$, A, n, m and l in Formula 1, respectively.

$R_2$ and $R_5$ may each be independently an alkyl group having 1 to 25 carbon atoms, an alkoxy group having 1 to 25 carbon atoms, a haloalkyl group having 1 to 25 carbon atoms, or an aryl group having 6 to 30 carbon atoms. Particularly, $R_2$ and $R_5$ may each be independently an alkyl group having 4 to 14 carbon atoms, an alkoxy group having 4 to 14 carbon atoms, a haloalkyl group having 3 to 14 carbon atoms, or an aryl group having 6 to 25 carbon atoms. More particularly, $R_2$ and $R_5$ may each be independently an alkyl group having 6 to 12 carbon atoms, an alkoxy group having 6 to 12 carbon atoms, a haloalkyl group having 3 to 12 carbon atoms, or an aryl group having 6 to 15 carbon atoms. The aryl group having 6 to 30 carbon atoms may be a group that is substituted with an alkyl group having 1 to 25 carbon atoms or an alkoxy group having 1 to 25 carbon atoms, particularly, a group that is substituted with an alkyl group having 4 to 14 carbon atoms or an alkoxy group having 4 to 14 carbon atoms, or more particularly, a group that is substituted with an alkyl group having 6 to 12 carbon atoms or an alkoxy group having 6 to 12 carbon atoms. Here, the alkyl group may be a linear alkyl group, and the alkoxy group may be a linear alkoxy group. In one embodiment, the residues $R_2$ and $R_5$ may be the same functional groups.

In Formula 4, $R_2$ and $R_5$ face each other towards the center of a monomer, and thus interdigitation between adjacent polymer molecules can be anticipated. As a result, the formation of a film having more orderly arranged polymers is anticipated.

For example, the polymer represented by Formula 1 may include a polymer represented by the following Formula 5.

[Formula 5]

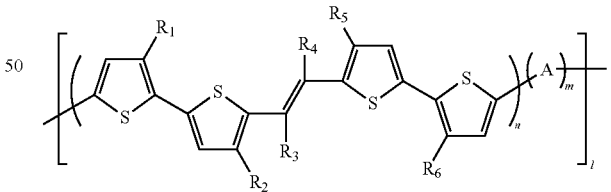

wherein, $R_3$, $R_4$, A, n, m and l are identical to $R_3$, $R_4$, A, n, m and l in Formula 1 or 4, respectively.

$R_1$, $R_2$, $R_5$, and $R_6$ may each be independently an alkyl group having 1 to 25 carbon atoms, an alkoxy group having 1 to 25 carbon atoms, a haloalkyl group having 1 to 25 carbon atoms, or an aryl group having 6 to 30 carbon atoms. Particularly, $R_1$, $R_2$, $R_5$, and $R_6$ may each be independently an alkyl group having 4 to 14 carbon atoms, an alkoxy group having 4 to 14 carbon atoms, a haloalkyl group having 3 to 14 carbon atoms, or an aryl group having 6 to 25 carbon atoms. More particularly, $R_1$, $R_2$, $R_5$, and $R_6$ may each be independently an alkyl group having 6 to 12 carbon atoms, an alkoxy group having 6 to 12 carbon atoms, a haloalkyl group having 3 to 12 carbon atoms, or an aryl group having 6 to 15 carbon atoms. The aryl group having 6 to 30 carbon atoms may be a group that is substituted with an alkyl group having 1 to 25 carbon atoms or an alkoxy group having 1 to 25 carbon atoms, particularly, a group that is substituted with an alkyl group having 4 to 14 carbon atoms or an alkoxy group having 4 to 14 carbon atoms, or more particularly, a group that is substituted with an alkyl group having 6 to 12 carbon atoms or an alkoxy group having 6 to 12 carbon atoms. Here, the alkyl group may be a linear alkyl group, and the alkoxy group may be a linear alkoxy group. In one embodiment, $R_1$ and $R_6$ may be the same functional groups, and $R_2$ and $R_5$ may be the same functional groups.

For example, the polymer represented by Formula 5 may include a polymer represented by the following Formula 6.

[Formula 6]

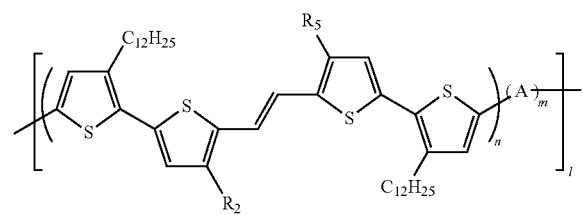

wherein, A, n, m and l are identical to A, n, m and l in Formula 1 or 4, respectively.

$R_2$ and $R_5$ may each be independently an alkyl group having 1 to 25 carbon atoms, an alkoxy group having 1 to 25 carbon atoms, a haloalkyl group having 1 to 25 carbon atoms, or an aryl group having 6 to 30 carbon atoms. Particularly, $R_2$ and $R_5$ may each be independently an alkyl group having 4 to 14 carbon atoms, an alkoxy group having 4 to 14 carbon atoms, a haloalkyl group having 3 to 14 carbon atoms, or an aryl group having 6 to 25 carbon atoms. More particularly, $R_2$ and $R_5$ may each be independently an alkyl group having 6 to 12 carbon atoms, an alkoxy group having 6 to 12 carbon atoms, a haloalkyl group having 3 to 12 carbon atoms, or an aryl group having 6 to 15 carbon atoms. The aryl group having 6 to 30 carbon atoms may be a group that is substituted with an alkyl group having 1 to 25 carbon atoms or an alkoxy group having 1 to 25 carbon atoms, particularly, a group that is substituted with an alkyl group having 4 to 14 carbon atoms or an alkoxy group having 4 to 14 carbon atoms, or more particularly, a group that is substituted with an alkyl group having 6 to 12 carbon atoms or an alkoxy group having 6 to 12 carbon atoms. Here, the alkyl group may be a linear alkyl group, and the alkoxy group may be a linear alkoxy group. In one embodiment, $R_2$ and $R_5$ may be the same functional groups.

The polymers of Formulas 1 to 6 may be synthesized using a suitable method such as Stille coupling, Suzuki coupling, or Yamamoto coupling after forming a thienylenevinylene group using a McMurry reaction.

Polymer Film

Films, particularly organic semiconductor films, may be formed by coating substrates with one of the polymers of Formulas 1 to 6 using a solution process. The solution process may be a spin coating method or an inkjet printing method. Therefore, the production cost may be reduced and a large-scale device may be suitably manufactured since there is no need for an expensive vacuum system to form films.

The polymers of Formulas 1 to 6 have very excellent flatness since the thiophene unit is continuously coupled with a vinyl group having excellent flatness. Therefore, charge mobility of the polymer film may be improved since the polymers in the film have high crystallinity caused by the improved ordering property between polymer molecules. In order to further improve the crystallinity, the films coated on the substrates may be subjected to heat treatment. In this case, the heat treatment may be performed at a temperature of 80° C. to 250° C., which may induce a phase transition into a liquid-crystalline phase.

In addition, the polymers of Formulas 1 to 6 may have high oxidative stability due to high ionization energy.

Each of the polymers of Formulas 1 to 6 may be used as an organic semiconductor layer of the organic electronic device, for example, as a semiconductor layer of the organic field effect transistor or an active layer of the organic solar cell.

Organic Field Effect Transistor

FIG. 1 is a cross-sectional view showing an organic field effect transistor according to one embodiment of the present invention.

Referring to FIG. 1, a buffer layer 11 may be formed on a substrate 10. The substrate 10 may be a silicon substrate, a glass substrate or a polymer substrate. The buffer layer 11 may be a silicon oxide film or a silicon nitride film.

A gate electrode G may be formed on the substrate 10. The gate electrode G may be formed of nickel (Ni), gold (Au), copper (Cu), silver (Ag), platinum (Pt), chromium (Cr), aluminum (Al), an aluminum alloy, molybdenum (Mo) or a molybdenum alloy.

A gate insulating film GI may be formed on the gate electrode G. The gate insulating film GI may be a single layer or a multilayer, wherein each layer is an organic insulating film, an inorganic insulating film, or an organic-inorganic hybrid film. The inorganic insulating film may be formed of silicon oxide, silicon nitride, $Al_2O_3$, $Ta_2O_5$, $TiO_2$, BST, or PZT, and the organic insulating film may be formed of cross-linked or uncross-linked polymethylmethacrylate (PMMA), polystyrene (PS), parylene, poly-4-vinylphenol (PVP), polyvinylalcohol (PVA), divinyltetramethyldisiloxane-bis(benzocyclobutene) (BCB), poly-alpha-methylstyrene (PaMS), or poly ethylene terephthalate (PET).

An organic semiconductor layer A overlapping the gate electrode G may be formed on the gate insulating film GI. The organic semiconductor layer A may be formed of one of the polymers of Formulas 1 to 6. Particularly, the organic semiconductor layer A may be formed by coating with a solution in which one of the polymers of Formulas 1 to 6 is dissolved in a solvent, using a solution process. The solvent may be toluene, xylene, chloroform (CF), chrolobenzene or dichrolobenzene (DCB). The solution process may be a spin coating, dip coating, screen printing, or inkjet printing method. Therefore, the production cost may be reduced and a large-scale device may be suitably manufactured since there is no need for an expensive vacuum system to form films.

Each of the polymers of Formulas 1 to 6 has very excellent flatness since the thiophene unit is continuously coupled with a vinyl group having excellent flatness. Therefore, the polymers in the film may have high crystallinity caused by the improved ordering property between polymer molecules. The charge mobility in the organic semiconductor layer A may be improved due to such high crystallinity.

The organic semiconductor layer A may be subjected to heat treatment. As a result, molecules of the polymer may be re-arranged, which leads to further improvement of the crystallinity. The heat treatment may be performed at a temperature of 80° C. to 250° C., which may induce a phase transition into a liquid-crystalline phase. In addition, each of the polymers of Formulas 1 to 6 may have high oxidative stability because of its high ionization energy.

Source and drain electrodes S and D, which are spaced apart from each other, are formed on the organic semiconductor layer A. The source and drain electrodes S and D are connected to both ends of the organic semiconductor layer A, respectively. The source and drain electrodes S and D may be formed in a single layer structure selected from the group consisting of Au, Cu, Pt, Ni, Cr, palladium (Pd), Al, Ag, magnesium (Mg), calcium (Ca), ytterbium (Yb), Cs-ITO or alloys thereof, or polymeric conductors such as poly(3,4-ethylenedioxythiophene): poly(styrenesulfonate) (PEDOT:PSS) and PANI(polyaniline), and be formed in a multilayer structure further including an adhesive metal layer such as titanium (Ti), Ni, Cr or Al.

In this organic field effect transistor, the gate electrode is placed below the organic semiconductor layer, and the source and drain electrodes are connected onto the organic semiconductor layer. Therefore, the organic field effect transistor of this embodiment may be a bottom-gate, top-contact thin film transistor.

Figure 2:
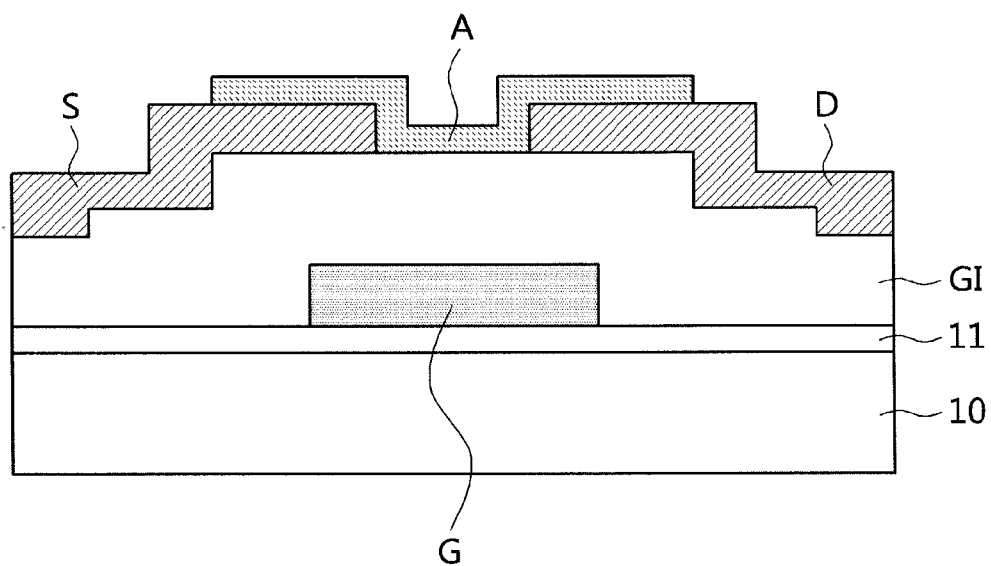
FIG. 2 is a cross-sectional view showing an organic field effect transistor according to another embodiment of the present invention.

FIG. 2 is a cross-sectional view showing an organic field effect transistor according to another embodiment of the present invention. The organic field effect transistor according to this embodiment is substantially the same as the organic field effect transistor described with reference to FIG. 1, except for the configurations as described below.

Referring to FIG. 2, a buffer layer 11 may be formed on a substrate 10. A gate electrode G may be formed on the substrate 10. A gate insulating film GI may be formed on the gate electrode G.

Source and drain electrodes S and D, which are spaced apart from each other, are formed on the gate insulating film GI. The gate insulating film GI is exposed between the source and drain electrodes S and D.

An organic semiconductor layer A may be formed on the source and drain electrodes S and D and the gate insulating film GI. The organic semiconductor layer A may be formed of one of the polymers of Formulas 1 to 6.

In this organic field effect transistor, the gate electrode is placed below the organic semiconductor layer, and the source and drain electrodes are connected to a lower surface of the organic semiconductor layer. Therefore, the organic field effect transistor of this embodiment may be a bottom-gate, bottom-contact thin film transistor.

Figure 3:
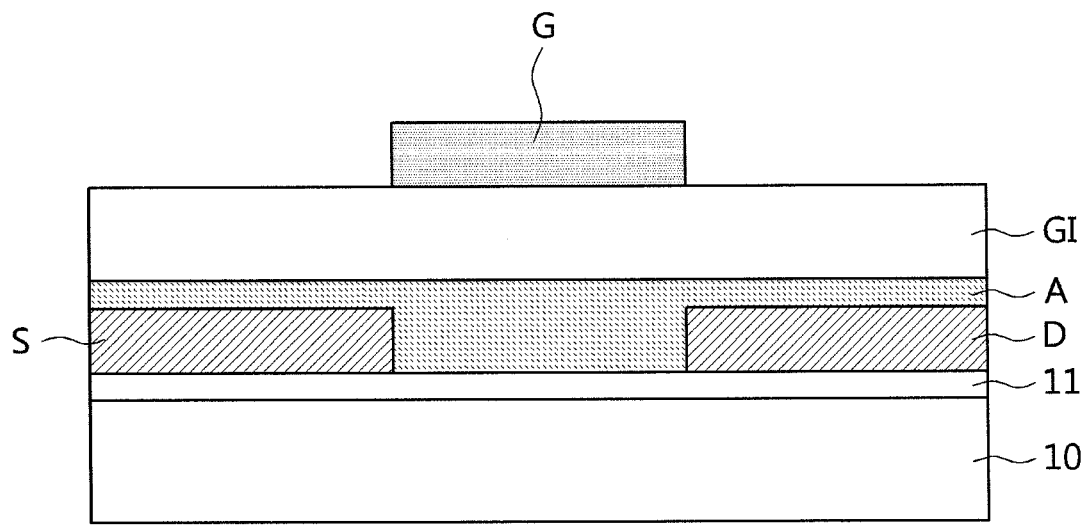
FIG. 3 is a cross-sectional view showing an organic field effect transistor according to still another embodiment of the present invention.

FIG. 3 is a cross-sectional view showing an organic field effect transistor according to still another embodiment of the present invention. The organic field effect transistor according to this embodiment is substantially the same as the organic field effect transistor described with reference to FIG. 1, except for the configurations as described below.

Referring to FIG. 3, a buffer layer 11 may be formed on a substrate 10. Source and drain electrodes S and D, which are spaced apart from each other, are formed on the buffer layer 11. The buffer layer 11 may be exposed between the source and drain electrodes S and D.

An organic semiconductor layer A may be formed on the source and drain electrodes S and D, and the buffer layer 11 exposed between the source and drain electrodes S and D. The organic semiconductor layer A may be formed of one of the polymers of Formulas 1 to 6. A gate insulating film GI is formed on the organic semiconductor layer A. A gate electrode G may be formed on the gate insulating film GI.

In this organic field effect transistor, the gate electrode is placed above the organic semiconductor layer, and the source and drain electrodes are connected to a lower surface of the organic semiconductor layer. Therefore, the organic field effect transistor of this embodiment may be a top-gate, bottom-contact thin film transistor.

Organic Solar Cell

Figure 4:
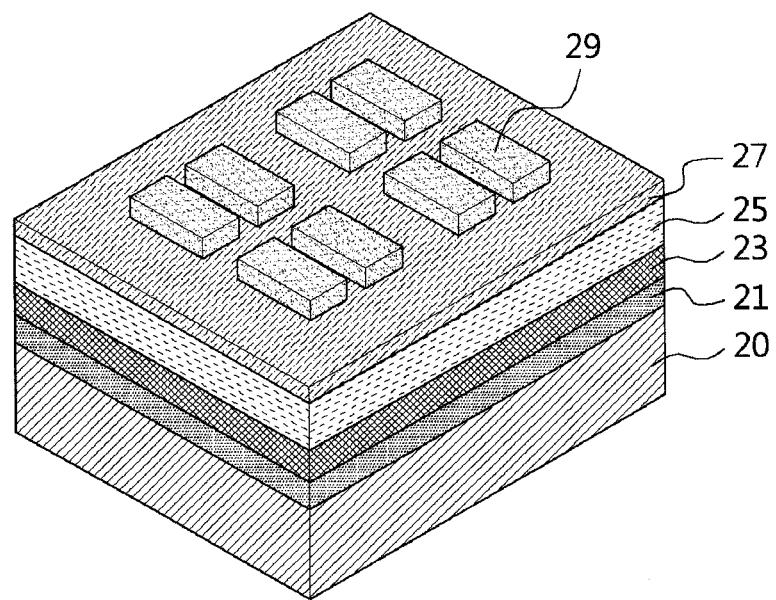
FIG. 4 is a schematic view showing an organic solar cell according to one embodiment of the present invention.

FIG. 4 is a schematic view showing an organic solar cell according to one embodiment of the present invention.

Referring to FIG. 4, a first electrode 21, a first charge transport layer 23, an active layer 25, a second charge transport layer 27 and a second electrode 29 may be sequentially formed on a substrate 20.

The substrate 20 may be a transparent substrate. The transparent substrate may be a glass substrate or a plastic substrate. The first electrode 21 may be a transparent electrode, and also be a cathode. The first electrode 21 may be an indium tin oxide (ITO) film, an indium oxide (IO) film, a tin oxide (TO) film, a fluorinated tin oxide (FTO) film, an indium zinc oxide (IZO) film, or a zinc oxide (ZnO) film.

The first charge transport layer 23 may be a hole transport layer. The first charge transport layer 23 includes, for example, a PEDOT:PSS layer.

The organic active layer 25 is a layer for absorbing light to generate excitons, which may have a donor material and an acceptor material. The organic active layer 25 may be a bulk heterojunction (BHJ) layer in which the donor material and the acceptor material are mixed with each other. On the other hand, the organic active layer 25 may have a donor material layer and an acceptor material layer stacked in order.

The electron donor is a material that absorbs light to excite electrons of HOMO into LUMO. The electron donor may be an organic compound including one of the polymers of Formulas 1 to 6. The electron acceptor is a material that receives the electrons excited from the electron donor. The electron acceptor may be a $C_{60}$ to $C_{84}$ fullerene, for example $C_{60}$, $C_{70}$, $C_{76}$, and $C_{84}$ fullerene, or derivatives thereof, or perylene. The fullerene derivatives may be PCBM, for example PCBM ($C_{60}$) ([6,6]-phenyl-$C_{61}$-butyric acid methyl ester) or PCBM ($C_{70}$) ([6,6]-phenyl-$C_{71}$-butyric acid methyl ester).

The organic active layer 25 may be formed using a solution process after the donor material and the acceptor material are dissolved in a solvent. The solvent may be chrolobenzene or DCB. When the organic active layer 25 is a bulk heterojunction layer, the donor material and the acceptor material may be mixed in a mass ratio of 1:0.5 to 1:5.

The solution process may be a method such as spin coating, ink-jet printing, Dr. Blade, or screen printing. There is no need for an expensive vacuum system since the solution process is used to form the organic active layer 25. Therefore, it is possible to reduce the production cost and realize the manufacture of a large-scale device.

The polymers represented by Formulas 1 to 6 have very excellent flatness since the thiophene unit is continuously coupled with a vinyl group having excellent flatness. Therefore, the polymers in the film may have high crystallinity caused by the improved ordering property between polymer molecules. The charge mobility in the organic active layer 25 may be improved due to such high crystallinity, which makes it possible to improve the efficiency of the organic solar cell.

The organic active layer 25 formed on the substrate may be subjected to heat treatment. As a result, the polymers, that is, donor materials, may be re-arranged, which leads to a further improvement of the crystallinity. The heat treatment may be performed at a temperature of 80° C. to 250° C., which may induce a phase transition into a liquid-crystalline phase.

In addition, the polymers represented by Formulas 1 to 6 may have high oxidative stability due to their high ionization energy. Meanwhile, when m is 1 or more in Formulas 1 to 6, a band gap may be reduced by adjusting the effective band gaps in the molecular chains. In this case, a wavelength of the light which the polymers represented by Formulas 1 to 6 absorb may be expanded into a long wavelength region, thereby improving the optical absorption efficiency of the organic solar cell.

The second charge transport layer 27 may be an exciton blocking layer to prevent the diffusion of excitons. The exciton blocking layer may be a bathophen-anthroline (BPhen) layer.

The second electrode 29 may be a light reflection electrode, and also be an anode. Particularly, the second electrode 29 is a metal electrode which has a lower work function than the first electrode 21. For example, the second electrode 29 may be an Al film, a Ca film, or a Mg film. Preferably, the second electrode 29 may be composed of double layers of a Ca film having a low work function and an Al film having excellent conductivity.

Hereinafter, exemplary examples are provided for better understanding of the present invention, but it is understood that the description proposed herein is merely an exemplary example for the purpose of illustration only, not intended to limit the scope of the invention.

SYNTHETIC EXAMPLES OF POLYMERS

Synthetic Example 1

Synthesis of Polymer (I)

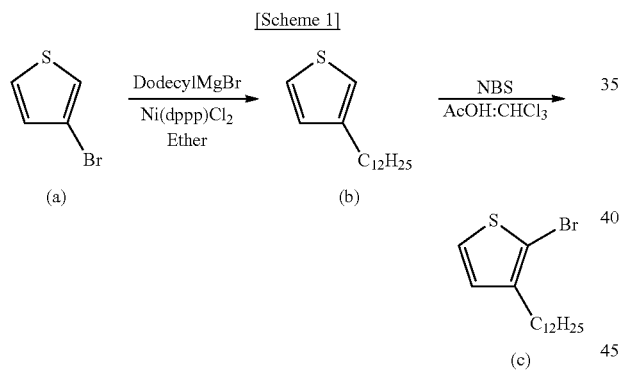

12.28 g (75 mmol) of compound (a) (namely, 3-bromothiophene (Aldrich)) and 1.5 mmol (2 mol % of compound (a)) of Ni(dppp)Cl$_2$ were dissolved in 60 ml of ether, and cooled to 0° C. Then, 84 mmol of a Grignard reagent (dodecylmagnesium bromide) was slowly added, and the resulting mixture was then refluxed for 12 hours. After the reaction, the mixture was cooled to 0° C., neutralized with hydrochloric acid (HCl), and then extracted with ether (a work-up process). The extract was purified through a silica column to obtain compound (b) (yield: 91.37%).

7.57 g (30 mmol) of compound (b) was put into a 2-neck flask, and acetic acid (AcOH) and CHCl$_3$ were added in a content of 60 ml (volume ratio 1:1), respectively. 30 mmol of N-bromosuccinimide (NBS) was dissolved in 80 ml of DMF, and then slowly added at 0° C. to the flask using a dropping funnel. Then, the resulting mixture was reacted at 0° C. for 3 hours. The reaction was quenched by adding water to the reaction solution. Then, the reaction solution was extracted with methylene chloride (MC) and purified through a silica column to obtain compound (c) (yield: 90%).

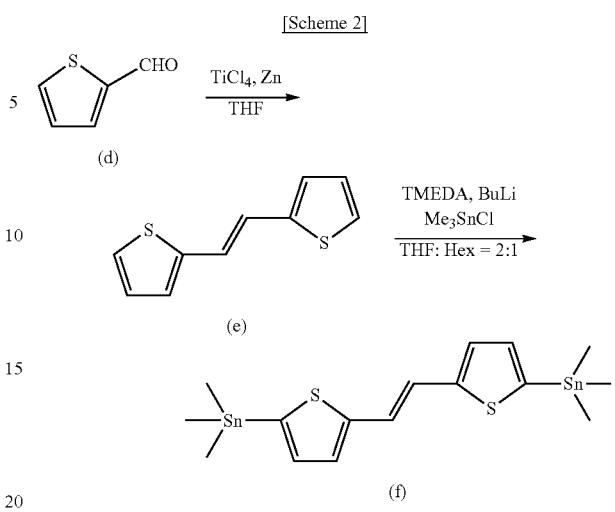

15.18 ml (138 mmol) of TiCl$_4$ was slowly added to 200 ml of anhydrous THF cooled to 0° C. while stirring. After the resulting mixture was kept for 15 minutes, 18 g (276 mmol) of zinc was added. Then, the mixture was heated for 1 hour while stirring, and cooled to 0° C. Meanwhile, 13 g (115.92 mmol) of compound (d) (Aldrich) dissolved in 50 ml of anhydrous THF was added to the mixture cooled to 0° C., and the resulting mixture was heated for 3 hour while stirring. After the stirring, the mixture was slowly cooled at a room temperature, and the reaction was quenched by adding 50 ml of ice water to the mixture. Then, the precipitates were filtered off. Then, the mixture was recrystallized from cyclohexane (C$_6$H$_{12}$) to obtain compound (e) (yield: 65%).

1.78 g (9.26 mmol) of compound (e) was added at −78° C. to 50 ml of a mixture of THF and hexane (THF:hexane=2:1, volume ratio), and stirred. Then, 3.18 ml (20.7 mmol) of TMEDA was slowly added while stirring. 11 ml (22 mmol) of n-BuLi was slowly added to the resulting mixture, and the mixture was refluxed for 1 hour. Then, the resulting reaction solution was cooled again to −78° C. and 22 mmol of trimethyltin chloride was slowly added to the resulting reaction mixture. Then, the reaction mixture was slowly warmed to a room temperature, extracted with ether, and then purified by a recrystallization method to obtain compound (f) (yield: 80.92%).

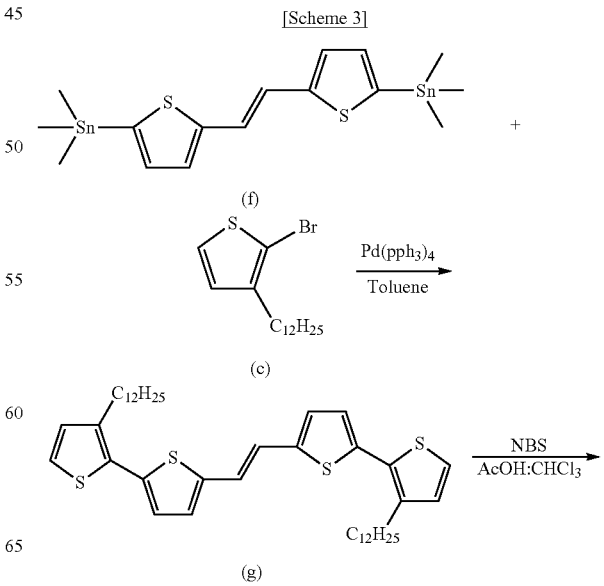

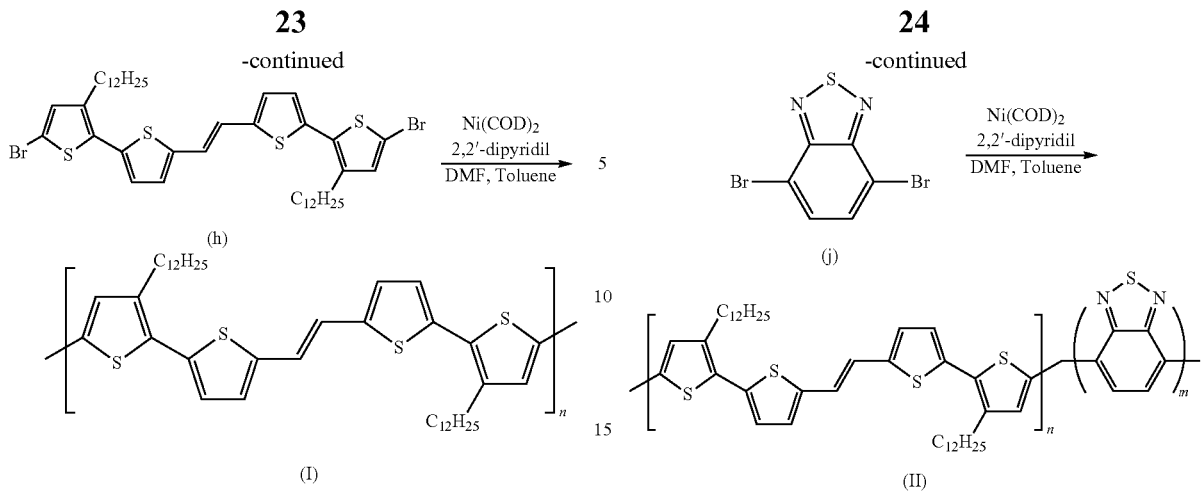

16.6 mmol of compound (c) prepared in Scheme 1, 7.49 mmol of compound (f) prepared in Scheme 2, and 0.74 mmol of Pd(pph$_3$)$_4$ were added to 120 ml of toluene, and reacted at 110° C. for 12 hours. After the reaction, the resulting reaction solution was extracted with MC, and purified through a silica column to obtain compound (g) (yield: 80.32%).

2 mmol of compound (g) was put into a 2-neck flask, and acetic acid and CHCl$_3$ were added in a content of 50 ml (volume ratio 1:1), respectively. 4 mmol of N-bromosuccinimide (NBS) was dissolved in 10 ml of DMF, and then slowly added at 0° C. to the flask using a dropping funnel. Then, the resulting mixture was reacted at 0° C. for 3 hours. The reaction was quenched by adding water to the reaction solution. Then, the reaction solution was extracted with MC, and purified through a silica column to obtain compound (h) (yield: 40.37%).

0.8 mmol of Ni(COD)$_2$ and 0.82 mmol of dipyridil were put into a flask, and dissolved in 10 ml of DMF, and then the resulting mixture was kept at 80° C. Then, 0.7 mmol of compound (h) dissolved in toluene was slowly added to the mixture, and reacted for 48 hours. After the reaction, the reaction mixture was precipitated from methanol, and the precipitate was filtered off to obtain the desired polymer (I) (yield: 40.37%). A molecular weight (Mn) of the desired polymer (I) was 15000, and its polydispersity index (PDI) was 1.7.

$^1$H NMR (400 MHz, CDCl$_3$, [ppm]): δ 7.03 (br, 4H), 6.97 (br, 2H), 6.95 (br, 2H), 2.77 (br, 4H), 1.68 (br, 4H), 1.25 (br, 36H), 0.86 (br, 6H)

Synthetic Example 2

Synthesis of Polymer (II)

[Scheme 4]

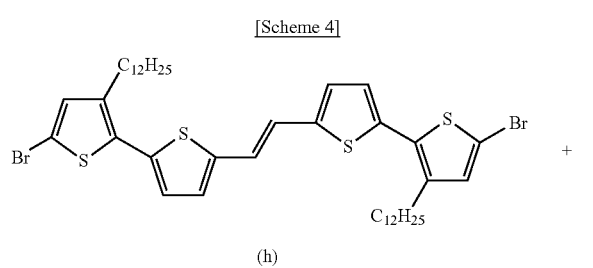

Compound (h) was prepared using the same method as described in Synthetic Example 1. 0.8 mmol of Ni(COD)$_2$ and 0.82 mmol of dipyridil were put into a flask, and dissolved in 10 ml of DMF. Then, the resulting mixture was kept at 80° C. 0.7 mmol of compound (h) dissolved in toluene, and compound (j) were slowly added to the mixture, and reacted for 48 hours. After the reaction, the resulting reaction mixture was precipitated from methanol, and the precipitate was filtered off to obtain the desired polymer (II) (yield: 40%). A molecular weight (Mn) of the desired polymer (II) was 8200, and its polydispersity index was 1.6.

Synthetic Example 3

Synthesis of Polymer (III)

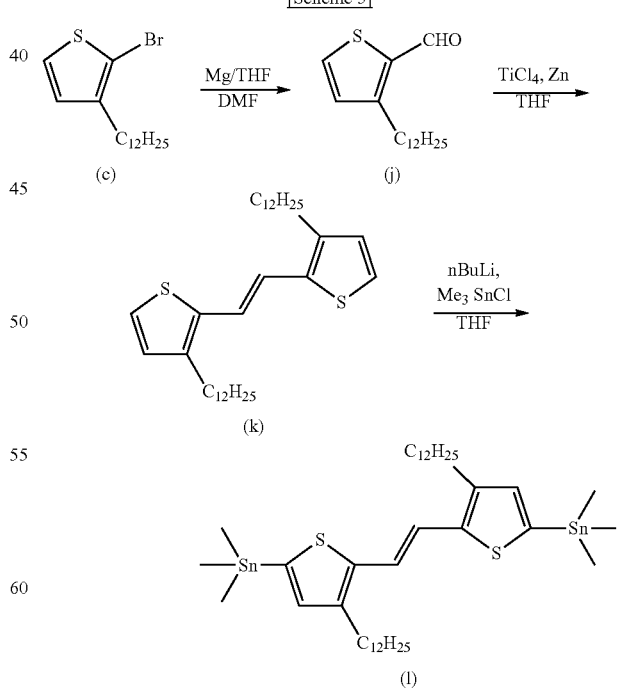

0.681 g (28.01 mmol) of Mg was added to 60 ml of anhydrous THF, and stirred in a nitrogen atmosphere. 5.301 g (16.06 mmol) of compound (c) prepared in Scheme 1 of Synthetic Example 1 was added to the resulting mixture, and refluxed for 2 hours. Then, the resulting mixture was cooled at room temperature, and 3.28 ml (40 mmol) of DMF was slowly added to the mixture, and refluxed for 24 hours. Subsequently, the resulting reaction mixture was cooled at room temperature, and the reaction was quenched by adding 20 ml of 1M HCl to the reaction mixture. The reaction mixture was purified on a silica column having hexane and ethyl acetate as a mobile phase to obtain compound (j) (yield: 85%).

100 ml of anhydrous THF was cooled to 0° C. in a nitrogen atmosphere. Then, 1.772 ml (16.11 mmol) of $TiCl_4$ was injected and stirred for 30 minutes. Subsequently, 2.107 g (32.22 mmol) of zinc (Zn) was added, and refluxed for 1 hour, and the resulting mixture was cooled again to 0° C. 3.009 g (10.74 mmol) of compound (j) and 1.303 ml (16.11 mmol) of pyridine were added to the mixture, and refluxed for 24 hours. Then, the reaction was quenched by adding 30 ml of ice water to the mixture. The mixture was recrystallized from isopropyl alcohol (IPA) to obtain compound (k) (yield: 70%).

1.575 g (2.98 mmol) of compound (k) was dissolved in 40 ml of anhydrous THF in a nitrogen atmosphere, and cooled to −78° C. 2.624 ml of 2M butyl lithium was added to the resulting mixture, and stirred for 30 minutes. Then, the mixture was warmed to room temperature, stirred at room temperature for 1 hour, and cooled again to −78° C. Then, 7.45 ml (7.45 mmol) of 1M trimethyltin chloride was added to the resulting reaction mixture, stirred for 10 minutes, and warmed again to room temperature. Subsequently, the reaction mixture was recrystallized from IPA to obtain compound (I) (yield: 90%).

$^1$H NMR (400 MHz, $CDCl_3$, [ppm]): δ 6.99 (s, 2H), 6.92 (s, 2H), 2.65 (t, 4H), 1.61 (m, 4H), 1.33 (br, 36H), 0.88 (t, 6H), 0.36 (s, 18H)

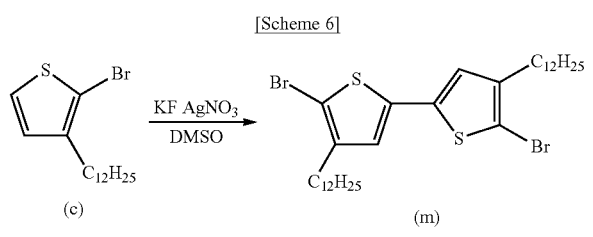

2 g (6.06 mmol) of compound (c), 0.023 g (0.06 mmol) of $PdCl_2$ $(PhCN)_2$ and 0.704 g (12.12 mmol) of KF were dissolved in 40 ml of DMSO in a nitrogen atmosphere. 2.059 g (12.12 mmol) of $AgNO_3$ was added to the resulting mixture, and refluxed at a constant temperature of 60° C. for 3 hours. Then, the resulting reaction mixture was cooled to room temperature, and 2.059 g (12.12 mmol) of $AgNO_3$ and 0.704 g (12.12 mmol) of KF were added to the reaction mixture, and refluxed at a constant temperature of 60° C. for 3 hours. Subsequently, the reaction mixture was filtered with a Celite pad, and the filtrate was recrystallized from MC to obtain compound (m) (yield: 75%).

$^1$H NMR (400 MHz, $CDCl_3$, [ppm]): δ 6.77 (s, 2H), 2.51 (t, 4H), 1.57 (m, 4H), 1.28 (br, 36H), 0.88 (t, 6H)

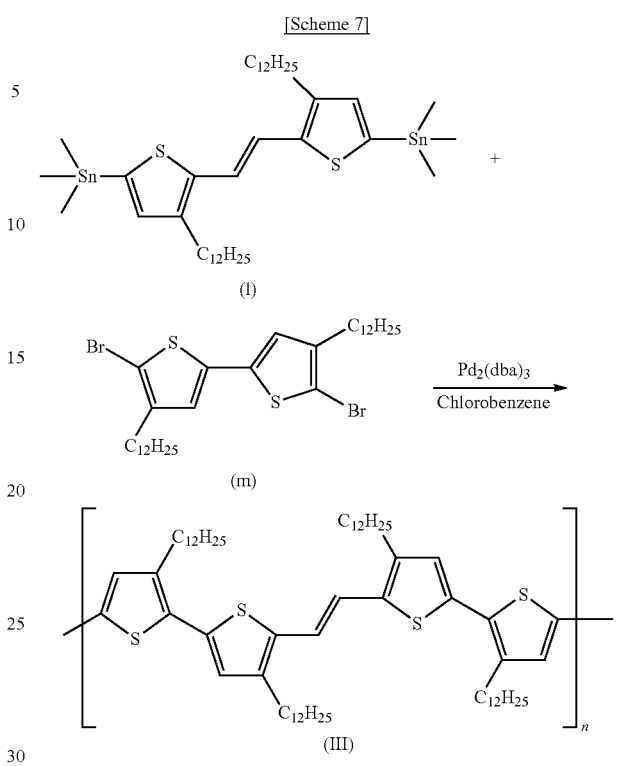

0.428 g (0.5 mmol) of compound (I) and 0.329 g (0.5 mmol) of compound (m) were dissolved in chrolobenzene in a nitrogen atmosphere. 0.009 g (0.01 mmol) of $Pd_2(dba)_3$ and 0.024 g (0.08 mmol) of $P(o-tolyl)_3$ were added to the resulting mixture, and refluxed at a constant temperature of 120° C. for 48 hours. Then, 1 ml of bromobenzene was added, and kept for 1 hour. Also, 1 ml of 2-(tributyl stannyl)-thiophene was added and refluxed for 1 hour. Subsequently, the resulting reaction mixture was cooled to room temperature, and precipitated from a solution in which 150 ml of MeOH was mixed with 30 ml of HCl. The precipitate was filtered with a filter to obtain the desired polymer (III) (yield: 45%). A molecular weight (Mn) of the desired polymer (III) was 24866, and its polydispersity index was 2.14.

$^1$H NMR (400 MHz, $CDCl_3$, [ppm]): δ 6.99-6.96 (br, 4H), 6.90 (s, 2H), 2.78-2.67 (br, 8H), 1.67-1.37 (br, 80H), 0.87 (br, 12H)

Synthetic Example 4

Synthesis of Polymer (IV)

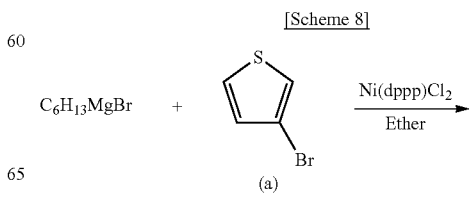

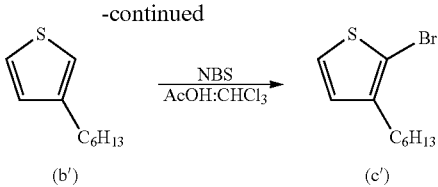

2.315 g (4.27 mmol) of Ni(dppp)Cl$_2$ was added to 150 ml of ether in a nitrogen atmosphere, and 20 ml (213.44 mmol) of compound (a) was then added, and refluxed for 5 minutes. The resulting mixture was cooled to 0° C., and 128.065 ml (256.13 mmol) of 2M hexylmagnesium bromide was slowly added to the mixture. Then, the resulting mixture was refluxed for 24 hours to obtain compound (b') (yield: 95%).

5.2326 g (31.09 mmol) of compound (b) was dissolved in a mixture solution in which 150 ml of CF was mixed with acetic acid in a ratio of 50:50, and cooled to 0° C. Then, 5.534 g (31.09 mmol) of NBS dissolved in 30 ml of DMF was slowly injected to the resulting mixture, and stirred for 3 hours. Then, the reaction was to quenched in a KOH solution to obtain compound (c') (yield: 95%).

was added and refluxed for 1 hour. Subsequently, the resulting mixture was cooled again to 0° C., and 3.865 g (19.69 mmol) of compound (j') and 2.389 ml (29.54 mmol) of pyridine were added, and refluxed for 24 hours. Then, the reaction was quenched by adding 30 ml of ice water to the resulting reaction mixture. The reaction mixture was then recrystallized from IPA to obtain compound (k') (yield: 70%).

1.185 g (3.29 mmol) of compound (k') was dissolved in 40 ml of anhydrous THF in a nitrogen atmosphere, and then cooled to −78° C. 2.896 ml of 2M butyl lithium was added, and stirred for 30 minutes. Then, the resulting mixture was warmed to room temperature, and stirred for 1 hour at room temperature. The mixture was cooled again to −78° C., and 8 ml (8 mmol) of 1M trimethyltin chloride was added and stirred for 10 minutes. Subsequently, the resulting mixture was warmed to room temperature, and recrystallized from IPA to obtain compound (l') (yield: 90%).

$^1$H NMR (400 MHz, CDCl$_3$, [ppm]): δ 7.00 (s, 2H), 6.92 (s, 2H), 2.65 (t, 4H), 1.61 (m, 3H), 1.35 (br, 13H), 0.90 (t, 6H), 0.36 (s, 18H)

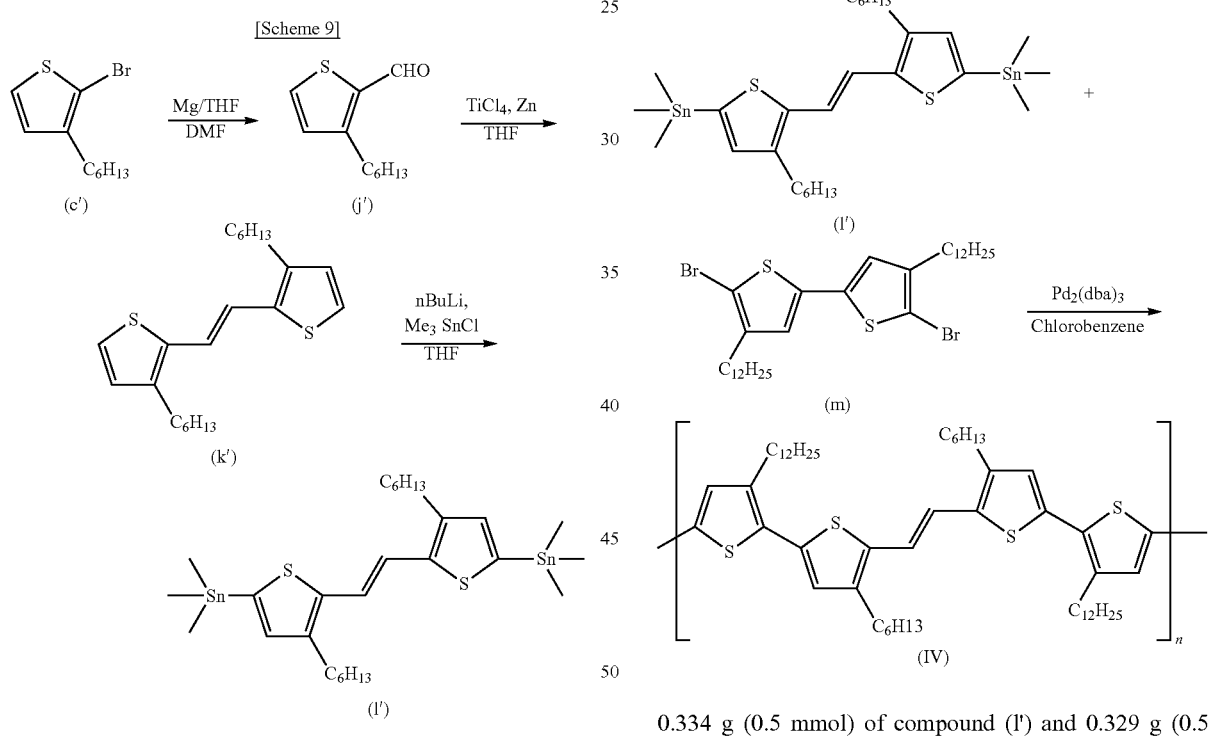

0.608 g (25.01 mmol) of Mg was added to 100 ml of anhydrous THF and stirred in a nitrogen atmosphere. 5.077 g (20.54 mmol) of compound (c') was added and refluxed for 2 hours. Then, the resulting mixture was cooled to room temperature, and 3.28 ml (40 mmol) of DMF was slowly added to the mixture, and refluxed for 24 hours. Subsequently, the resulting reaction mixture was cooled to room temperature, and the reaction was quenched by adding 20 ml of 1M HCl to the mixture. The reaction mixture was purified on a silica column having hexane and ethyl acetate as a mobile phase to obtain compound (j') (yield: 85%).

3.768 ml (34.25 mmol) of TiCl$_4$ was injected in a nitrogen atmosphere into 100 ml of anhydrous THF cooled to 0° C., and stirred for 30 minutes. Then, 4.479 g (68.5 mmol) of Zn 0.334 g (0.5 mmol) of compound (l') and 0.329 g (0.5 mmol) of compound (m) were dissolved in chrolobenzene in a nitrogen atmosphere. 0.009 g (0.01 mmol) of Pd$_2$(dba)$_3$ and 0.024 g (0.08 mmol) of P(o-tolyl)$_3$ were added, and refluxed at a constant temperature of 120° C. for 48 hours. Then, 1 ml of bromobenzene was added, and kept for 1 hour, and 1 ml of 2-(tributyl stannyl)-thiophene was added, and refluxed for 1 hour. Subsequently, the resulting mixture was cooled to room temperature, and precipitated from a solution in which 150 ml of MeOH was mixed with 30 ml of HCl. Then, the precipitate was filtered with a filter to obtain the desired polymer (IV) (yield: 45%). A molecular weight (Mn) of the desired polymer (IV) was 14728, and its polydispersity index was 1.69.

$^1$H NMR (400 MHz, CDCl$_3$, [ppm]): δ 6.99-6.96 (br, 4H), 6.90 (s, 2H), 2.78-2.67 (br, 8H), 1.65-1.35 (br, 56H), 0.87 (br, 12H)

Synthetic Example 5

Synthesis of Polymer (V)

[Scheme 11]

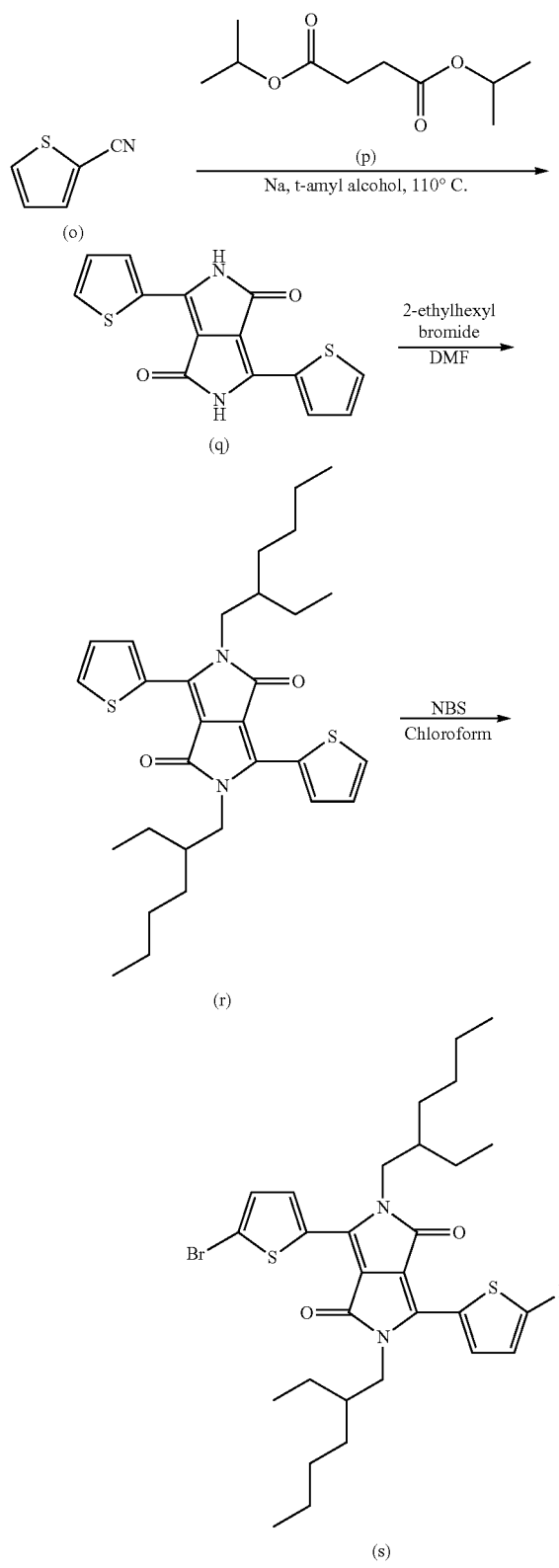

50 ml of t-amyl alcohol (2-methyl-2-butanol) was put into a flask filled with nitrogen (N), and 115 mmol of sodium (Na) was added to the flask. After 10 minutes, 9.8235 g (90 mmol) of compound (o) was added, and warmed to 110° C. 8.09 g (40 mmol) of compound (p) dissolved in 20 ml of t-amyl alcohol was added by drops for 1 hour, and reacted at 110° C. Then, the resulting mixture was reacted for 24 hours, and cooled to 65° C. 100 ml of MeOH and 10 ml of acetic acid were then added in order, and neutralized under reflux for 20 minutes. The resulting suspension was filtered, and washed twice with hot MeOH and water, washed once more with MeOH, and then dried at 70° C. under vacuum to obtain compound (q) (yield: 67%).

A 2-neck flask was filled with N, and 5.9 g (19.64 mmol) of compound (q) and 11.0564 g (80 mmol) of anhydrous $K_2CO_3$ were dissolved in 110 ml of DMF and boiled to 120° C. Then, 52 g (70 mmol) of 2-ethylhexyl bromide was added by drops to the resulting mixture, and the mixture was reaction at 130° C. to 140° C. for 24 hours, and cooled to room temperature. The resulting reaction mixture was poured into ice water, and precipitated. The precipitate was washed several times with water, washed with MeOH, and dried under vacuum. Subsequently, the reaction mixture was purified on a silica column having CF as a mobile phase to obtain compound (r) (yield: 40%).

1.821 g (3.47 mmol) of compound (r) was dissolved in 70 ml of CF, and put into a flask filled with N. Then, 7.1135 mmol of N-bromosuccinimide (NBS) was added to the flask, and stirred at room temperature in a dark room. After the 40-minute stirring, the reaction mixture was poured into 150 ml of methanol, and precipitated. The precipitate was washed with hot methanol, and dried under vacuum to obtain compound (s) (yield: 87%).

[Scheme 12]

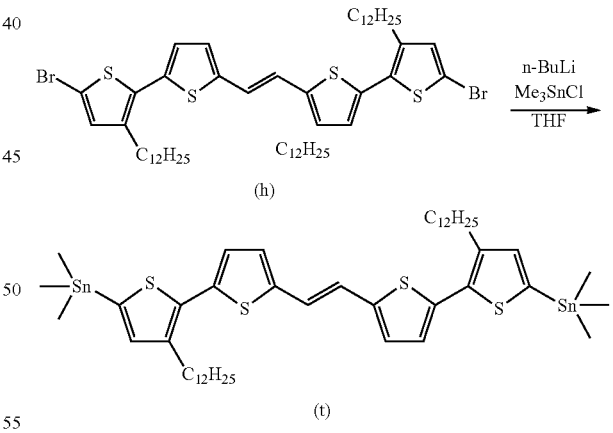

0.928 g (1.09 mmol) of compound (h) and 30 ml of THF were put into a N-filled flask, and maintained at −50° C. 2.2 mmol of butyl lithium was slowly injected to the resulting mixture, and 2.5 mmol of 1M trimethyltin chloride was also injected. The resulting mixture was warmed to −40° C., kept for 20 minutes, and then reacted at room temperature for 2 hours. The resulting reaction mixture was poured into water, and worked up with ether. Then, the solvent was removed, and the reaction mixture was precipitated from EtOH to obtain compound (t) (yield: 7.17%).

[Scheme 13]

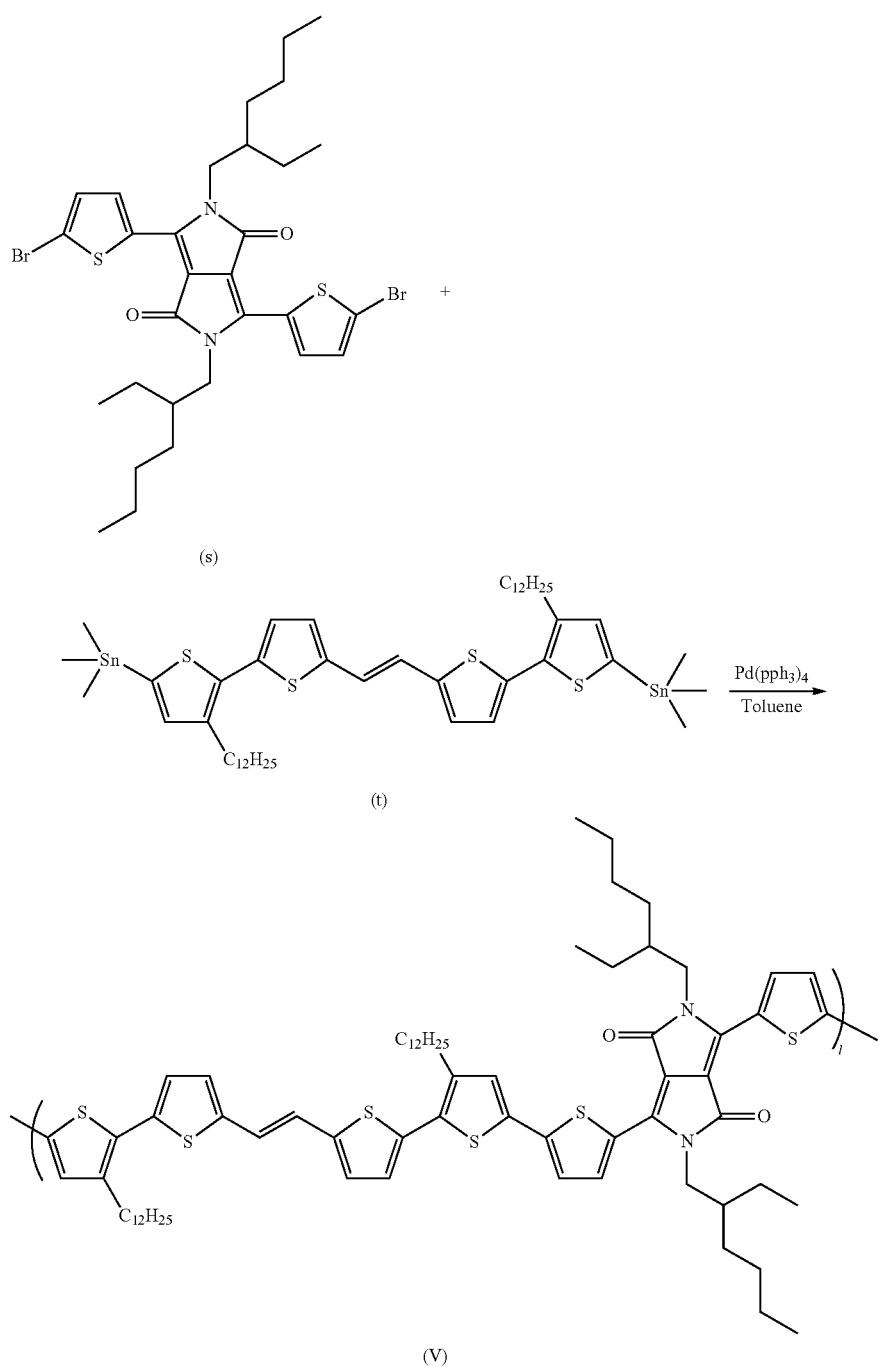

0.8252 g (0.81 mmol) of compound (t) was put into a N-filled flask, and 20 ml of degased toluene and 0.5529 g (0.81 mmol) of compound (s) were added. 0.0462 g of Pd(pph$_3$)$_4$ was added to the resulting mixture, and reacted at 110° C. for 48 hours. 2 ml of an end-capper, bromobenzene, was added, and further reacted for 12 hours. Then, the resulting reaction mixture was cooled to room temperature, poured into 200 ml of MeOH, and precipitated. 50 ml of HCl was added, and stirred. Then, the resulting mixture was filtered. The filtrate was extracted by Soxhlet extraction using MeOH, hexane, CHCl$_3$ and chrolobenzene, precipitated, and dried to obtain the desired polymer (V) (yield: 40%). A molecular weight (Mn) of the desired polymer (V) was 8319, and its polydispersity index was 1.56.

$^1$H NMR (400 MHz, CDCl$_3$, [ppm]): δ 8.93 (br, 2H), 7.16-7.14 (br, 8H), 7.05 (br, 2H), 6.98-6.92 (br, 2H), 4.04 (br, 4H), 2.76 (br, 4H), 2.03-1.92 (br, 2H), 1.66-0.86 (br, 72H)

Analysis Example 1

Analysis of Thermal Properties of Polymer

Polymer (I) prepared in Synthetic Example 1 was analyzed using a thermogravimetric analyzer and a differential scanning calorimeter (DSC).

Figure 5:
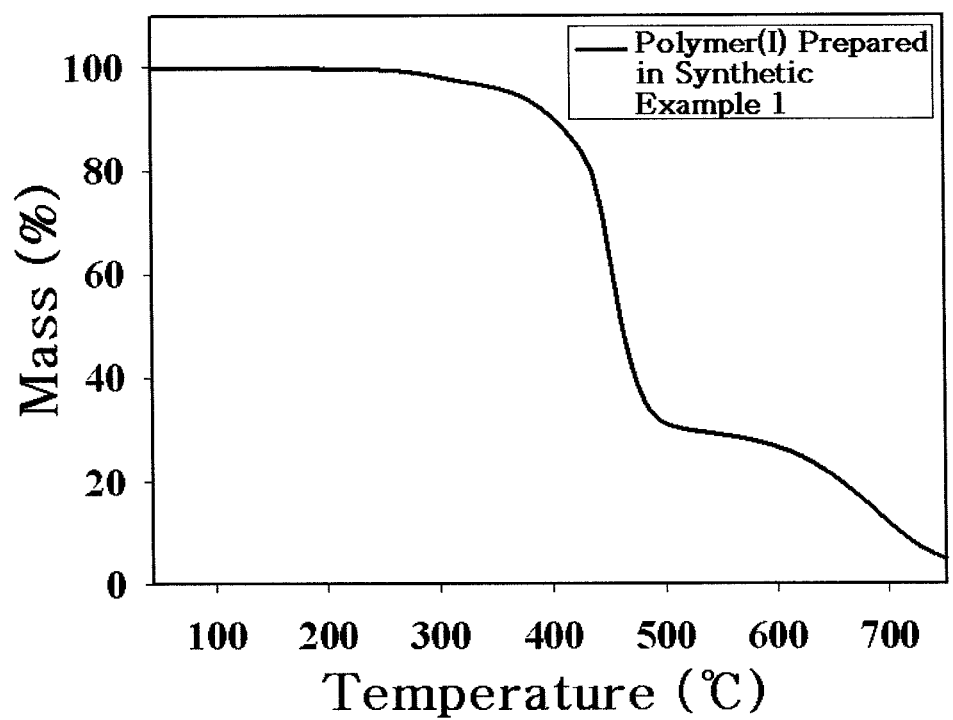
FIG. 5 is a graph showing the thermogravimetric analysis results of polymer (I) prepared in Synthetic Example 1.

FIG. 5 is a graph showing the thermogravimetric analysis results of polymer (I) prepared in Synthetic Example 1.

Referring to FIG. 5, a primary weight loss (5% by weight) of polymer (I) was observed at 367° C., its secondary weight loss (approximately 65% by weight) was measured at about 450° C., and its tertiary weight loss (approximately 10% by weight) was measured at about 700° C.

Therefore, it was revealed that the polymer according to one embodiment of the present invention, for example, polymer (I) prepared in Synthetic Example 1 has excellent thermal stability since the primary weight loss was observed over 300° C. That is, since a device manufacturing process using an organic compound is generally performed at a temperature of 150° C. or less, the polymer according to one embodiment of the present invention may not suffer thermal damage even in the device manufacturing process.

Figure 6:
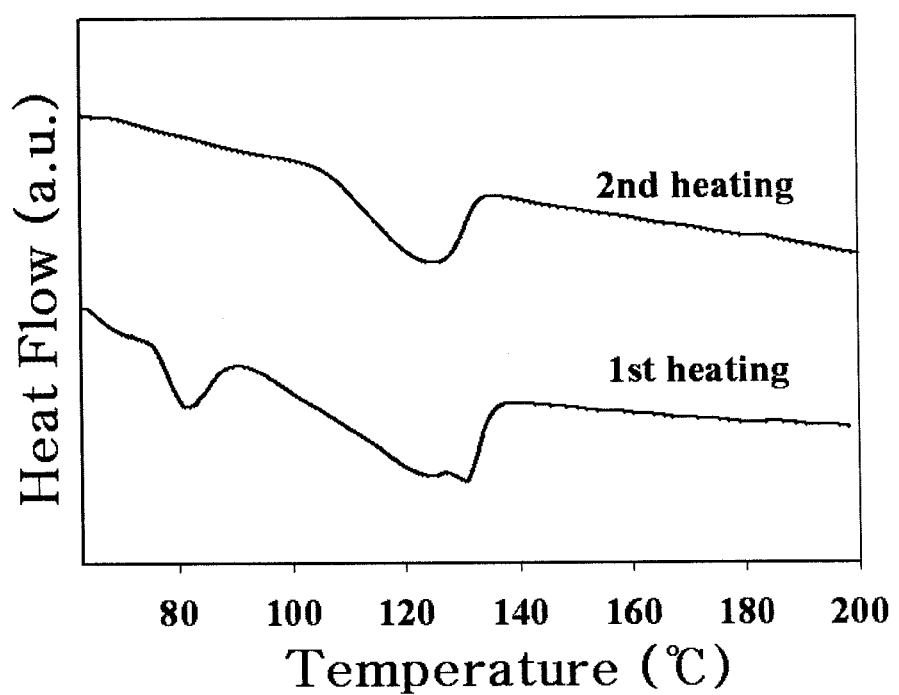
FIG. 6 is a graph showing the differential scanning calorimetry results of polymer (I) prepared in Synthetic Example 1.

FIG. 6 is a graph showing the differential scanning calorimetry results of polymer (I) prepared in Synthetic Example 1.

Referring to FIG. 6, the differential scanning calorimetry results show that polymer (I) has phase transition points at 80° C. and 130° C., respectively. Therefore, it was seen that polymer (I) is in a solid state below 80° C., in a liquid-crystal state between 80° C. and 130° C., and in an anisotropic liquid state above 130° C. In sum, it was indirectly revealed that polymer (I) may have a structure in which molecules are fluid like a liquid and regularly arranged due to the crystallinity, that is, a mesomorphic phase between a solid crystal and an isotropic liquid by observing two phase transition temperatures through the differential scanning calorimetry.

Analysis Example 2

Analysis of Optical Properties of Polymer

Optical Properties of Polymer (I)

Polymer (I) prepared in Synthetic Example 1 was dissolved in a chrolobenzene solvent to prepare 0.5% by weight of a solution. A coating film was formed by spin-coating a glass substrate with the solution, and heat-treated at 110° C. for 10 minutes. Polymer (I) in the liquid state, immediately after the formation of the coating film and after the heat treatment, was measured for optical absorption properties using a UV-visible spectrophotometer.

Figure 7A:
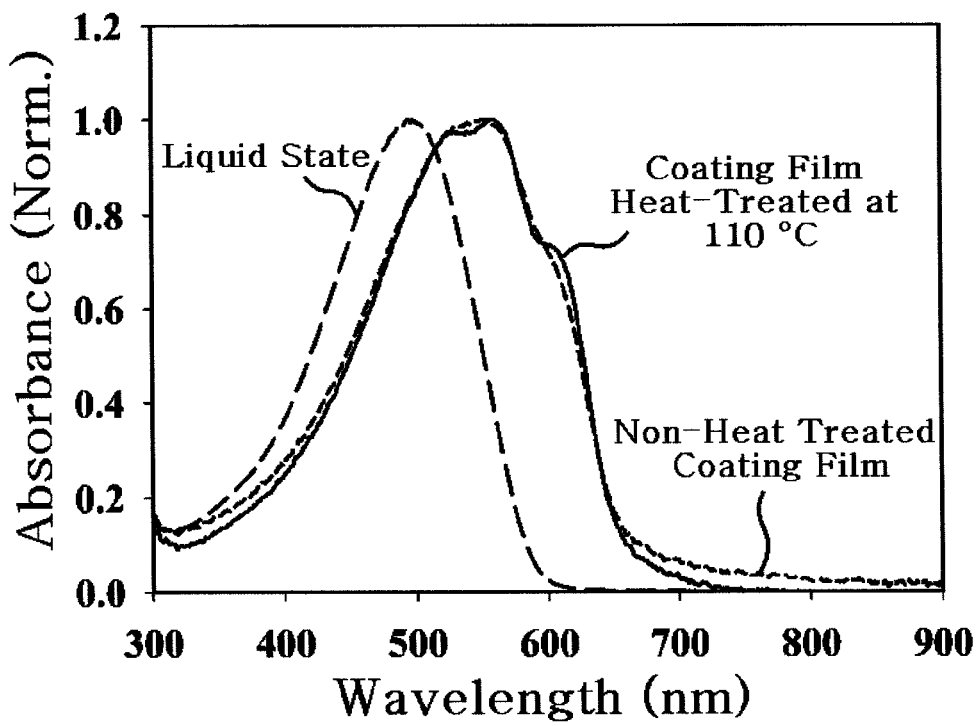
FIG. 7A is a graph showing the optical absorption properties of polymer (I) prepared in Synthetic Example 1.

FIG. 7A is a graph showing the optical absorption properties of polymer (I) prepared in Synthetic Example 1.

Referring to FIG. 7A, the maximum absorption wavelength of polymer (I) in a liquid state was observed at 495 nm, and the maximum absorption wavelength in the case of the non-heat treated coating film was observed at 552 nm. However, the maximum absorption wavelength in the case of the coating film heat-treated at 110° C. for 10 minutes was observed at 558 nm, and its vibronic splitting was also observed at 529 nm and 602 nm.

Meanwhile, as the polymer chains having crystallinity get closer to each other, their interchain interaction is generated with improved crystalline properties. Here, the interchain interaction causes the formation of new energy levels. As a result, a gap between the energy levels is reduced, thereby allowing the optical absorption wavelength to move to a low energy level (long wavelength).

Therefore, it was revealed that the coating film has improved crystallinity compared to the polymer in a liquid state from the fact that the maximum absorption wavelength moves to a long wavelength. Furthermore, it was revealed that the heat-treated coating film has further improved crystallinity from the fact that the maximum absorption wavelength moves to a long wavelength and the vibronic splitting is also observed.

Referring again to FIG. 7A, an absorption edge of the heat-treated coating film was 670 nm. When this absorption edge was calculated into a potential value, the potential was 1.85 eV, which corresponds to a band gap between HOMO and LUMO of polymer (I).

Optical Properties of Polymer (III)

Polymer (III) prepared in Synthetic Example 3 was dissolved in a chrolobenzene solvent to prepare 0.5% by weight of a solution. A coating film was formed by spin-coating a glass substrate with the solution, and heat-treated at 200° C. for 10 minutes. Polymer (III) in the liquid state, immediately after the formation of the coating film and after the heat treatment, was measured for optical absorption properties using a UV-visible spectrophotometer.

Figure 7B:
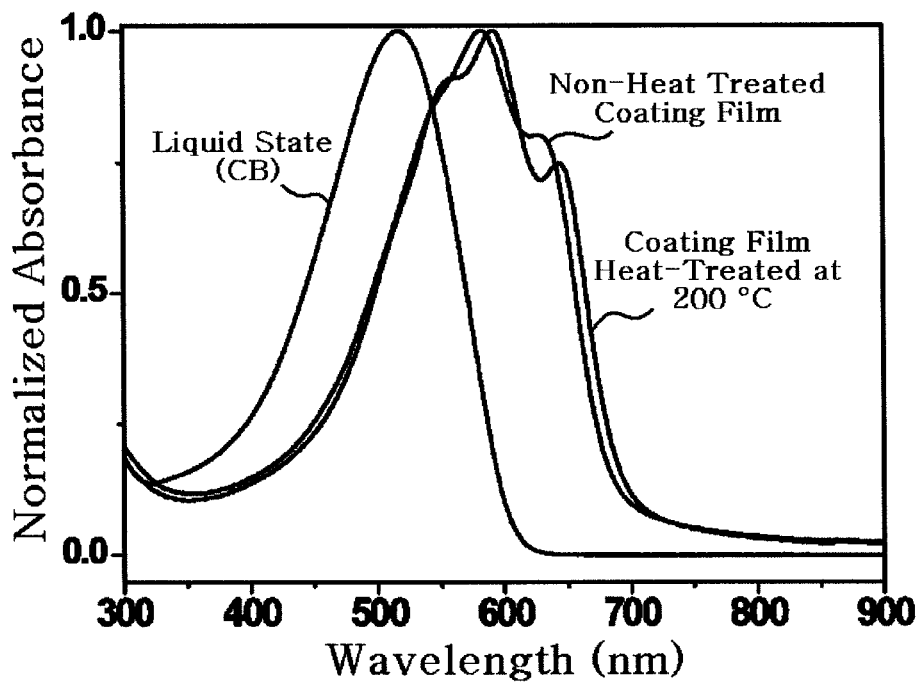
FIG. 7B is a graph showing the optical absorption properties of polymer (III) prepared in Synthetic Example 3.

FIG. 7B is a graph showing the optical absorption properties of polymer (III) prepared in Synthetic Example 3.

Referring to FIG. 7B, the maximum absorption wavelength of polymer (III) in a liquid state was observed at 515 nm, and the maximum absorption wavelength in the case of the non-heat treated coating film was observed at 584 nm. However, the maximum absorption wavelength in the case of the coating film heat-treated at 200° C. for 10 minutes was observed at 594 nm, and its vibronic splitting was also observed at 553 nm and 647 nm.

Meanwhile, as the polymer chains having crystallinity get closer to each other, their interchain interaction is generated with improved crystalline properties. Here, the interchain interaction causes the formation of new energy levels. As a result, a gap between the energy levels is reduced, thereby allowing the optical absorption wavelength to move to a low energy level (long wavelength).

Therefore, it was revealed that the coating film has improved crystallinity compared to the polymer in a liquid state from the fact that the maximum absorption wavelength moves to a long wavelength. Furthermore, it was revealed that the heat-treated coating film has further improved crystallinity from the fact that the maximum absorption wavelength moves to a long wavelength and the vibronic splitting is also observed.

Optical Properties of Polymer (IV)

Polymer (IV) prepared in Synthetic Example 4 was dissolved in a chrolobenzene solvent to prepare 0.5% by weight of a solution. A coating film was formed by spin-coating a glass substrate with the solution, and heat-treated at 200° C. for 10 minutes. Polymer (IV) in the liquid state, immediately after the formation of the coating film and after the heat treatment, was measured for optical absorption properties using a UV-visible spectrophotometer.

Figure 7C:
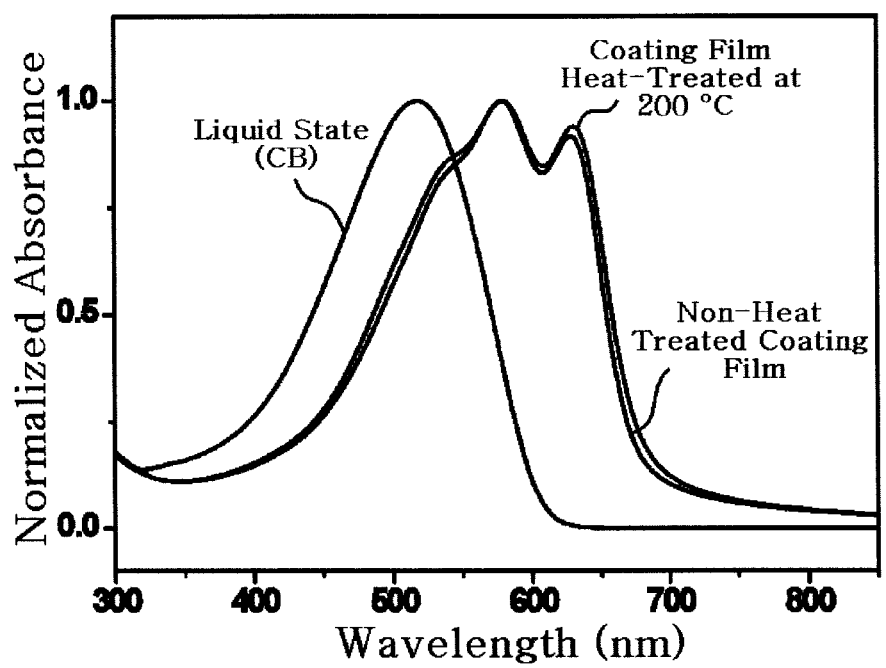
FIG. 7C is a graph showing the optical absorption properties of polymer (IV) prepared in Synthetic Example 4.

FIG. 7C is a graph showing the optical absorption properties of polymer (IV) prepared in Synthetic Example 4.

Referring to FIG. 7C, the maximum absorption wavelength of polymer (IV) in a liquid state was observed at 519 nm, the maximum absorption wavelengths in the case of the non-heat treated coating film and the coating film heat-treated at 200° C. for 10 minutes were observed at 579 nm, and the vibronic splitting was also observed at 539 nm and 630 nm.

Therefore, it was revealed that the coating film has improved crystallinity compared to the polymer in a liquid state from the fact that the maximum absorption wavelength moves to a long wavelength. Furthermore, it was revealed that the heat-treated coating film has further improved crystallinity from the fact that the maximum absorption wavelength moves to a long wavelength and the vibronic splitting is also observed.

Referring again to FIG. 7C, an absorption edge of the heat-treated coating film was 700 nm. When this absorption edge was calculated into a potential value, the potential was 1.77 eV, which corresponds to a band gap between HOMO and LUMO of polymer (I).

Optical Properties of Polymer (V)

Polymer (V) prepared in Synthetic Example 5 was dissolved in CF and DCB to form 0.5% by weight of solutions, respectively. Coating films were formed by spin-coating glass substrates with the solutions, and heat-treated. Polymer (V) in the liquid state, immediately after the formation of the coating film and after the heat treatment, were measured for optical absorption properties using a UV-visible spectrophotometer.

Figure 7D:
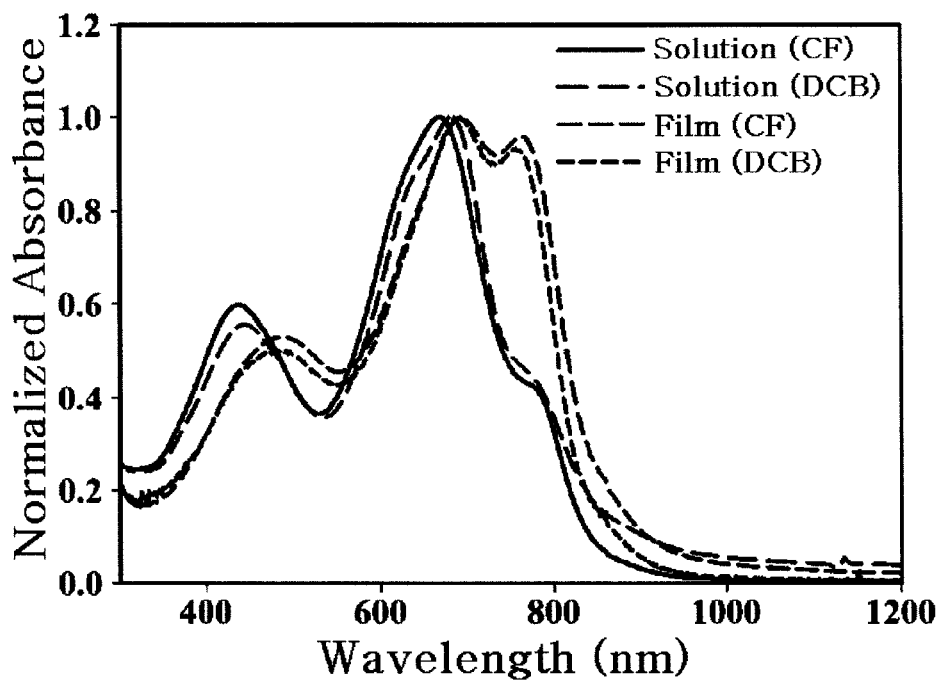
FIG. 7D is a graph showing the optical absorption properties of polymer (V) prepared in Synthetic Example 5, depending on solvents and the states of the polymer.

FIG. 7D is a graph showing the optical absorption properties of polymer (V) prepared in Synthetic Example 5, depending on solvents and the states of the polymer.

Referring to FIG. 7D, the difference in spectra was observed according to the kind of the solvent (CF, DCB). Also, the maximum absorption wavelength of the polymer in the film state moved to a long wavelength compared to the polymer in a liquid state, and its vibronic splitting was observed at 800 nm or more.

Figure 7E:
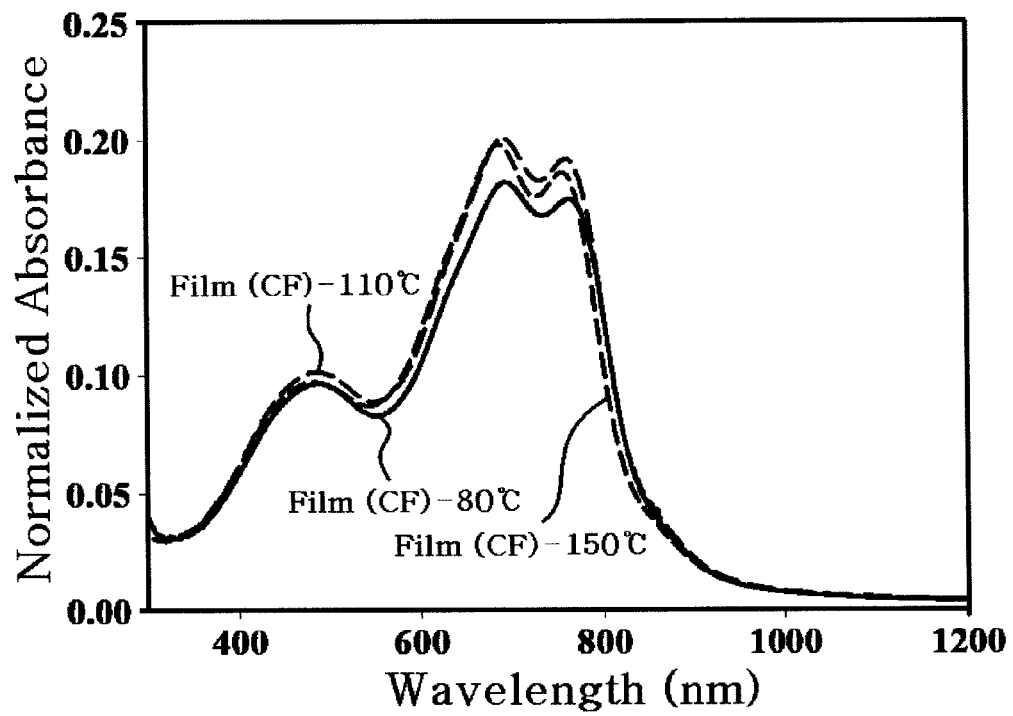
FIG. 7E is a graph showing the optical absorption properties of polymer (V) prepared in Synthetic Example 5, depending on the change in heat treatment temperature.

FIG. 7E is a graph showing the optical absorption properties of polymer (V) prepared in Synthetic Example 5, depending on the change in heat treatment temperature.

Referring to FIG. 7E, when CF was used as the solvent and the coating film was heat-treated at different temperatures of 80° C., 110° C. and 150° C. for 10 minutes, it was seen that a level of the optical absorbance was enhanced with an increase in the heat treatment temperature.

Figure 7F:
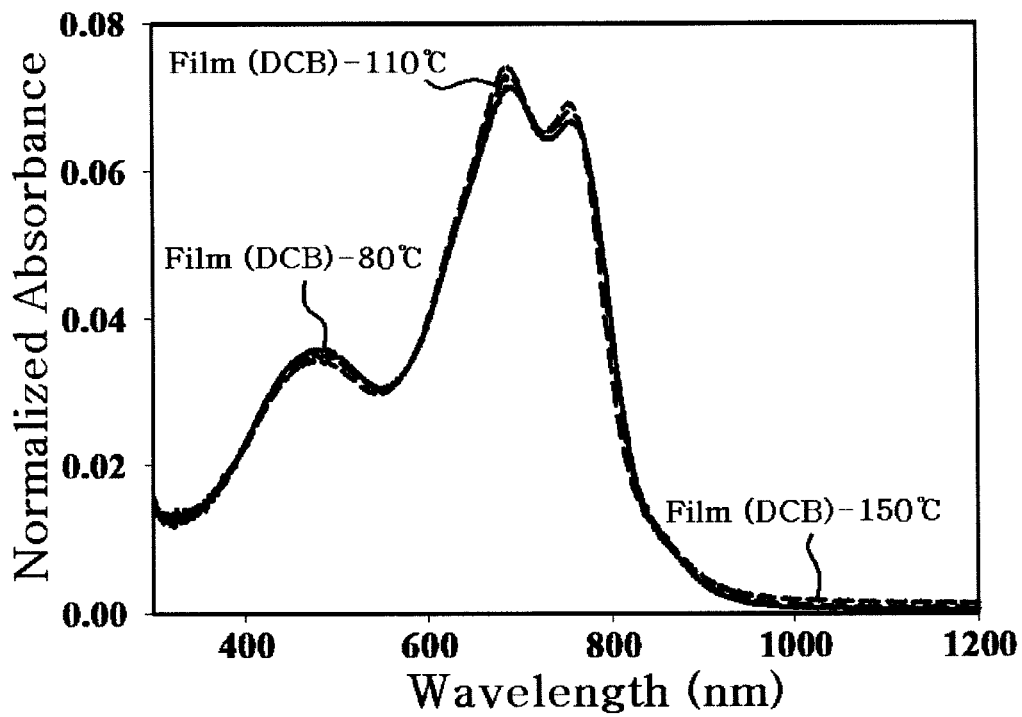
FIG. 7F is a graph showing the optical absorption properties of polymer (V) prepared in Synthetic Example 5, depending on the change in heat treatment temperature.

FIG. 7F is a graph showing the optical absorption properties of polymer (V) prepared in Synthetic Example 5, depending on the change in heat treatment temperature.

Referring to FIG. 7F, when DCB was used as the solvent and the coating film was heat-treated at different temperatures of 80° C., 110° C. and 150° C. for 10 minutes, it was seen that a level of the optical absorbance was enhanced with an increase in the heat treatment temperature.

Comparison of Optical Properties of Polymers

The maximum absorption wavelengths of polymers (I, III, IV and V) prepared in Synthetic Examples 1, 3, 4 and 5 are listed in the following Table 1.

TABLE 1

| Synthetic Examples | Solvents | Heat Treatment Conditions | Maximum Absorption Wavelength |
|---|---|---|---|
| Synthetic Example 1 | Chrolobenzene | @ 110□, 10 min | 558 nm |
| Synthetic Example 3 | Chrolobenzene | @ 200□, 10 min | 594 nm |
| Synthetic Example 4 | Chrolobenzene | @ 200□, 10 min | 579 nm |
| Synthetic Example 5 | Chloroform | @ 150□, 10 min | 690 nm |
| | Dichrolobenzene | @ 150□, 10 min | 686 nm |

As listed in Table 1, it was revealed that the maximum absorption wavelengths of polymers (III, IV and V) prepared in Synthetic Examples 3, 4 and 5 become longer than that of polymer (I) prepared in Synthetic Example 1. In particular, it was seen that the maximum absorption wavelength of polymer (V) prepared in Synthetic Example 5 become noticeably longer than those of the other polymers. This is considered to be an effect caused by a decrease in the band gap of polymer (V) prepared in Synthetic Example 5.

Analysis Example 3

Electrochemical Properties of Polymers

Polymers (I and IV) prepared in Synthetic Examples 1 and 4 were dissolved in a chrolobenzene solvent to prepare 0.5% by weight of solutions, and ITO substrates as a working electrode were spin-coated with the solutions, respectively. Tetrabutylammonium perchlorate ($Bu_4NClO_4$) was dissolved in a concentration of 0.1 M in acetonitrile, and used as an electrolyte, and a Pt electrode and an Ag electrode were used respectively as a counter electrode and a reference electrode to form a 3-electrode cell. Then, the 3-electrode cell was used to measure the cyclic voltammetry properties.

Figure 8A:
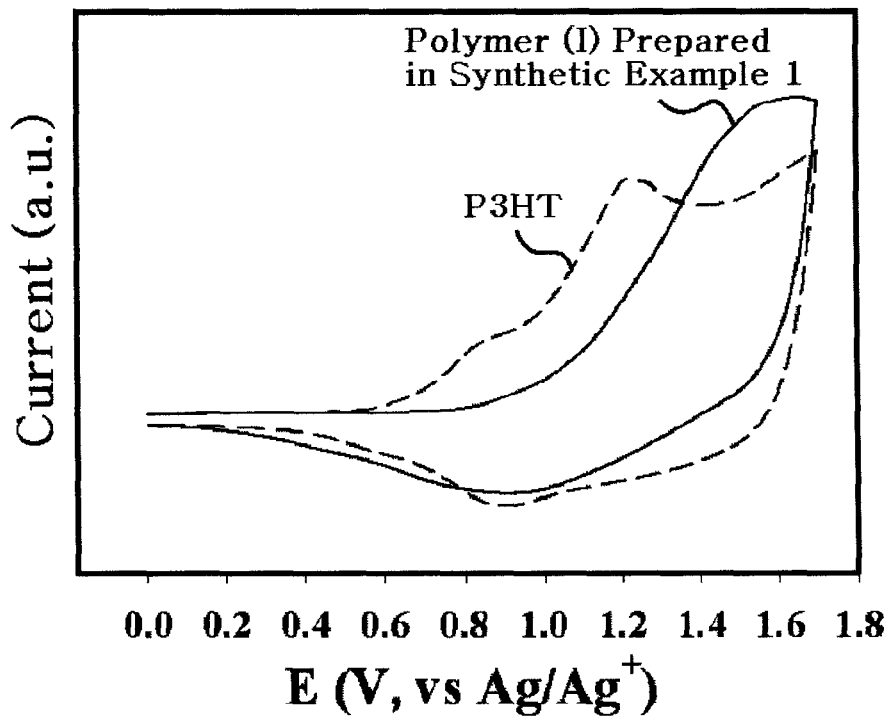
FIG. 8A is a graph showing the cyclic voltammetry properties of polymer (I) prepared in Synthetic Example 1.

FIG. 8A is a graph showing the cyclic voltammetry properties of polymer (I) prepared in Synthetic Example 1.

Referring to FIG. 8A, an onset potential at which the oxidation of P3HT starts was 0.5 V, and an onset potential at which the oxidation of polymer (I) starts was 0.8 V. Therefore, it was seen that the difference between HOMO values of the P3HT and polymer (I) was 0.3 eV since the difference between the onset potentials of the P3HT and the polymer was 0.3 V. Meanwhile, considering that a HOMO value of the P3HT is 4.9 eV, it was anticipated that a HOMO value of polymer (I) would be 5.2 eV, which is higher by 0.3 eV than the P3HT. Therefore, it was revealed that polymer (I) has relatively high oxidative stability.

Also, considering that the band gap between HOMO and LUMO calculated as shown in FIG. 7A was 1.85 eV, it was seen that a LUMO energy level of polymer (I) is 3.35 eV.

Figure 8B:
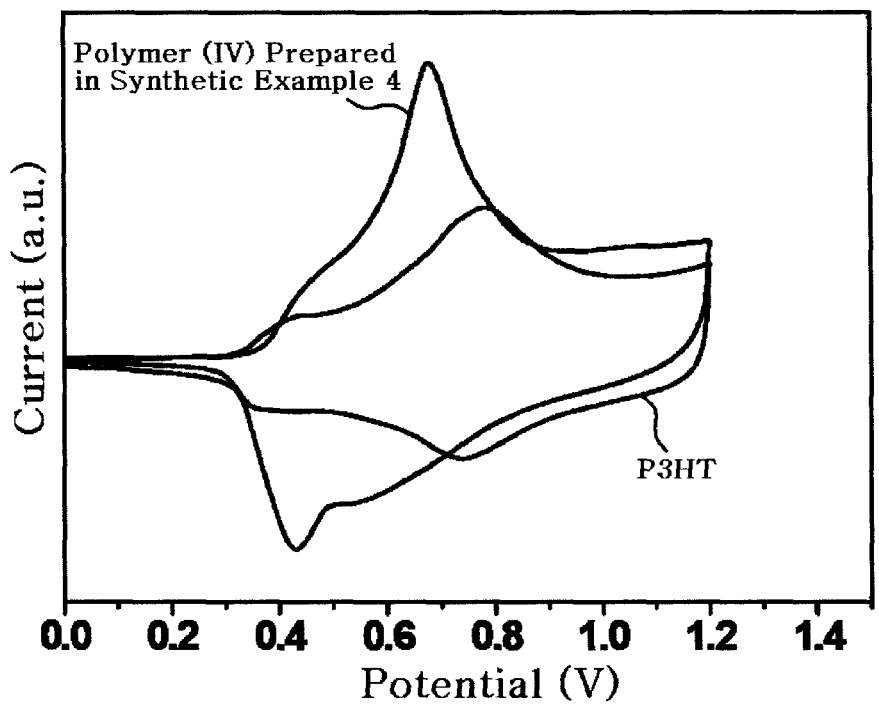
FIG. 8B is a graph showing the cyclic voltammetry properties of polymer (IV) prepared in Synthetic Example 4.

FIG. 8B is a graph showing the cyclic voltammetry properties of polymer (IV) prepared in Synthetic Example 4.

Referring to FIG. 8B, an onset potential at which the oxidation of P3HT starts was 0.33 V, and an onset potential at which the oxidation of polymer (IV) starts was 0.37 V. Therefore, it was seen that the difference between HOMO values of the P3HT and polymer (IV) was 0.04 eV since the difference between the onset potentials of the P3HT and the polymer was 0.04 V. Meanwhile, considering that a HOMO value of the P3HT is 4.9 eV, it was anticipated that a HOMO value of polymer (IV) is 4.94 eV, which is higher by 0.04 eV than the P3HT. Therefore, it was revealed that polymer (IV) has higher oxidative stability than the P3HT.

Also, considering that a band gap between HOMO and LUMO calculated as shown in FIG. 7C was 1.77 eV, it was seen that a LUMO energy level of polymer (IV) is 3.17 eV.

Analysis Example 4

Crystal Analysis of Polymer-Containing Film

Polymer (I) prepared in Synthetic Example 1 was dissolved in a chrolobenzene solvent to prepare 0.5% by weight of a solution. Then, a silicon wafer was spin-coated with the solution to prepare a coating film. The coating film was heat-treated at 110° C. for 10 minutes. The coated film was measured for x-ray diffraction (XRD).

Figure 9:
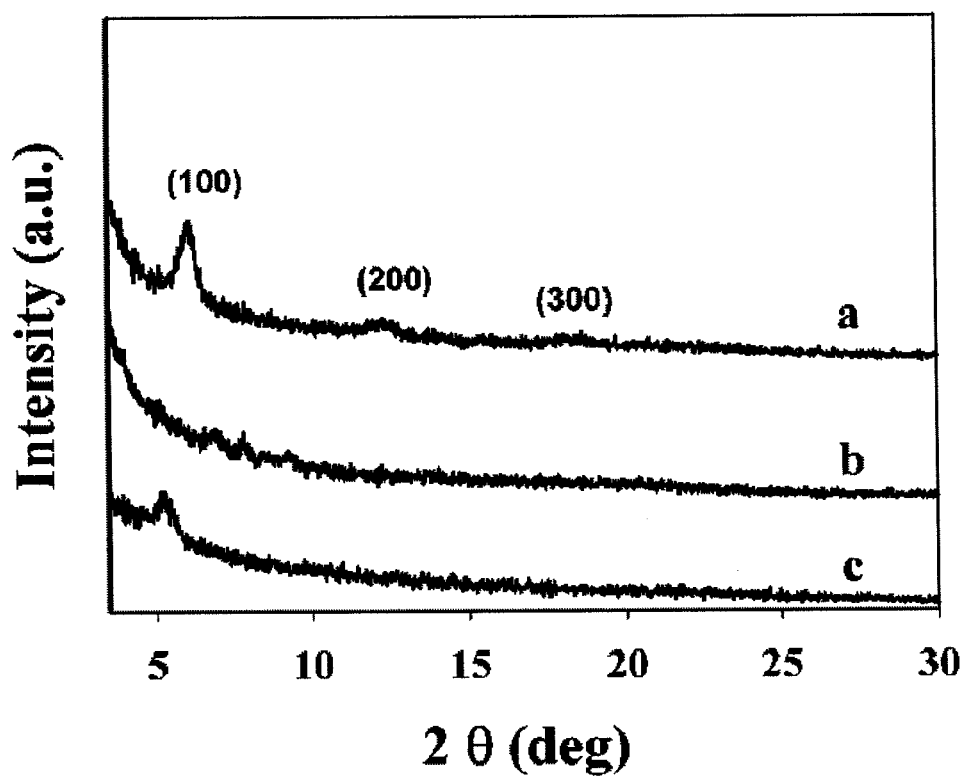
FIG. 9 is a graph showing the x-ray diffraction (XRD) analysis results of a coating film including polymer (I) prepared in Synthetic Example 1.

FIG. 9 is a graph showing the XRD analysis results of a coating film including polymer (I) prepared in Synthetic Example 1.

Referring to FIG. 9, diffraction peaks of (100), (200) and (300) were observed in case (a) in which the coating film containing polymer (I) prepared in Synthetic Example 1 was subjected to the heat treatment, compared to case (b) in which the coating film containing polymer (I) was not subjected to the heat treatment, which indicates that the polymer (I)-containing coating film has a larger number of the diffraction peaks than coating film (c) containing P3HT. Therefore, it was revealed that the polymer (I)-containing coating film has more improved crystallinity than the P3HT-containing coating film in case (a) in which the polymer (I)-containing coating film was subjected to the heat treatment.

In addition, it was seen that an intermolecular distance of the polymer (I)-containing coating film was 14.52 Å in case (a) in which the polymer (I)-containing coating film is subjected to the heat treatment.

Analysis Example 5

Surface Analysis of Polymer-Containing Film

Surface Analysis of Film Containing Polymer (I)

Polymer (I) prepared in Synthetic Example 1 was dissolved in a chrolobenzene solvent to prepare 0.5% by weight of a solution, and a coating film was prepared by spin-coating a glass substrate with the solution. Then, the coating film was heat-treated, and the surface of the coated film was then analyzed using an atomic force microscope (AFM).

Figure 10A:
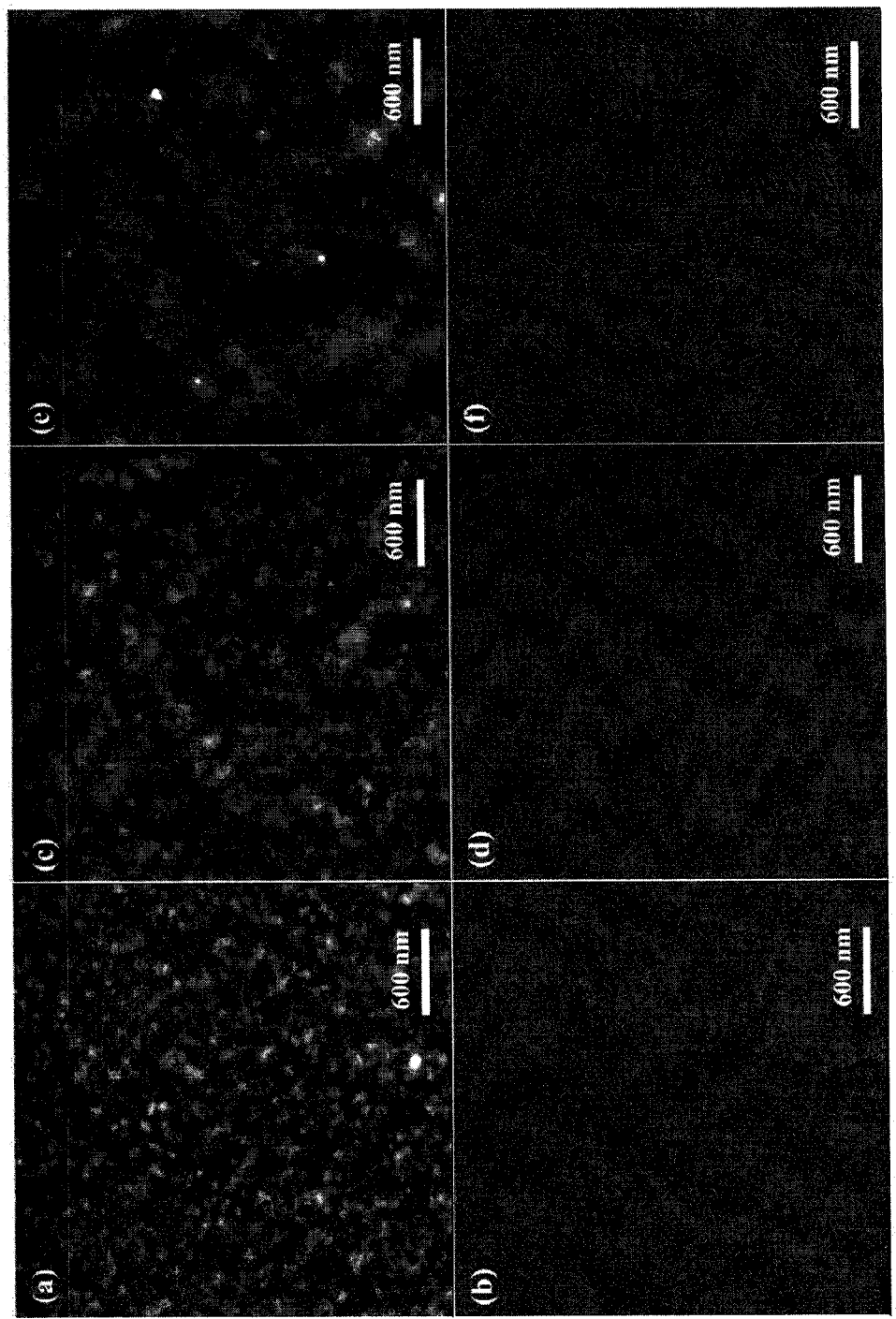
FIG. 10A shows atomic force microscope (AFM) images of a coating film including polymer (I) prepared in Synthetic Example 1.

FIG. 10A shows AFM images of a coating film including polymer (I) prepared in Synthetic Example 1. In FIG. 10A, (a), (c) and (e) show topology images, and (b), (d) and (f) show phase contrast images. Also, (a) and (b) show images of the non-heat treated coating film, (c) and (d) show images of the coating film heated at 80° C. for 10 minutes, and (e) and (f) show images of the coating film heated at 110° C. for 10 minutes.

Referring to FIG. 10A, no crystals were observed when the coating film was not subjected to the heat treatment and when the coating film was heat-treated at 80° C. for 10 minutes ((b) and (d)). However, the crystals were observed when the coating film was heat-treated at 110° C. for 10 minutes ((f)). Meanwhile, it was seen that the surface of the film became smooth as the coating film was subjected to the heat treatment ((a) and (c)), and the surface of the film became smoother with an increase in the heat treatment temperature ((c) and (e)).

Surface Analysis of Film Containing Polymer (III)

Polymer (III) prepared in Synthetic Example 3 was dissolved in a chrolobenzene solvent to prepare 10 mg/ml of a solution, and a coating film was prepared by spin-coating a glass substrate with the solution. Then, the coating film was heat-treated, and the surface of the coated film was then analyzed using an AFM.

Figure 10B:
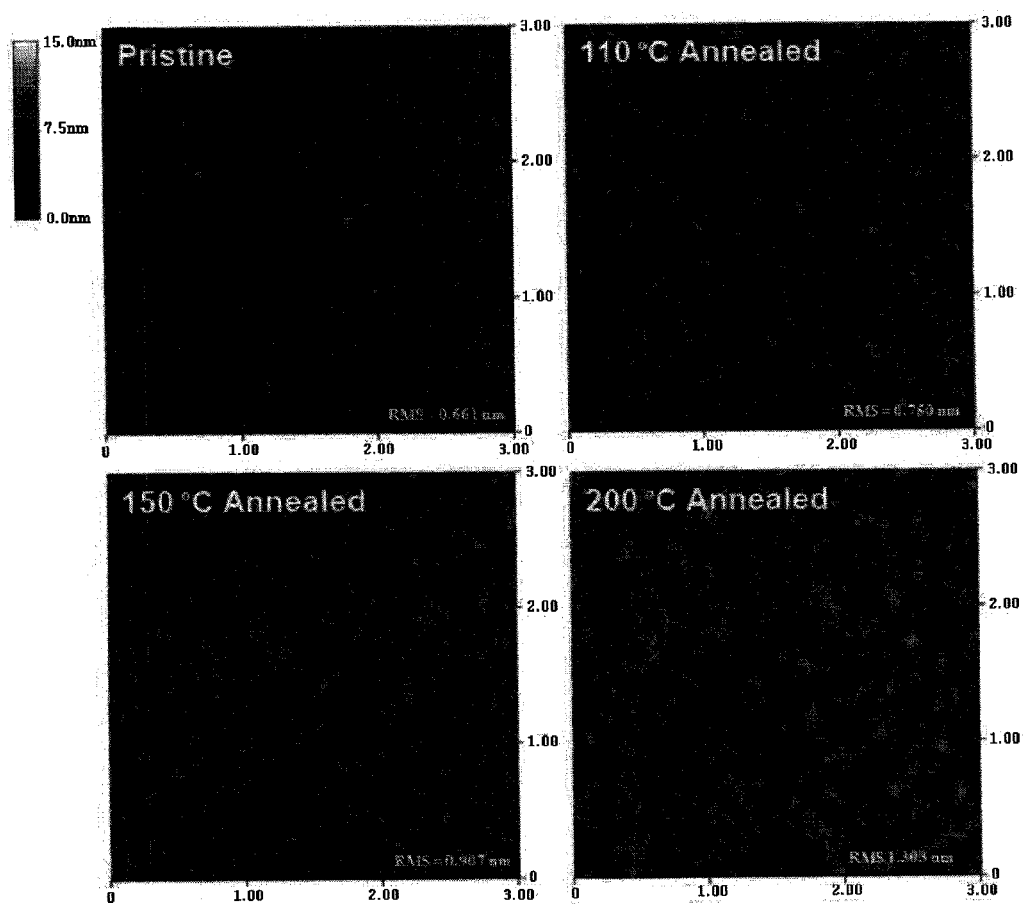
FIG. 10B shows AFM images (i.e. topology images) of a coating film including polymer (III) prepared in Synthetic Example 3.

FIG. 10B shows AFM images (i.e. topology images) of a coating film including polymer (III) prepared in Synthetic Example 3.

Referring to FIG. 10B, no crystals were observed when the coating film was not subjected to the heat treatment (pristine). However, the changes in morphology of the coating film were observed when the coating film was heat-treated at 110° C. for 10 minutes and heat-treated at 150° C. for 10 minutes, and the crystals were observed when the coating film was heat-treated at 200° C. for 10 minutes.

Surface Analysis of Film Containing Polymer (IV)

Polymer (IV) prepared in Synthetic Example 4 was dissolved in a chrolobenzene solvent to prepare 10 mg/ml of a solution, and a coating film was prepared by spin-coating a glass substrate with the solution. Then, the coating film was heat-treated, and the surface of the coated film was then analyzed using an AFM.

Figure 10C:
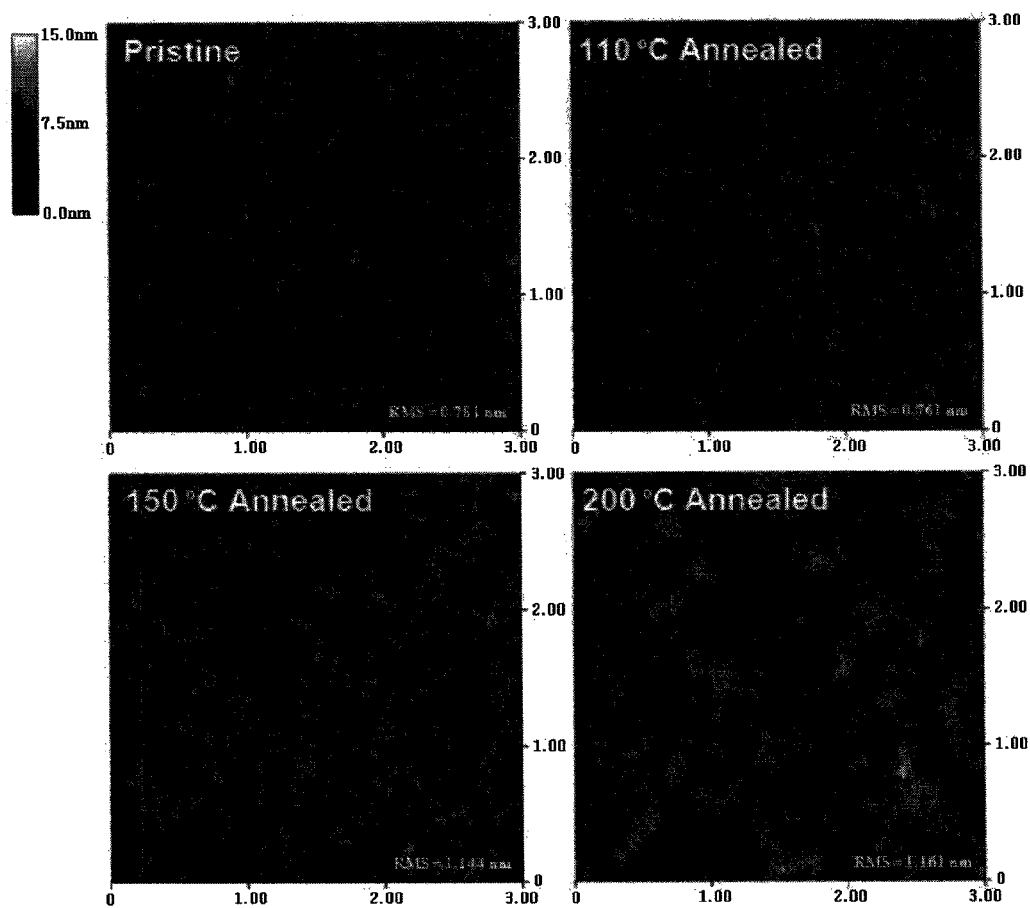
FIG. 10C shows AFM images (i.e. topology images) of a coating film including polymer (IV) prepared in Synthetic Example 4.

FIG. 10C shows AFM images (i.e. topology images) of a coating film including polymer (IV) prepared in Synthetic Example 4.

Referring to FIG. 10C, no crystals were observed when the coating film was not subjected to the heat treatment (pristine). However, the changes in morphology of the coating film were observed when the coating film was heat-treated at 110° C. for 10 minutes and heat-treated at 150° C. for 10 minutes, and the crystals were observed when the coating film was heat-treated at 200° C. for 10 minutes.

PREPARATIVE EXAMPLES OF ORGANIC FIELD EFFECT TRANSISTOR

Preparative Example 1

Preparation of Organic Field Effect Transistor (1)

Figure 11:
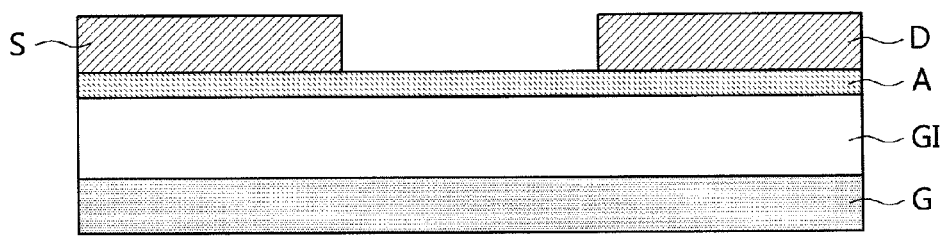
FIG. 11 is a cross-sectional view showing an organic field effect transistor prepared in Preparative Example 1.

An organic field effect transistor as shown in FIG. 11 was prepared. Particularly, a highly doped n-type silicon wafer was used as a substrate. The substrate may function as a gate electrode G. A silicon oxide film was thermally grown as a gate insulating film GI to a thickness of 300 nm on the gate electrode G.

Polymer (I) synthesized in Synthetic Example 1 was dissolved in a chrolobenzene solvent to prepare 0.5% by weight of a solution, and a 50 nm-thick organic semiconductor layer A was formed by spin-coating the gate insulating film GI with the solution. Then, the organic semiconductor layer A was heat-treated at 110° C. for 10 minutes.

30 nm-thick source and drain electrodes S and D were prepared by depositing Au on the organic semiconductor layer A.

Preparative Example 2

Preparation of Organic Field Effect Transistor (2)

Figure 12:
FIG. 12 is a cross-sectional view showing an organic field effect transistor prepared in Preparative Example 2.

An organic field effect transistor as shown in FIG. 12 was prepared. Particularly, a highly doped n-type silicon wafer was used as a substrate. The substrate may function as a gate electrode G. A silicon oxide film was thermally grown as a gate insulating film GI to a thickness of 300 nm on the gate electrode G.

Source and drain electrodes S and D were formed on the silicon oxide film using photolithography and wet etching. Particularly, photoresist patterns were formed, Ni and Au layers were sequentially formed on the photoresist patterns using thermal evaporation, and the photoresist patterns were then removed with a photoresist stripper. As a result, the Au/Ni electrodes were formed as the source and drain electrodes S and D on the silicon oxide film.

An organic semiconductor layer A was formed on the source and drain electrodes S and D and the gate insulating film GI exposed between the source and drain electrodes S and D. Particularly, polymer (I) synthesized in Synthetic Example 1 was dissolved in a chrolobenzene solvent to prepare 0.5% by weight of a solution, and a 50 nm-thick organic semiconductor layer A was formed by spin-coating the gate insulating film GI with the solution. Then, the organic semiconductor layer A was heat-treated at 110° C. for 10 minutes.

Preparative Example 3

Preparation of Organic Field Effect Transistor (3)

A similar organic field effect transistor to that shown in FIG. 3 was prepared.

A glass substrate was used as a substrate 10. Source and drain electrodes S and D were formed on the substrate 10 using photolithography and wet etching. Particularly, photoresist patterns were formed, Ni and Au layers were sequentially formed on the photoresist patterns using thermal evaporation, and the photoresist patterns were then removed with a photoresist stripper. As a result, the Au/Ni electrodes were formed as the source and drain electrodes S and D on the substrate 10.

An organic semiconductor layer A was formed on the source and drain electrodes S and D and the substrate 10 exposed between the source and drain electrodes S and D. Particularly, polymer (I) synthesized in Synthetic Example 1 was dissolved in a chrolobenzene solvent to prepare 0.5% by weight of a solution, and a 50 nm-thick organic semiconductor layer A was formed by spin-coating the source and drain electrodes S and D and the substrate 10 exposed between the source and drain electrodes S and D with the solution. Then, the organic semiconductor layer A was heat-treated at 110° C. for 10 minutes.

PMMA was spin-coated as the gate insulating film GI to a thickness of 500 nm on the organic semiconductor layer A. Then, an Al layer was deposited as the gate electrode G on the gate insulating film GI.

Preparative Example 4

Preparation of Organic Field Effect Transistor (4)

A similar organic field effect transistor to that shown in FIG. 3 was prepared.

A glass substrate was used as a substrate 10. Au was formed to a thickness of 20 to 30 nm on the substrate 10, and source and drain electrodes S and D were formed to have a channel length of 2 to 20 μm (particularly, 20 μm) and a channel width of 1 mm using photolithography.

Polymer (III) synthesized in Synthetic Example 3 was dissolved in a chrolobenzene solvent to prepare 10 mg/ml of a solution, and a 30 nm-thick organic semiconductor layer A was formed by spin-coating the source and drain electrodes S and D and the substrate 10 exposed between the source and drain electrodes S and D with the solution. Then, the organic semiconductor layer A was heat-treated at 200° C. for approximately 30 minutes.

PMMA having a molecular weight of 120 kDa was dissolved in n-butyl acetate to prepare 80 mg/ml of a solution, and the solution was spin-coated on the organic semiconductor layer A to a thickness of approximately 540 nm to form a gate insulating film GI. Then, an Al layer was deposited to a thickness of 40 nm on the gate insulating film GI to form a gate electrode G.

Preparative Example 5

Preparation of Organic Field Effect Transistor (5)

An organic field effect transistor was prepared in the same manner as described in Preparative Example 4, except that polymer (IV) synthesized in Synthetic Example 4 was used to form an organic semiconductor layer A.

Preparative Example 6

Preparation of Organic Field Effect Transistor (6)

A similar organic field effect transistor to that shown in FIG. 3 was prepared. In this case, a glass substrate (namely, a borosilicate substrate) whose surface was made flat and smooth was used as a substrate 10. A 3 nm-thick Ni film and a 12 nm-thick Au film were sequentially formed on the substrate 10, and source and drain electrodes S and D were formed to have a channel length of 2 to 20 μm and a channel width of 1 mm. Then, the substrate having the source and drain electrodes S and D formed thereon was immersed for approximately 10 minutes in a solution in which perfluorinated alkanethiols (PFDT) and 2-propanol were mixed in a ratio of 1:100 to form a self-assembled monolayer on the source and drain electrodes S and D.

Polymer (V) synthesized in Synthetic Example 5 was dissolved in a chrolobenzene solvent to prepare 10 mg/ml of a solution, and a 50 nm-thick organic semiconductor layer A was formed by spin-coating the source and drain electrodes S and D and the substrate 10 exposed between the source and drain electrodes S and D with the solution. Then, the organic semiconductor layer A was heat-treated at 130° C. for approximately 10 minutes.

A fluorinated high-molecular insulator, CYTOP (Asahi Glass Co. Ltd.), was spin-coated to a thickness of approximately 650 nm on the organic semiconductor layer A to form a gate insulating film GI. Then, an Al layer was vacuum-deposited to a thickness of approximately 50 nm on the gate insulating film GI to form a gate electrode G.

Analysis Example 6

Electrical Properties of Organic Field Effect Transistors

Figure 13A:
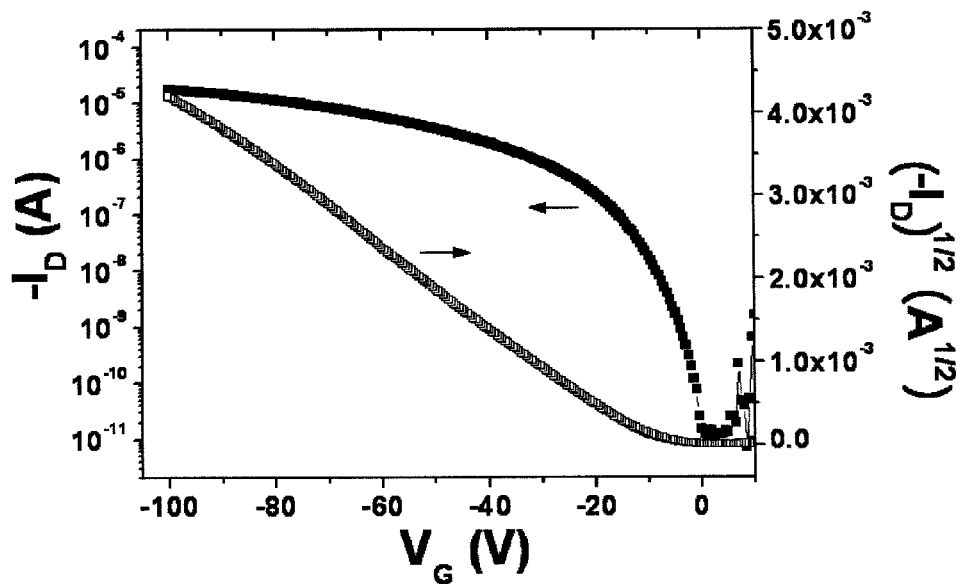
FIG. 13A is a graph showing a $V_G$-$I_D$ curve ($V_D$=-60 V) of an organic field effect transistor (1) prepared in Preparative Example 1.
Figure 13B:
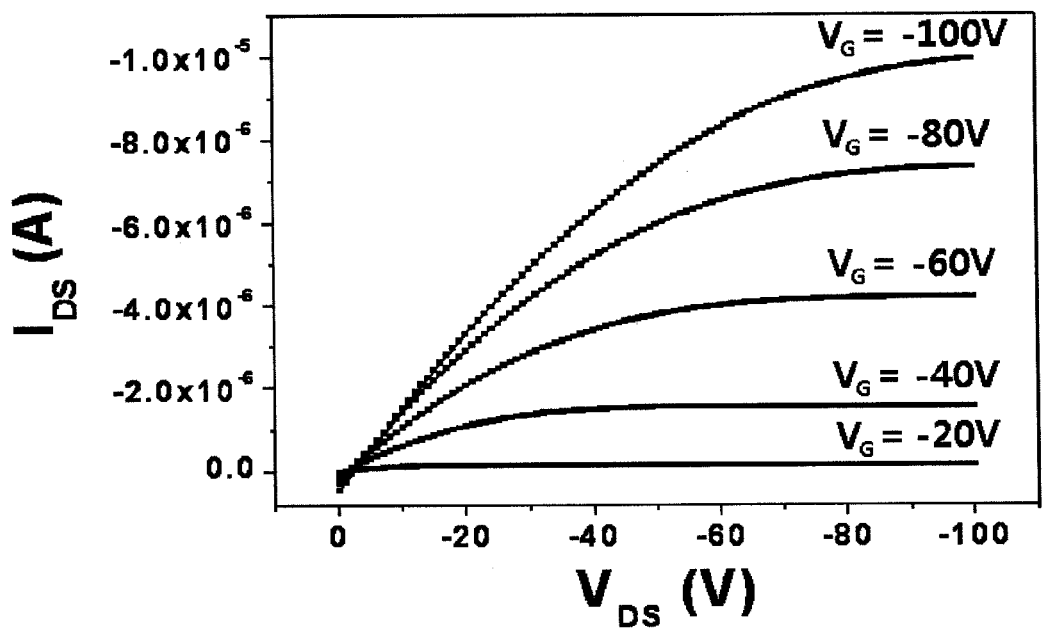
FIG. 13B is a graph showing a $V_D$-$I_D$ curve of the organic field effect transistor (1) prepared in Preparative to Example 1.

FIG. 13A is a graph showing a $V_G$-$I_D$ curve ($V_D$=−60V) of an organic field effect transistor (1) prepared in Preparative Example 1, and FIG. 13B is a graph showing a $V_D$-$I_D$ curve of an organic field effect transistor (1) prepared in Preparative Example 1.

Referring to FIGS. 13A and 13B, the field effect charge mobility, that is, the hole mobility, in the organic semiconductor layer may be calculated to be approximately 0.04 cm$^2$/Vs, and an on/off ratio was calculated to be approximately 10$^6$.

Figure 14:
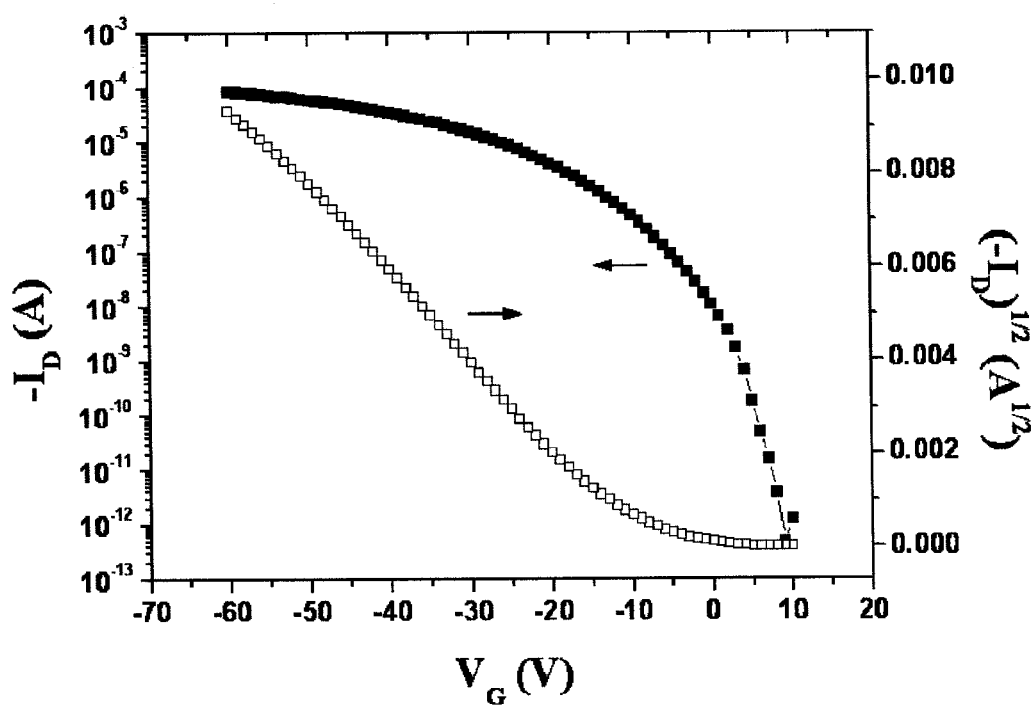
FIG. 14 is a graph showing a $V_G$-$I_D$ curve ($V_D$=-60 V) of an organic field effect transistor (2) prepared in Preparative Example 2.

FIG. 14 is a graph showing a $V_G$-$I_D$ curve ($V_D$=−60V) of an organic field effect transistor (2) prepared in Preparative Example 2.

Referring to FIG. 14, the field effect charge mobility, that is, the hole mobility, in the organic semiconductor layer may be calculated to be approximately 0.03 cm$^2$/Vs, and an on/off ratio was calculated to be approximately 10$^8$.

Figure 15A:
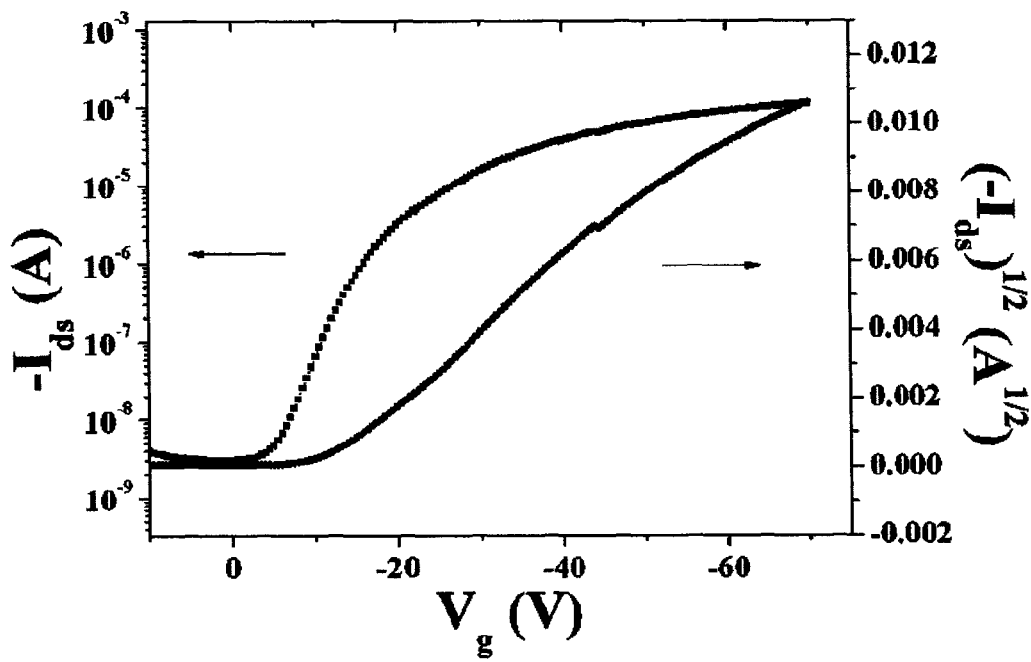
FIG. 15A is a graph showing a $V_G$-$I_D$ curve ($V_D$=-60 V) of an organic field effect transistor (3) prepared in Preparative Example 3.
Figure 15B:
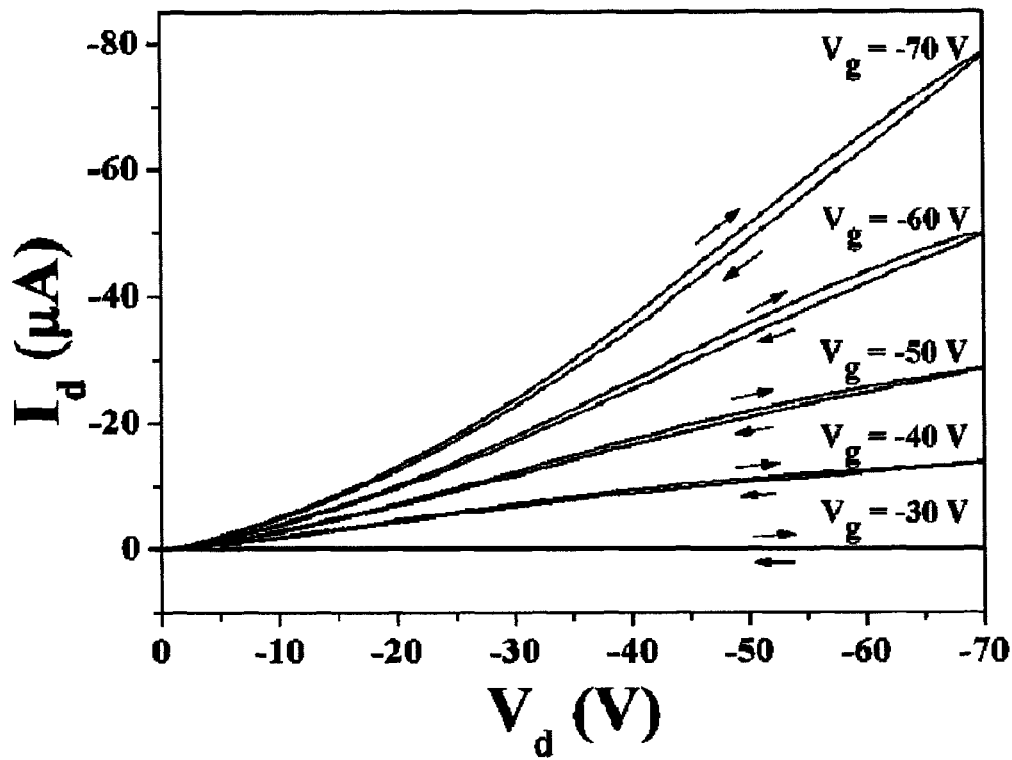
FIG. 15B is a graph showing a $V_D$-$I_D$ curve of the organic field effect transistor (3) prepared in Preparative Example 3.

FIG. 15A is a graph showing a $V_G$-$I_D$ curve ($V_D$=−60V) of an organic field effect transistor (3) prepared in Preparative Example 3, and FIG. 15B is a graph showing a $V_D$-$I_D$ curve of an organic field effect transistor (3) prepared in Preparative Example 3.

Referring to FIGS. 15A and 15B, the field effect charge mobility, that is, the hole mobility, in the organic semiconductor layer may be calculated to be approximately 0.15 cm$^2$/Vs, and an on/off ratio was calculated to be approximately 10$^5$.

Figure 16A:
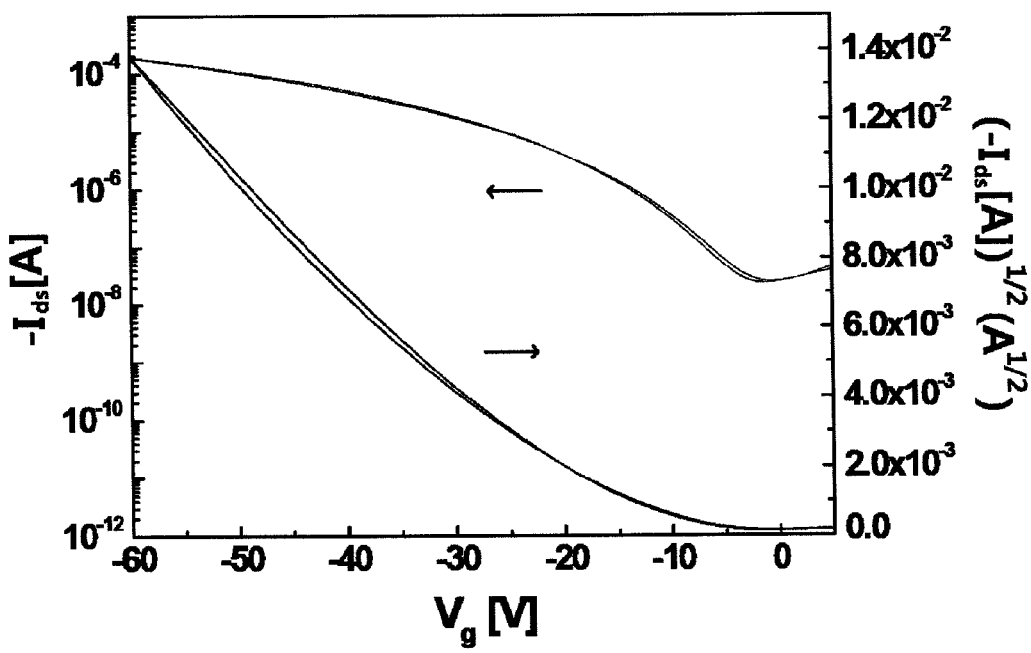
FIG. 16A is a graph showing a $V_G$-$I_D$ curve ($V_D$=-60 V) of an organic field effect transistor (4) prepared in Preparative Example 4.
Figure 16B:
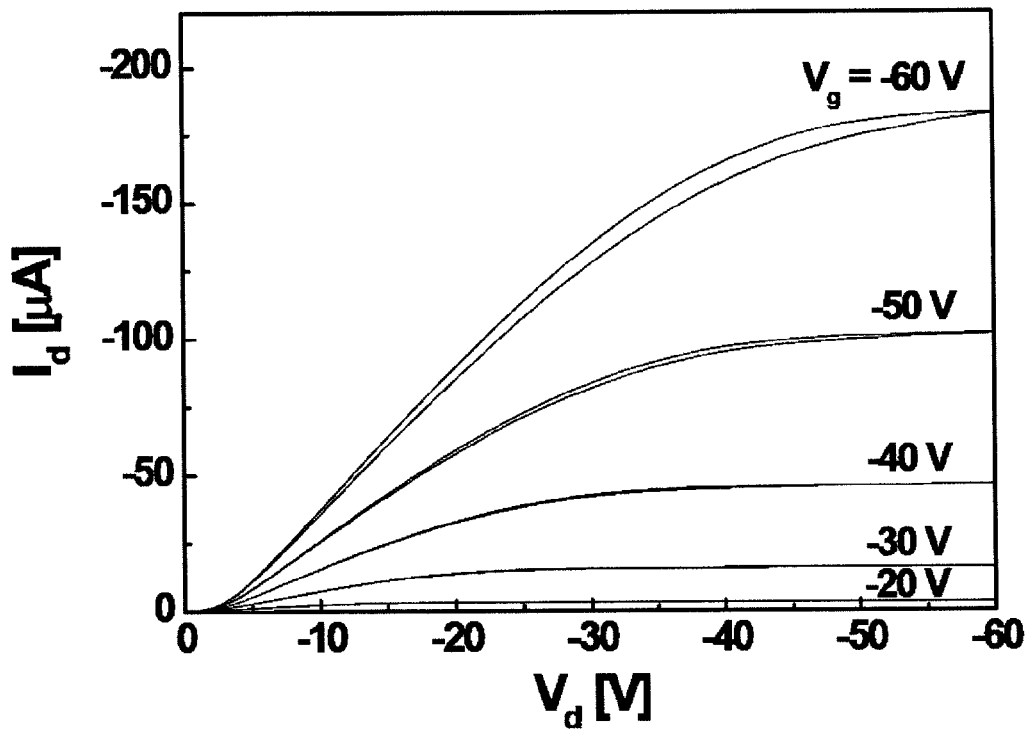
FIG. 16B is a graph showing a $V_D$-$I_D$ curve of the organic field effect transistor (4) prepared in Preparative Example 4.
Figure 17:
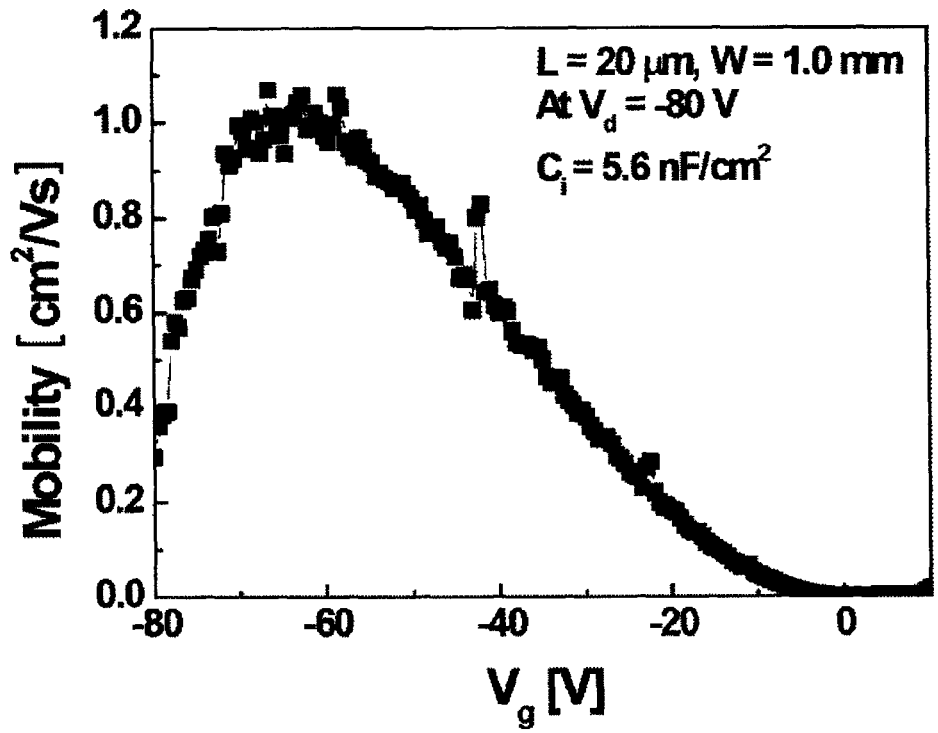
FIG. 17 is a graph showing the charge mobility ($V_D$=-80 V) of the organic field effect transistor (4) prepared in Preparative Example 4, depending on the change in $V_G$.

FIG. 16A is a graph showing a $V_G$-$I_D$ curve ($V_D$=−60V) of an organic field effect transistor (4) prepared in Preparative Example 4, and FIG. 16B is a graph showing a $V_D$-$I_D$ curve of an organic field effect transistor (4) prepared in Preparative Example 4. FIG. 17 is a graph showing the charge mobility ($V_D$=−80V) of an organic field effect transistor (4) prepared in Preparative Example 4, depending on the change in $V_G$.

Referring to FIGS. 16A and 16B, the field effect charge mobility, that is, the hole mobility, in the organic semiconductor layer may be calculated to be approximately 0.83 cm$^2$/Vs, and an on/off ratio was calculated to be approximately 10$^4$.

Referring to FIG. 17, when $V_D$ was −80 V, the field effect charge mobility, that is, the hole mobility, in the organic semiconductor layer was increased up to 1.05 cm$^2$/Vs, which indicates that the electrical properties are highly improved.

Figure 18A:
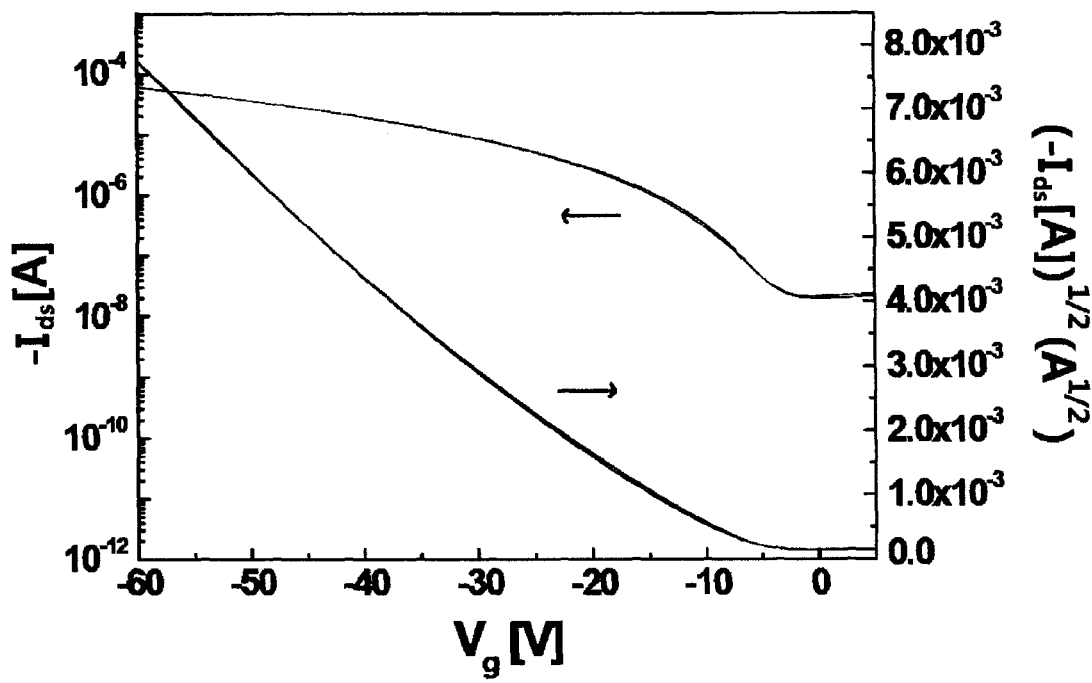
FIG. 18A is a graph showing a $V_G$-$I_D$ curve ($V_D$=-60 V) of an organic field effect transistor (5) prepared in Preparative Example 5.
Figure 18B:
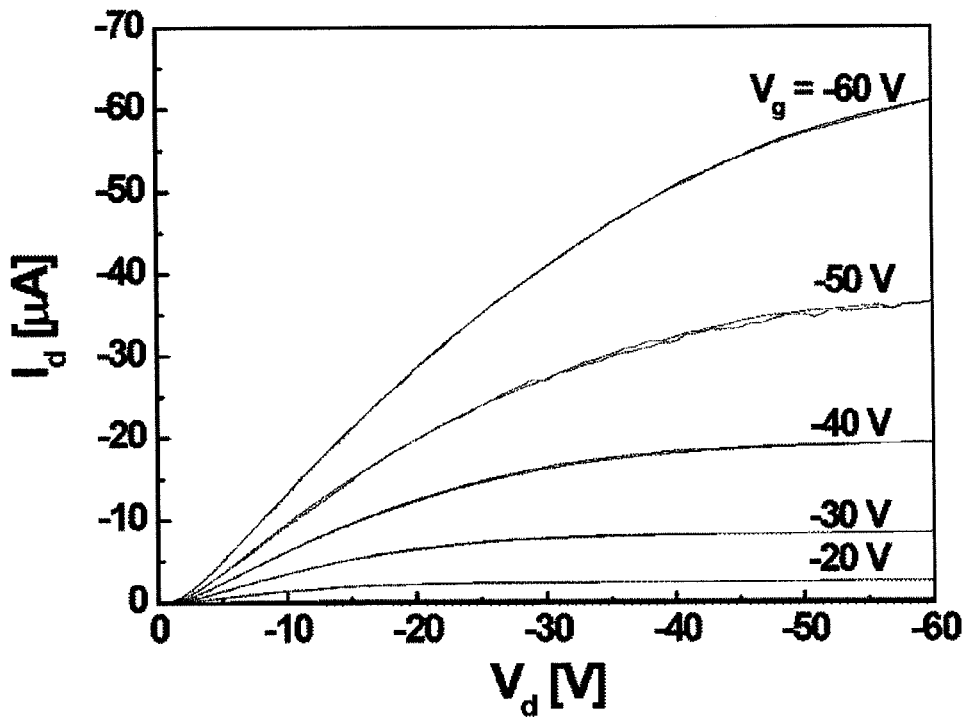
FIG. 18B is a graph showing a $V_D$-$I_D$ curve of the organic field effect transistor (5) prepared in Preparative Example 5.

FIG. 18A is a graph showing a $V_G$–$I_D$ curve ($V_D$=−60 V) of an organic field effect transistor (5) prepared in Preparative Example 5, and FIG. 18B is a graph showing a $V_D$–$I_D$ curve of an organic field effect transistor (5) prepared in Preparative Example 5.

Referring to FIGS. 18A and 18B, the field effect charge mobility, that is, the hole mobility, in the organic semiconductor layer may be calculated to be approximately 0.23 cm$^2$/Vs, and an on/off ratio was calculated to be approximately 10$^5$.

Figure 19A:
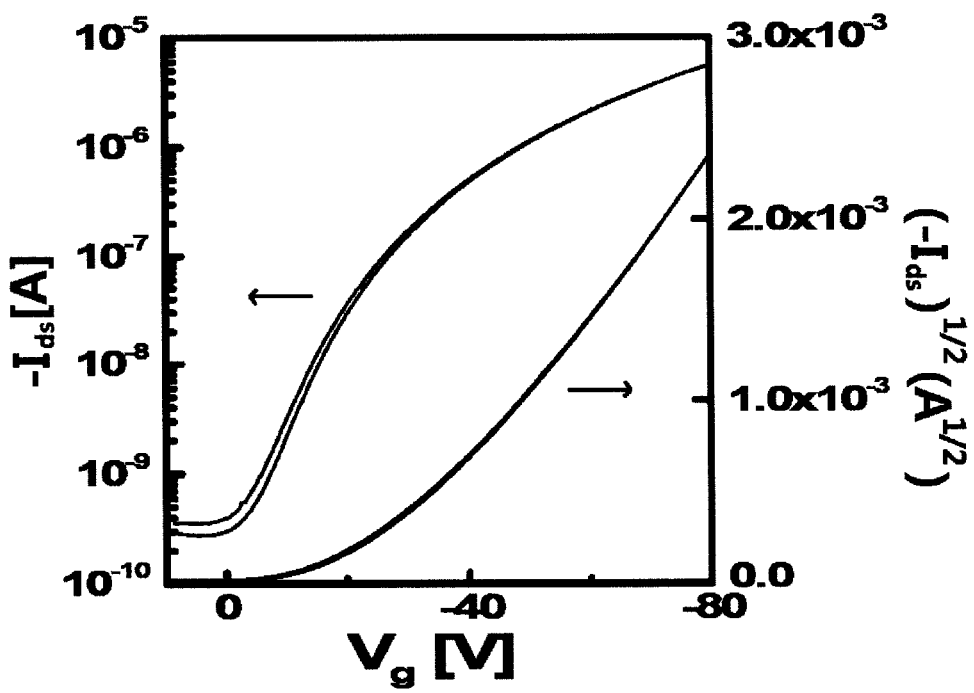
FIG. 19A is a graph showing a $V_G$-$I_D$ curve ($V_D$=-60 V) of an organic field effect transistor (6) prepared in Preparative Example 6.
Figure 19B:
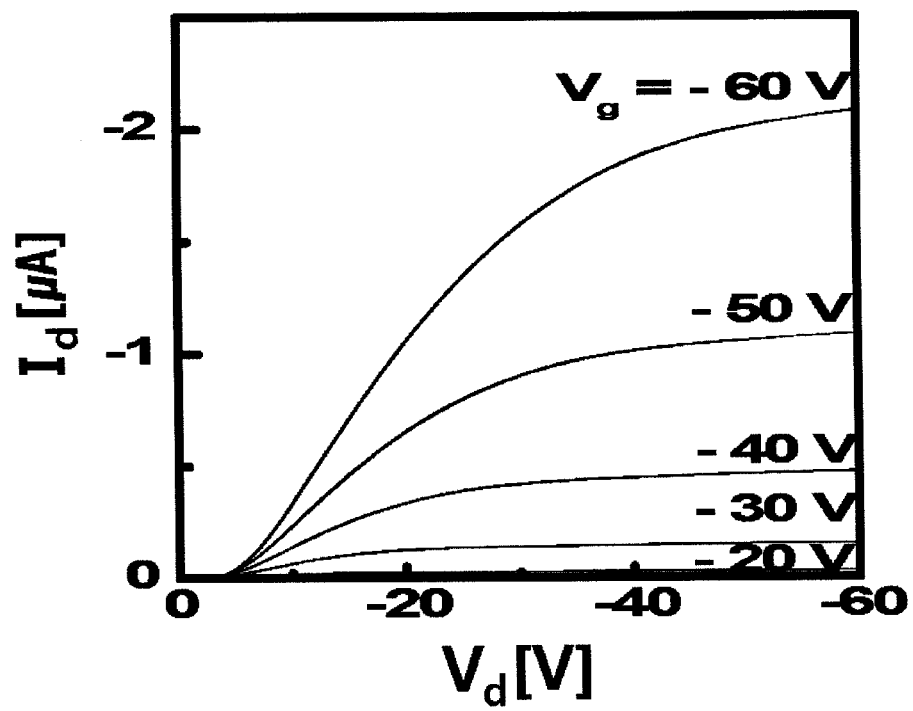
FIG. 19B is a graph showing a $V_D$-$I_D$ curve of the organic field effect transistor (6) prepared in Preparative Example 6.

FIG. 19A is a graph showing a $V_G$–$I_D$ curve ($V_D$=−60 V) of an organic field effect transistor (6) prepared in Preparative Example 6, and FIG. 19B is a graph showing a $V_D$–$I_D$ curve of an organic field effect transistor (6) prepared in Preparative Example 6.

Referring to FIGS. 19A and 19B, the field effect charge mobility, that is, the hole mobility, in the organic semiconductor layer may be calculated to be approximately 0.028 cm$^2$/Vs, and an on/off ratio was calculated to be approximately 5×10$^4$.

Comparison of Electrical Properties of Organic Field Effect Transistors

The charge mobilities of the organic field effect transistors (1, 2, 3, 4, 5 and 6) prepared in Preparative Examples 1 to 6 are listed in the following Table 2.

TABLE 2

| Preparative Examples (OTFT) | Organic Semiconductor | Charge Mobility (cm$^2$/Vs, @ $V_D$ = −60 V) | Charge Mobility (cm$^2$/Vs, @ $V_D$ = −80 V) |
| --- | --- | --- | --- |
| Preparative Example 1 | Synthetic Example 1 | 0.04 | — |
| Preparative Example 2 | Synthetic Example 1 | 0.03 | — |
| Preparative Example 3 | Synthetic Example 1 | 0.15 | — |
| Preparative Example 4 | Synthetic Example 3 | 0.83 | 1.05 |
| Preparative Example 5 | Synthetic Example 4 | 0.23 | — |
| Preparative Example 6 | Synthetic Example 5 | 0.028 | — |

As listed in Table 2, it was revealed that the organic field effect transistors (4 and 5), in which polymers (III and IV) prepared in Synthetic Examples 3 and 4 were used as the organic semiconductor layer, have improved charge mobility compared to those of the organic field effect transistors (1, 2, 3) in which polymer (I) prepared in Synthetic Example 1 was used as the organic semiconductor layer. In particular, it was seen that the organic field effect transistor (4), in which polymer (III) prepared in Synthetic Example 3 was used as the organic semiconductor layer, has highly improved charge mobility compared to those of the other organic field effect transistors.

Analysis Example 7

Stability of Organic Field Effect Transistor in the Air

The properties of the organic field effect transistor (1) prepared in Preparative Example 1 was measured with time while being stored in the air.

Figure 20:
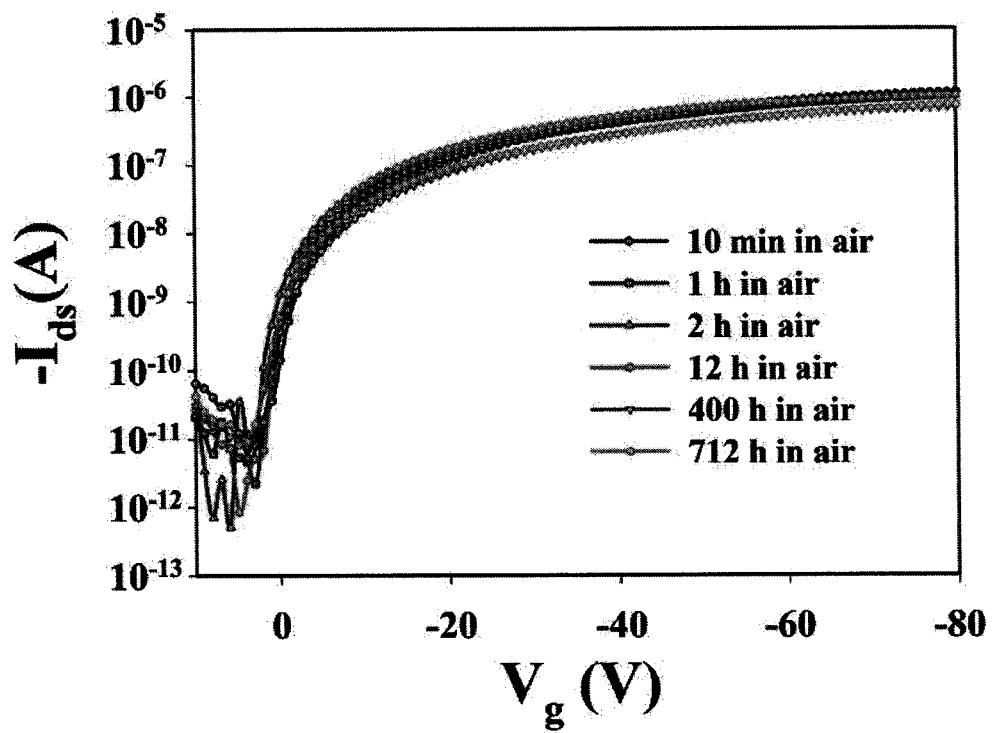
FIG. 20 is a graph showing a $V_G$-$I_D$ curve of an organic field effect transistor depending on the passage of time which is stored in the air.

FIG. 20 is a graph showing a $V_G$–$I_D$ curve of an organic field effect transistor depending on the passage of time which is stored in the air.

Referring to FIG. 20, although the organic field effect transistor was stored in the air for 712 hours, the $V_G$–$I_D$ curve properties were not changed. From this fact, it was seen that the organic field effect transistor (for example, an organic semiconductor layer) according to one embodiment of the present invention has excellent oxidative stability.

PREPARATIVE EXAMPLES OF ORGANIC SOLAR CELLS

Preparative Example 7

Preparation of Organic Solar Cell (1)

A substrate in which an ITO layer was coated as a first electrode on a glass substrate was provided. A hole transport layer, PEDOT-PSS (AI 4083), was coated on the ITO layer to a thickness of 20 nm. Then, 10 mg of polymer (I) synthesized in Preparative Example 1 was dissolved as a donor material in 500 ml of a to chrolobenzene solvent, and 40 mg of PCBM (C$_{70}$) was dissolved as an acceptor material in 500 ml of a chrolobenzene solvent. The two solutions were mixed, and spin-coated on the hole transport layer to form a 40 nm-thick organic active layer. Then, a Ca layer and an Al layer were vacuum-deposited to thicknesses of 25 nm and 100 nm on the organic active layer to form a second electrode, followed by forming an organic solar cell.

Preparative Example 8

Preparation of Organic Solar Cell (2)

An organic solar cell was prepared in the same manner as described in Preparative Example 7, except that the organic active layer was heat-treated at 110° C. for 15 minutes before the formation of the second electrode.

Preparative Example 9

Preparation of Organic Solar Cell (3)

An organic solar cell was prepared in the same manner as described in Preparative Example 7, except that PCBM (C$_{60}$) was used as the electron acceptor material to form an organic active layer.

Preparative Example 10

Preparation of Organic Solar Cell (4)

An organic solar cell was prepared in the same manner as described in Preparative Example 7, except that PCBM (C$_{60}$) was used as the electron acceptor material to form an organic active layer and the organic active layer was heat-treated at 110° C. for 15 minutes before the formation of the second electrode.

Preparative Example 11

Preparation of Organic Solar Cell (5)

A substrate in which an ITO layer was coated as a first electrode on a glass substrate was provided. The ITO layer was sequentially washed with acetone, distilled (DI) water and IPA through sonication for 10 minutes. The layer was dried for 30 minutes in a dry oven, and treated with UV/ozone for 10 minutes. Then, PEDOT:PSS (AI 4083) was spin-coated to a thickness of approximately 20 nm on the is ITO layer. The spin-coated ITO layer was heat-treated at 150° C. for 10 minutes, and spin-coated with 36 mg/ml of a solution, in which polymer (V) synthesized in Preparative Example 5 and PCBM ($C_{70}$) were dissolved in a weight ratio of 1:2 in DCB, to form an 80 nm-thick organic active layer. Then, a Ca layer and an Al layer were vacuum-deposited to thicknesses of 20 nm and 100 nm on the organic active layer to form a second electrode, followed by forming an organic solar cell.

Preparative Example 12

Preparation of Organic Solar Cell (6)

An organic solar cell was prepared in the same manner as described in Preparative Example 11, except that the organic active layer was heat-treated at 80° C. for 10 minutes before the formation of the second electrode.

Preparative Example 13

Preparation of Organic Solar Cell (7)

An organic solar cell was prepared in the same manner as described in Preparative Example 11, except that the organic active layer was subjected to solvent annealing, that is, put into a sample box filled with a solvent (DCB) and stored at room temperature for 2 hours before the formation of the second electrode.

Preparative Example 14

Preparation of Organic Solar Cell (8)

An organic solar cell was prepared in the same manner as described in Preparative Example 11, except that the organic active layer was subjected to solvent annealing, that is, put into a sample box filled with a solvent (DCB) and stored at a room temperature for 2 hours, and then heat-treated at 80° C. for 10 minutes before the formation of the second electrode.

Analysis Example 8

Properties of Organic Solar Cells

Figure 21:
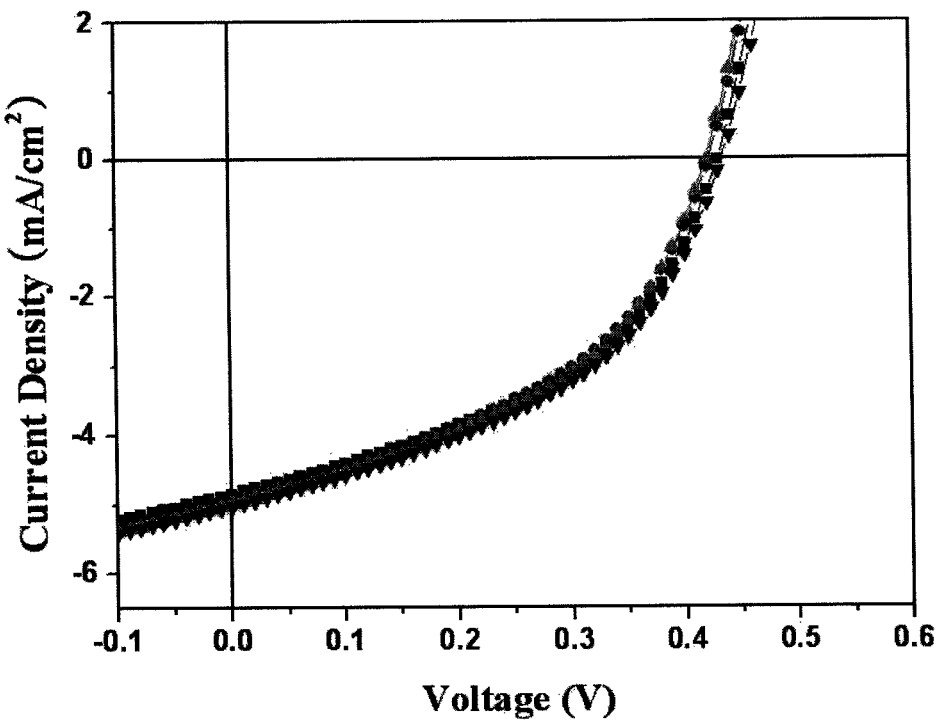
FIG. 21 is a graph showing the current densities of 4 organic solar cells (1) prepared in Preparative Example 7, depending on the change in voltage.

FIG. 21 is a graph showing the current densities of 4 organic solar cells (1) prepared in Preparative Example 7, depending on the change in voltage.

Referring to FIG. 21, when an open circuit voltage (Voc), a short circuit current density (Jsc) and a fill factor (FF) of each of the organic solar cells prepared in Preparative Example 7 were extracted, and an input power density (Ps) was set to 100 mW/cm$^2$ to calculate power conversion efficiency (PCE), the PCE was calculated to be at least 1%.

Figure 22:
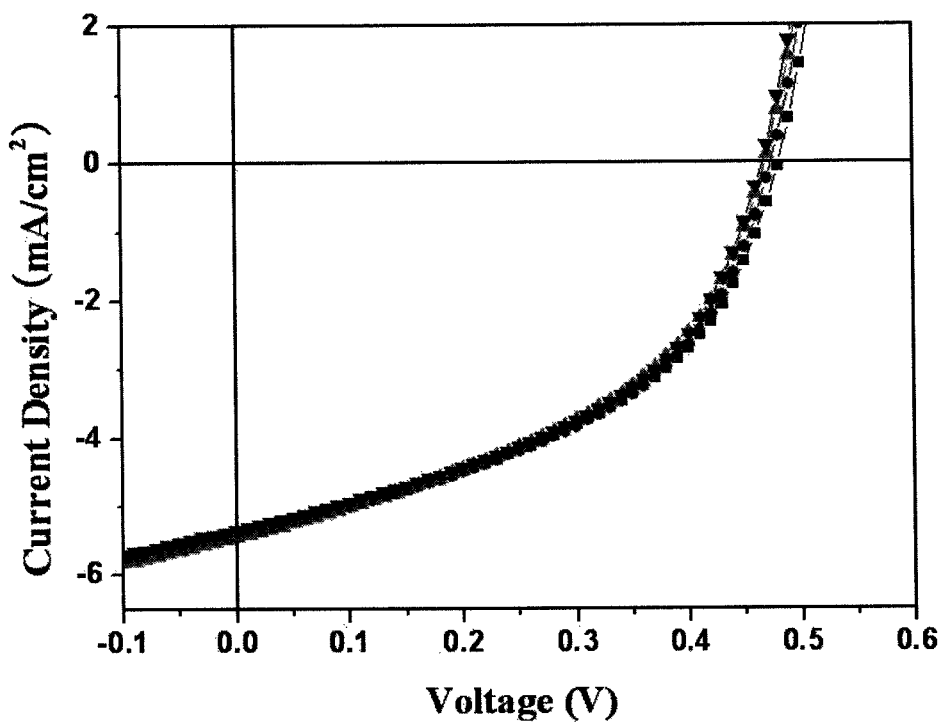
FIG. 22 is a graph showing the current densities of 4 organic solar cells prepared in Preparative Example 8, depending on the change in voltage.

FIG. 22 is a graph showing the current densities of 4 organic solar cells prepared in Preparative Example 8, depending on the change in voltage.

Referring to FIG. 22, when an open circuit voltage (Voc), a short circuit current density (Jsc) and an FF of each of the organic solar cells prepared in Preparative Example 8 were extracted, and an input power density (Ps) was set to 100 mW/cm$^2$ to calculate PCE, the PCE was calculated to be at least 1.2%.

Figure 23:
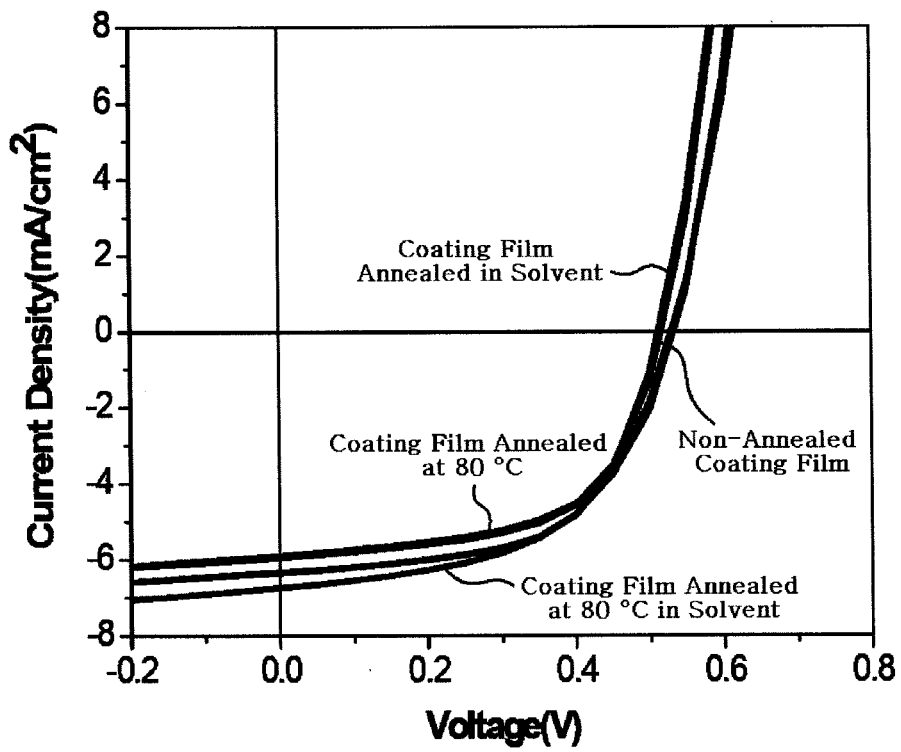
FIG. 23 is a graph showing the current densities of organic solar cells (5, 6, 7, 8) prepared in Preparative Examples 11 to 14, depending on the change in voltage.

FIG. 23 is a graph showing the current densities of organic solar cells (5, 6, 7 and 8) prepared in Preparative Examples 11 to 14, depending on the change in voltage.

Referring to FIG. 23, when an open circuit voltage (Voc), a short circuit current density (Jsc) and an FF of each of the organic solar cells were extracted, and an input power density (Ps) was set to 100 mW/cm$^2$ to calculate PCE, the PCE was calculated to be at least 1.82%.

Figure 24:
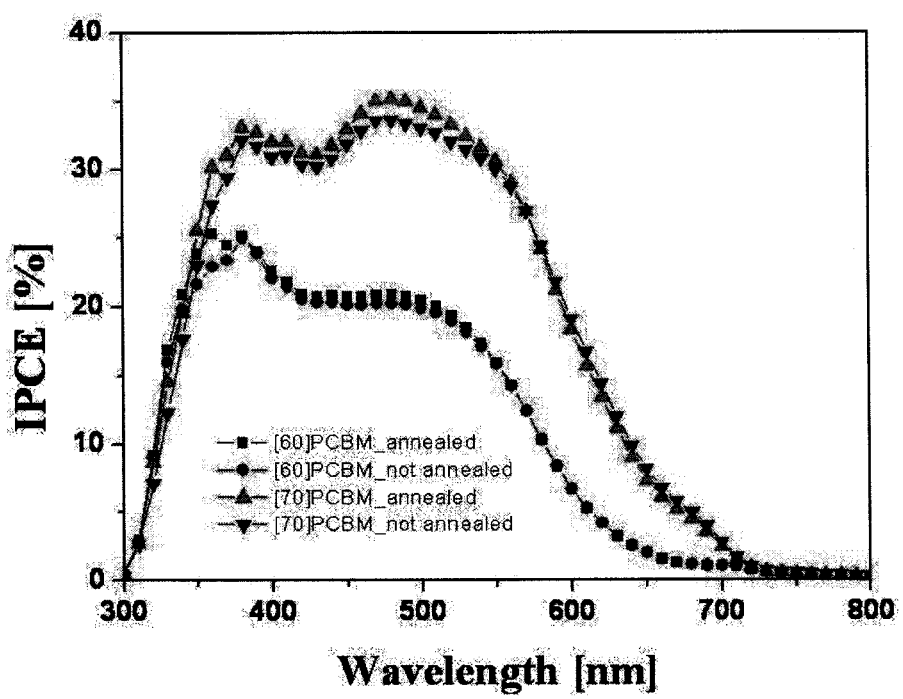
FIG. 24 is a graph showing the incident-photon-to-current conversion efficiencies (IPCEs) of organic solar cells prepared in Preparative Examples 7 to 10, depending on the change in wavelength.

FIG. 24 is a graph showing the incident-photon-to-current conversion efficiencies (IPCEs) of organic solar cells prepared in Preparative Examples 7 to 10, depending on the change in wavelength.

Referring to FIG. 24, it was revealed that the organic solar cell prepared in Preparative Example 7 ([70]PCBM_not annealed) or Preparative Example 8 ([70]PCBM_annealed) using PCBM ($C_{70}$) as the electron acceptor material has higher IPCE than the organic solar cell prepared in Preparative Example 9 ([60]PCBM_not annealed) or Preparative Example 10 ([60]PCBM_annealed) using PCBM ($C_{60}$) as the electron acceptor material. As a result, it was confirmed that the IPCE is more excellent when PCBM ($C_{70}$) was used as the electron acceptor material than when PCBM ($C_{60}$) was used as the electron acceptor material.

Meanwhile, it was revealed that the organic solar cell prepared in Preparative Example 8 ([70]PCBM_annealed) in which the organic active layer is heat-treated has somewhat higher IPCE than the organic solar cell prepared in Preparative Example 7 ([70]PCBM_not annealed) in which the organic active layer is not heat-treated. Also, it was revealed that the similar results are also obtained in Preparative Example 10 ([60]PCBM_annealed) and Preparative Example 9 ([60]PCBM_not annealed). From these results, it was confirmed that the IPCE is somewhat improved in the heat-treated organic active layer, compared to the non-heat treated organic active layer.

Comparison of Properties of Organic Solar Cell

The properties of the organic solar cells (1, 2, 5, 6, 7 and 8) prepared in Preparative Examples 7, 8 and 11 to 14 are listed in the following Table 3.

TABLE 3

|  | Donor (Acceptor = PCBM ($C_{70}$)) | Annealing | FF (%) | Jsc (mA/cm$^2$) | Voc (V) | PCE (%, @ Ps = 100 mW/cm$^2$) |
|---|---|---|---|---|---|---|
| Preparative Example 7 | Synthetic Example 1 | — | 0.35 | 5.29 | 0.54 | 1 |
| Preparative Example 8 | Synthetic Example 1 | @ 110° C., 15 min | 0.464 | 5.41 | 0.47 | 1.2 |
| Preparative Example 11 | Synthetic Example 5 | — | 0.596 | 5.929 | 0.515 | 1.820 |
| Preparative Example 12 | Synthetic Example 5 | @ 80° C., 10 min | 0.577 | 5.902 | 0.532 | 1.813 |
| Preparative Example 13 | Synthetic Example 5 | @ solvent annealing, 2 hrs | 0.595 | 6.334 | 0.512 | 1.930 |

TABLE 3-continued

| | Donor (Acceptor = PCBM ($C_{70}$)) | Annealing | FF (%) | Jsc (mA/cm$^2$) | Voc (V) | PCE (%, @ Ps = 100 mW/cm$^2$) |
|---|---|---|---|---|---|---|
| Preparative Example 14 | Synthetic Example 5 | @ solvent annealing, 2 hrs + @ 80° C., 10 min | 0.539 | 6.735 | 0.529 | 1.922 |

As listed in Table 3, it was revealed that the organic solar cells (5, 6, 7 and 8) in which polymer (V) prepared in Synthetic Example 5 was used as the electron donor material have highly improved PCEs, compared to the organic solar cells (1 and 2) in which polymer (I) prepared in Synthetic Example 1 was used as the electron donor material.

According to one embodiment of the present invention, a film may be formed by coating a substrate with a polymer containing a thiophene unit and a thienylenevinylene unit using a solution process. Therefore, the production cost may be reduced and a large-scale device may be suitably manufactured since there is no need for an expensive vacuum system to form films. Also, the polymer according to one embodiment of the present invention containing a thiophene unit and a thienylenevinylene unit has very excellent flatness since the thiophene unit is continuously coupled with a vinyl group having excellent flatness. Therefore, the polymer may be useful in further improving the charge mobility since it has high crystallinity caused by the improved ordering property between molecules. Such crystallinity may be further improved by the heat treatment. In addition, the organic compound according to one embodiment of the present invention containing a thienylenevinylene unit may have high oxidative stability because of its high ionization energy.

Furthermore, the organic compound according to one embodiment of the present invention containing a thienylenevinylene unit may be used as an organic layer of the organic electronic device, for example, a semiconductor layer of the organic field effect transistor or an active layer of the organic solar cell.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A polymer represented by the following Formula 4, which contains a thiophene unit and a thienylenevinylene unit:

[Formula 4]

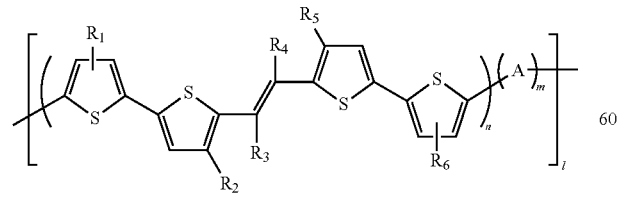

wherein, $R_1$, $R_3$, $R_4$ and $R_6$ are each independently hydrogen, an alkyl group having 1 to 25 carbon atoms, an alkoxy group having 1 to 25 carbon atoms, a haloalkyl group having 1 to 25 carbon atoms, or an aryl group having 6 to 30 carbon atoms, $R_2$ and $R_5$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms, A represents

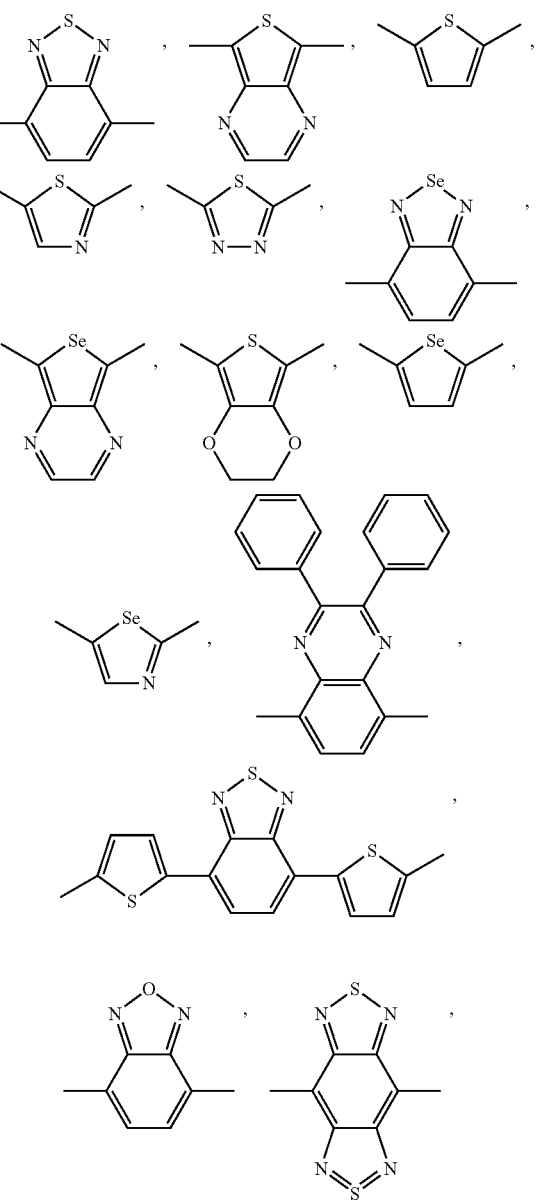

-continued

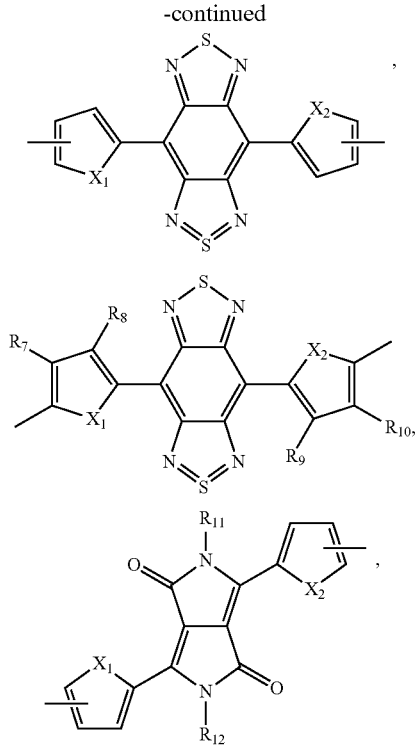

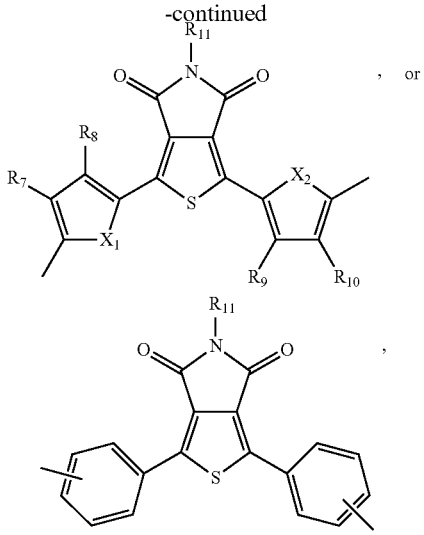

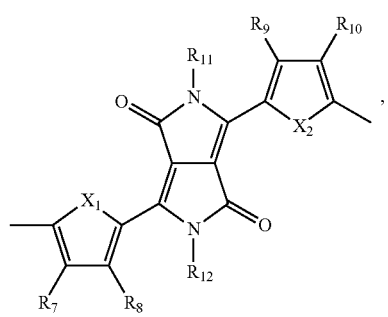

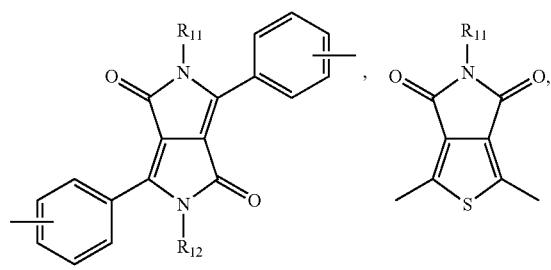

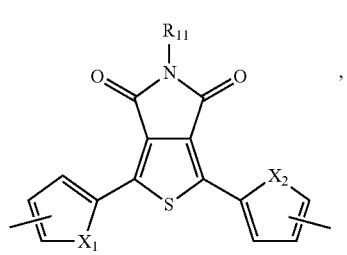

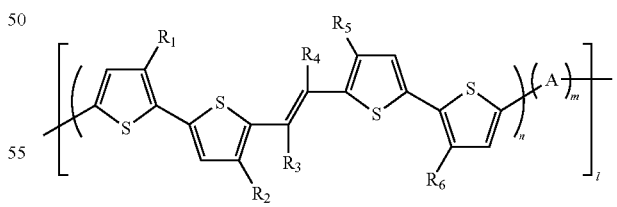

wherein $X_1$ and $X_2$ are each independently S, O, or Se, $R_7$, $R_8$, $R_9$ and $R_{10}$ are each independently an alkyl group having 1 to 30 carbon atoms, an alkoxy group having 1 to 30 carbon atoms, or a haloalkyl group having 1 to 30 carbon atoms, and $R_{11}$ and $R_{12}$ are each independently an alkyl group having 1 to 30 carbon atoms, and n is an integer ranging from 1 to 1000, m is an integer ranging from 0 to 1000, and l is an integer ranging from 1 to 1000.

2. The polymer according to claim 1, wherein $R_2$ and $R_5$ in Formula 4 are the same and represent a linear alkyl group having 4 to 14 carbon atoms.

3. The polymer according to claim 1, wherein $R_1$ and $R_6$ in Formula 4 are the same and represent a linear alkyl group having 4 to 14 carbon atoms.

4. The polymer according to claim 1, wherein $R_3$ and $R_4$ in Formula 4 are hydrogen.

5. The polymer according to claim 1, wherein m in Formula 4 is 0.

6. The polymer according to claim 1, wherein the polymer is represented by the following Formula 5:

[Formula 5]

wherein, $R_3$, $R_4$, A, n, m and l are identical to $R_3$, $R_4$, A, n, m and l in Formula 4, respectively, and $R_1$, $R_2$, $R_5$, and $R_6$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms.

7. The polymer according to claim 6, wherein the polymer is represented by the following Formula 6:

[Formula 6]

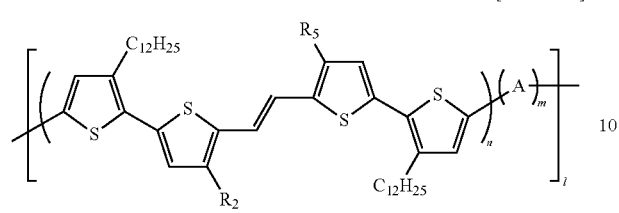

wherein,

A, n, m and l are identical to A, n, m and l in Formula 4, respectively, and $R_2$ and $R_5$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms.

8. An organic field effect transistor comprising:

an organic semiconductor layer arranged on a substrate and containing a polymer represented by the following Formula 4, the polymer containing a thiophene unit and a thienylenevinylene unit;

a gate electrode arranged above or below the organic semiconductor layer to overlap the organic semiconductor layer; and a source electrode and a drain electrode connected to both ends of the organic semiconductor layer, respectively:

[Formula 4]

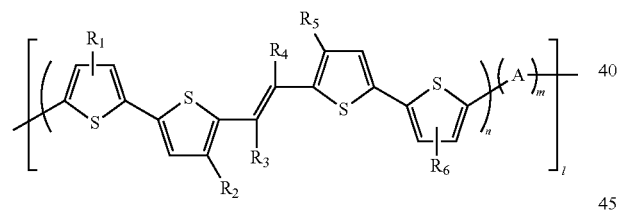

wherein, $R_1$, $R_3$, $R_4$, and $R_6$ are each independently hydrogen, an alkyl group having 1 to 25 carbon atoms, an alkoxy group having 1 to 25 carbon atoms, a haloalkyl group having 1 to 25 carbon atoms, or an aryl group having 6 to 30 carbon atoms, $R_2$ and $R_5$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms, A represents

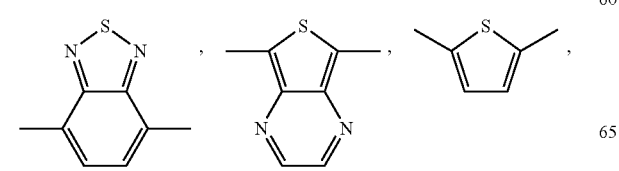

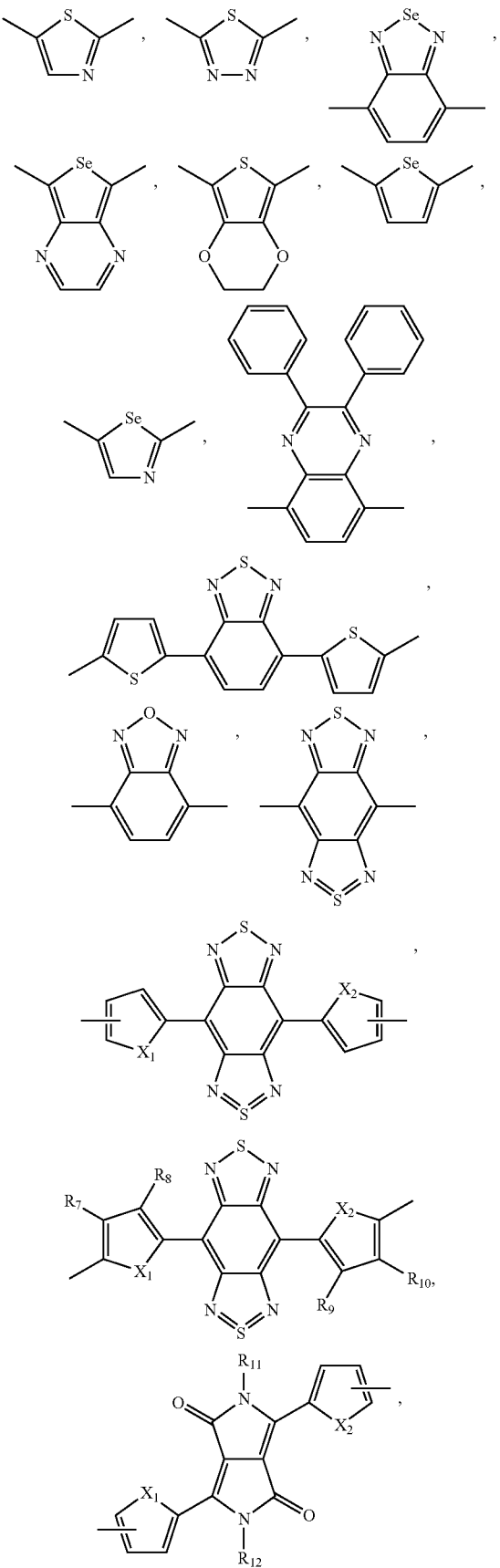

-continued

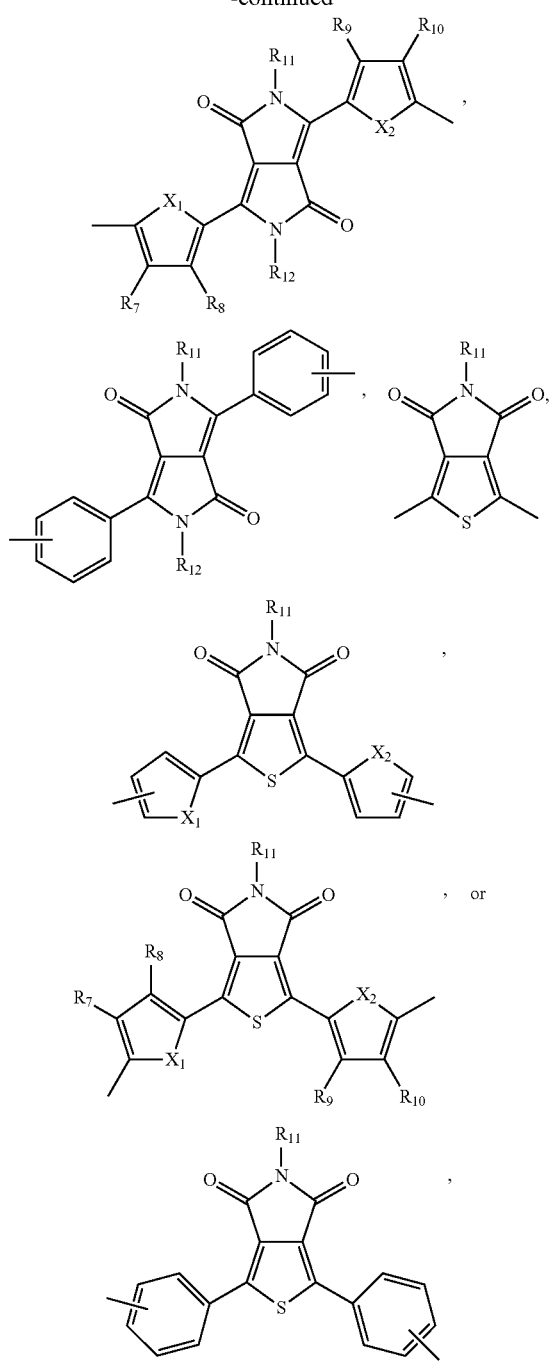

wherein $X_1$ and $X_2$ are each independently S, O, or Se, $R_7$, $R_8$, $R_9$ and $R_{10}$ are each independently an alkyl group having 1 to 30 carbon atoms, an alkoxy group having 1 to 30 carbon atoms, or a haloalkyl group having 1 to 30 carbon atoms, and $R_{11}$ and $R_{12}$ are each independently an alkyl group having 1 to 30 carbon atoms, and n is an integer ranging from 1 to 1000, m is an integer ranging from 0 to 1000, and l is an integer ranging from 1 to 1000.

9. The organic field effect transistor according to claim 8, wherein $R_2$ and $R_5$ in Formula 4 are the same and represent a linear alkyl group having 4 to 14 carbon atoms.

10. The organic field effect transistor according to claim 8, wherein $R_1$ and $R_6$ in Formula 4 are the same and represent a linear alkyl group having 4 to 14 carbon atoms.

11. The organic field effect transistor according to claim 8, wherein $R_3$ and $R_4$ in Formula 4 are hydrogen.

12. An organic solar cell comprising:

a first electrode arranged on a substrate;

an organic active layer arranged on the first electrode and containing a polymer represented by the following Formula 4, the polymer containing a thiophene unit and a thienylenevinylene unit; and a second electrode arranged on the organic active layer:

[Formula 4]

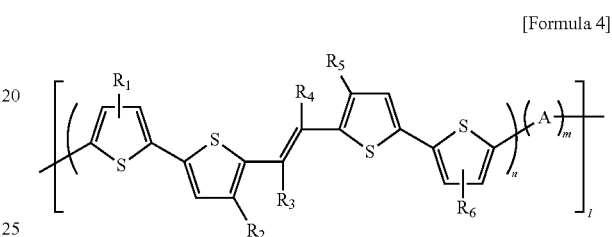

wherein, $R_1$, $R_3$, $R_4$, and $R_6$ are each independently hydrogen, an alkyl group having 1 to 25 carbon atoms, an alkoxy group having 1 to 25 carbon atoms, a haloalkyl group having 1 to 25 carbon atoms, or an aryl group having 6 to 30 carbon atoms, $R_2$ and $R_5$ are each independently an alkyl group having 1 to 25 carbon atoms, an alkoxy group having 1 to 25 carbon atoms, a haloalkyl group having 1 to 25 carbon atoms, or an aryl group having 6 to 30 carbon atoms, A represents

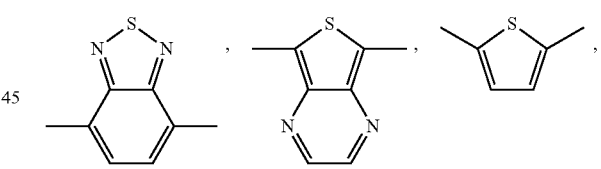

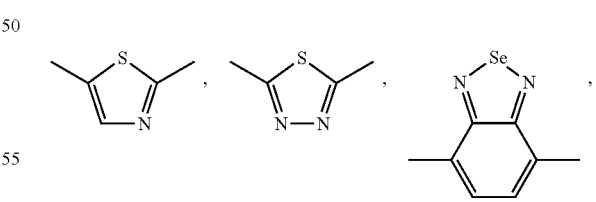

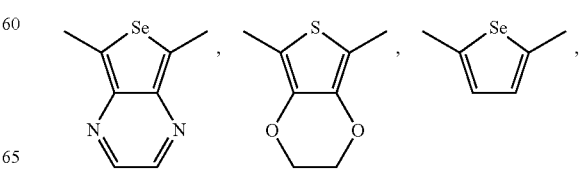

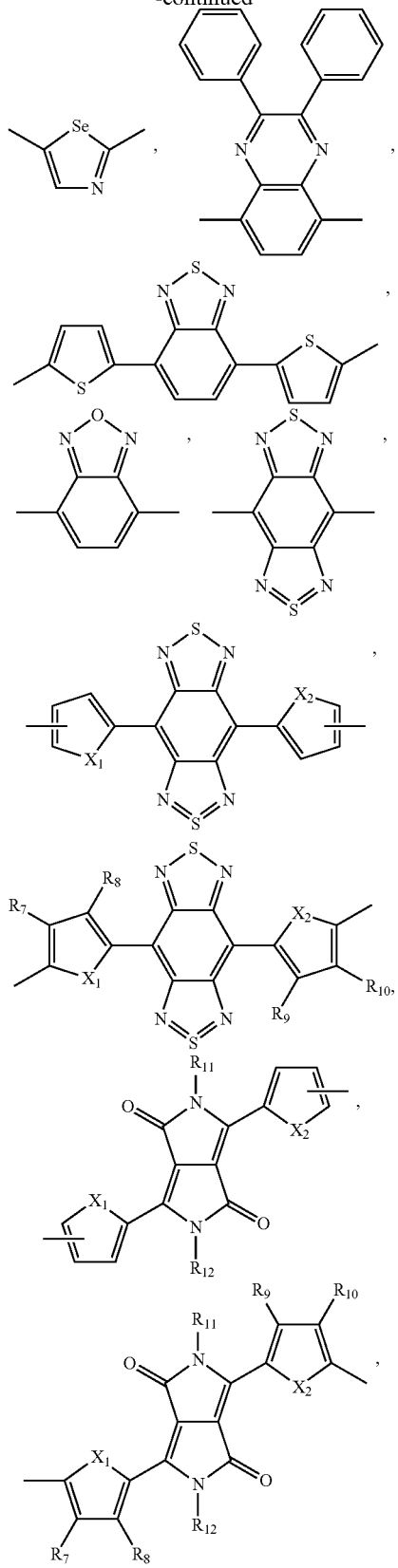

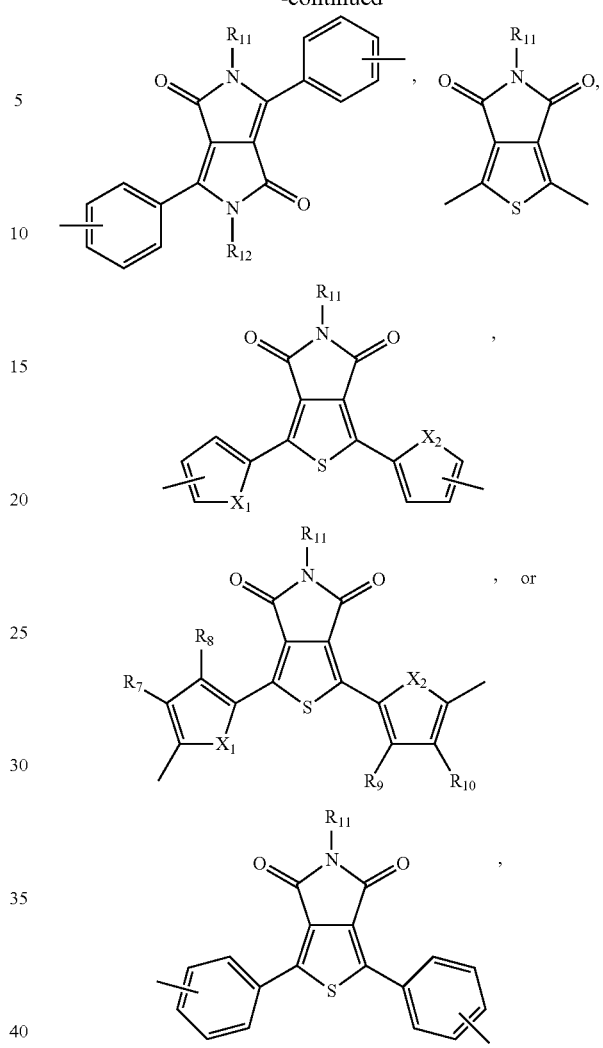

wherein $X_1$ and $X_2$ are each independently S, O, or Se, $R_7$, $R_8$, $R_9$ and $R_{10}$ are each independently an alkyl group having 1 to 30 carbon atoms, an alkoxy group having 1 to 30 carbon atoms, or a haloalkyl group having 1 to 30 carbon atoms, and $R_{11}$ and $R_{12}$ are each independently an alkyl group having 1 to 30 carbon atoms, and n is an integer ranging from 1 to 1000, m is an integer ranging from 0 to 1000, and l is an integer ranging from 1 to 1000.

13. The organic solar cell according to claim 12, wherein $R_2$ and $R_5$ in Formula 4 are the same and represent a linear alkyl group having 4 to 14 carbon atoms.

14. The organic solar cell according to claim 12, wherein $R_1$ and $R_6$ in Formula 4 are the same and represent a linear alkyl group having 4 to 14 carbon atoms.

15. The organic solar cell according to claim 12, wherein $R_3$ and $R_4$ in Formula 4 are hydrogen.

* * * * *